(12) United States Patent
Miyairi et al.

(10) Patent No.: US 9,947,794 B2
(45) Date of Patent: Apr. 17, 2018

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Hidekazu Miyairi, Kanagawa (JP); Kazuya Hanaoka, Kanagawa (JP); Suguru Hondo, Kanagawa (JP); Shunpei Yamazaki, Tokyo (JP)

(73) Assignee: Semiconductor Energy Laboratory Co., Ltd., Atsugi-shi, Kanagaw-ken (JP)

( * ) Notice: Subject to any disclaimer, the term of this patent is extended or adjusted under 35 U.S.C. 154(b) by 0 days.

(21) Appl. No.: 15/432,961

(22) Filed: Feb. 15, 2017

(65) Prior Publication Data

US 2017/0162687 A1    Jun. 8, 2017

Related U.S. Application Data

(62) Division of application No. 14/462,824, filed on Aug. 19, 2014, now Pat. No. 9,590,109.

(30) Foreign Application Priority Data

Aug. 30, 2013   (JP) .................................. 2013-180228

(51) Int. Cl.
*H01L 29/12*   (2006.01)
*H01L 29/78*   (2006.01)
(Continued)

(52) U.S. Cl.
CPC ............ *H01L 29/785* (2013.01); *H01L 29/24* (2013.01); *H01L 29/41791* (2013.01);
(Continued)

(58) Field of Classification Search
None
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Brain.R et al., "A 22nm High Performance Embedded DRAM SoC Technology Featuring Tri-gate Transistors and MIMCAP COB", 2013 Symposium on VLSI Technology : Digest of Technical Papers, Jun. 11, 2013, pp. T16-T17.

(Continued)

*Primary Examiner* — Shaun Campbell
(74) *Attorney, Agent, or Firm* — Fish & Richardson P.C.

(57) ABSTRACT

A semiconductor device that operates at high speed. A semiconductor device with favorable switching characteristics. A highly integrated semiconductor device. A miniaturized semiconductor device. The semiconductor device is formed by: fainting a semiconductor film including an opening, on an insulating surface; forming a conductive film over the semiconductor film and in the opening, and removing the conductive film over the semiconductor film to form a conductive pillar in the opening; forming an island-shaped mask over the conductive pillar and the semiconductor film; etching the conductive pillar and the semiconductor film using the mask to form a first electrode and a first semiconductor; forming a gate insulating film on a top surface and a side surface of the first semiconductor; and forming a gate electrode that is in contact with a top surface of the gate (Continued)

insulating film and faces the top surface and the side surface of the first semiconductor.

5 Claims, 38 Drawing Sheets

(51) Int. Cl.
    *H01L 29/66*       (2006.01)
    *H01L 29/24*       (2006.01)
    *H01L 29/417*     (2006.01)
    *H01L 29/786*     (2006.01)

(52) U.S. Cl.
    CPC .... *H01L 29/66969* (2013.01); *H01L 29/7854* (2013.01); *H01L 29/7869* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,468,901 B2 | 12/2008 | Kameshiro et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,763,981 B2 | 7/2010 | Yamazaki et al. |
| 8,089,117 B2 | 1/2012 | Shimizu |
| 8,164,152 B2 | 4/2012 | Lee et al. |
| 8,207,531 B2 | 6/2012 | Takahashi et al. |
| 8,373,237 B2 | 2/2013 | Park et al. |
| 8,754,409 B2 | 6/2014 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1* | 3/2006 | Hoffman ............. H01L 29/7869 257/72 |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1* | 8/2007 | Furuta ............... H01L 29/41733 257/347 |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1* | 10/2008 | Lee ................... H01L 21/02554 257/43 |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0206332 A1 | 8/2009 | Son et al. |
| 2009/0278122 A1 | 11/2009 | Hosono et al. |
| 2009/0280600 A1 | 11/2009 | Hosono et al. |
| 2010/0051935 A1 | 3/2010 | Lee et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0049509 A1 | 3/2011 | Takahashi et al. |
| 2011/0101351 A1 | 5/2011 | Yamazaki |
| 2011/0156117 A1 | 6/2011 | Yamazaki et al. |
| 2012/0205651 A1 | 8/2012 | Lee et al. |
| 2013/0161606 A1* | 6/2013 | Isobe ................... H01L 29/786 257/43 |
| 2014/0151691 A1 | 6/2014 | Matsubayashi et al. |
| 2014/0209896 A1 | 7/2014 | Yamazaki |
| 2014/0326992 A1 | 11/2014 | Hondo et al. |
| 2014/0332800 A1 | 11/2014 | Hanaoka |
| 2015/0028330 A1 | 1/2015 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |

(56) References Cited

FOREIGN PATENT DOCUMENTS

| | | |
|---|---|---|
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-171702 A | 9/2011 |
| WO | WO-2004/114391 | 12/2004 |

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on electron Devices, Jul. 1, 1995, vol. 42, No. 7, pp. 1240-1246.

Cho.D et al., "21.2:AL and SN-Doped Zinc Indium Oxide Thin Film Transistors for Amoled Back-Plane", SID Digest '09 : SID International Symposium Digest of Technical Papers, May 31, 2009, pp. 280-283.

Clark.S et al., "First Principles Methods Using Caster", Zeitschrift fur Kristallographie, 2005, vol. 220, pp. 567-570.

Coates.D et al., "Optical Studies of the Amorphous Liquid-Cholesteric Liquid Crystal Transition; The "Blue Phase "", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZNO Thin-Film Transistors Produced At Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest Of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", Sid Digest '07 : SID International Symposium Digest of Technical Papers, 2007, vol. 33, pp. 1330-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, Vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165262-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers May 20, 2008, vol. 39, No. 1, pp. 1-4.

Jin.D et al., "65.2:Distinguished Paper:World-Largest (6.5") Flexible Full Color Top Emission AMOLED Display on Plastic Film And Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 As A Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214TH ECS Meeting, 2008, No. 2317, ECS.

Kimizuka.N. et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu, or Zn]at Temperatures Over 1000°C", Journal Of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGaZ04—ZnO System", Journal Of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13TH International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

(56) References Cited

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size Amoled Displays", IDW '08 : Proceedings of the 6th International Display Workshops, Dec. 3, 2008, pp. 581-584.

Nakamura.M, "Synthesis of Homologous Compound with New Long-Period Structure", Nirim Newsletter, Mar. 1, 1995, vol. 150, pp. 1-4.

Nakamura.M et al., "The phase relations in the $In_2O_3$—$Ga_2ZnO_4$—$ZnO$ system at 1350° C", Journal of Solid State Chemistry, Aug. 1, 1991, vol. 93, No. 2, pp. 298-315.

Nomura.K et al., "Amorphous Oxide Semiconductors for High-Performance Flexible Thin-Film Transistors", JPN. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, Vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)m$ (m<4):a Zn4s conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest —09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure To Water", Appl. Phys. Lett. (Applied Physics Letters), 2008, Vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '03 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT", SID Digest '08 : SID International Symposium Digest of Technical Papers, May 20, 2008, Vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

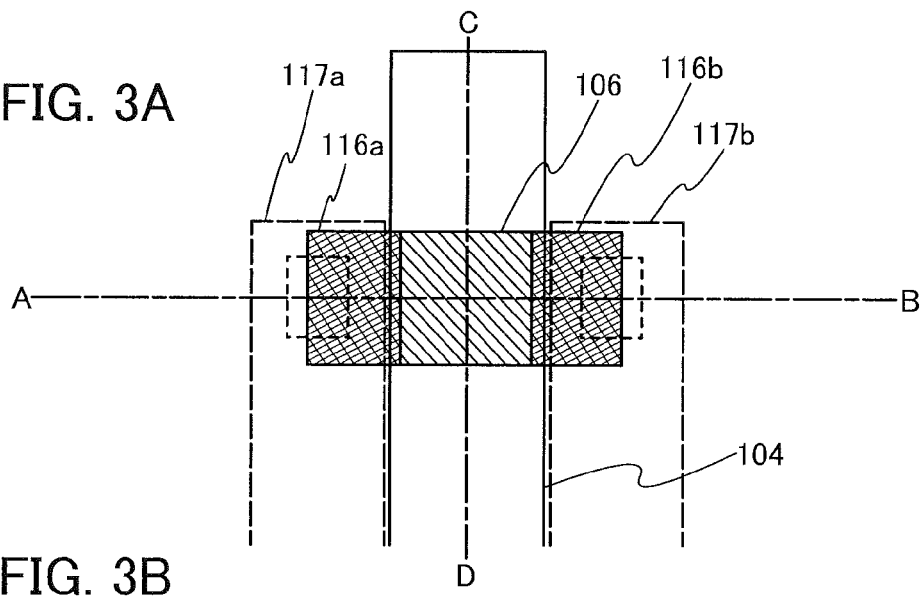
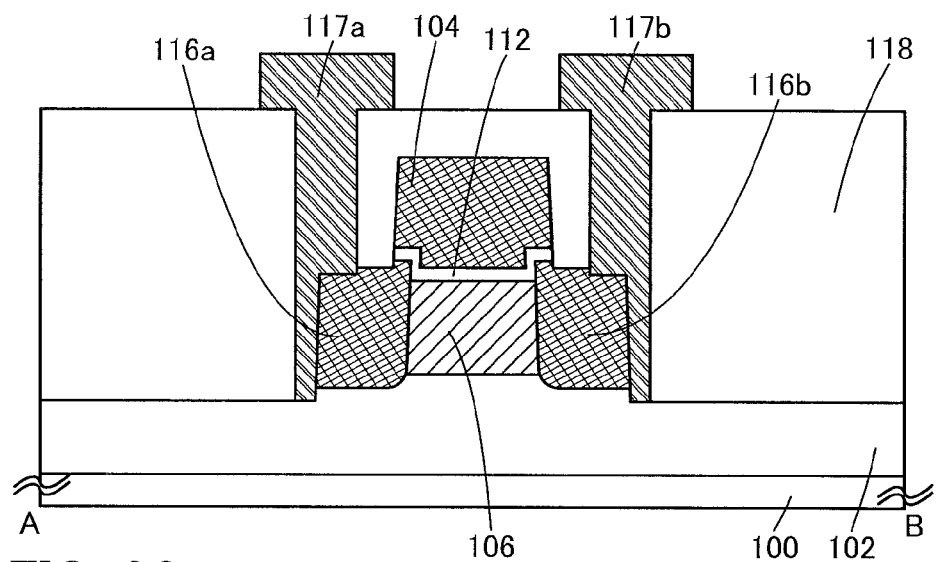
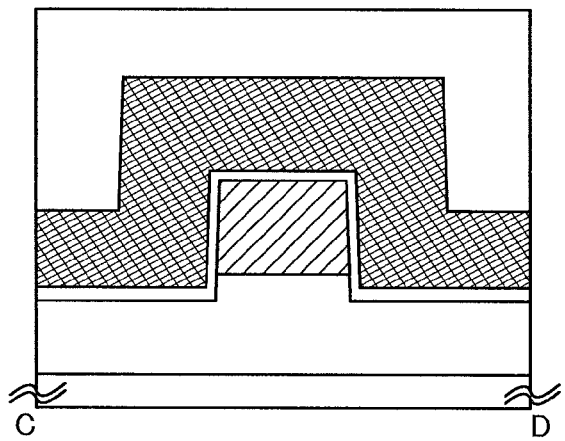
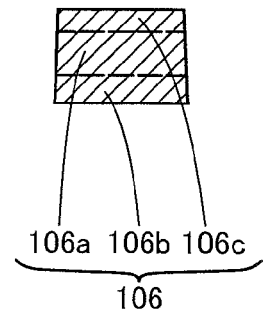

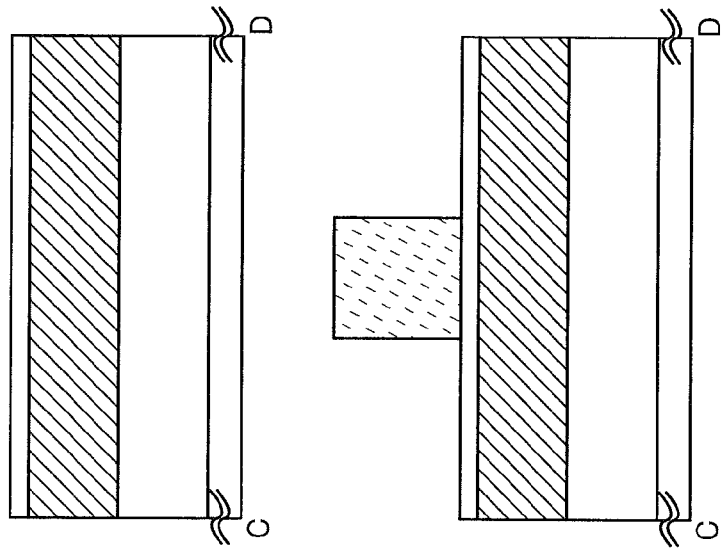
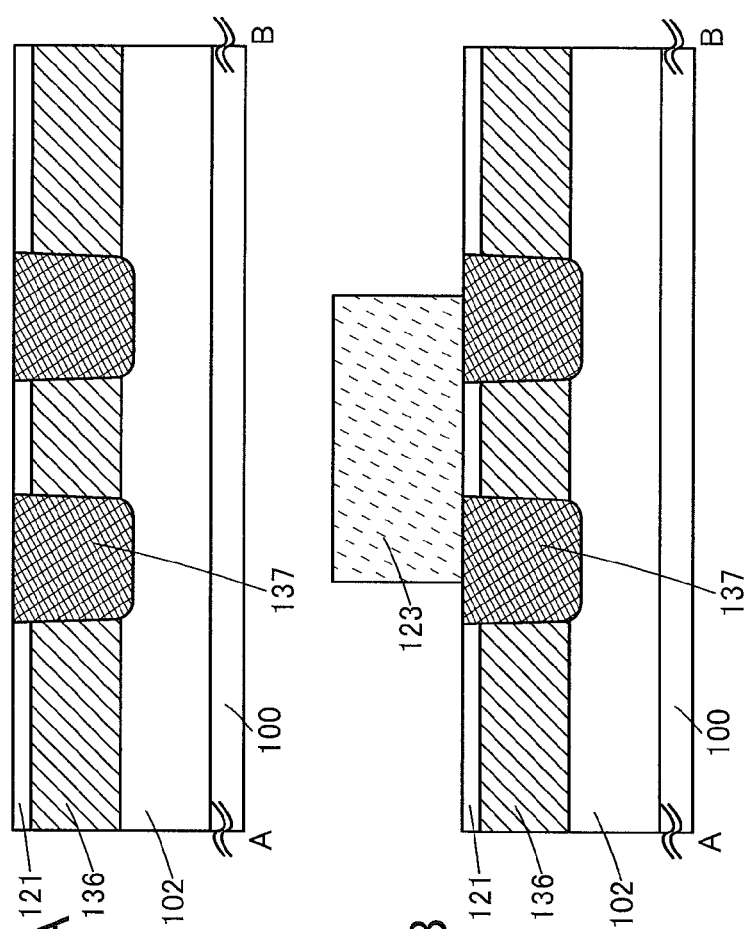

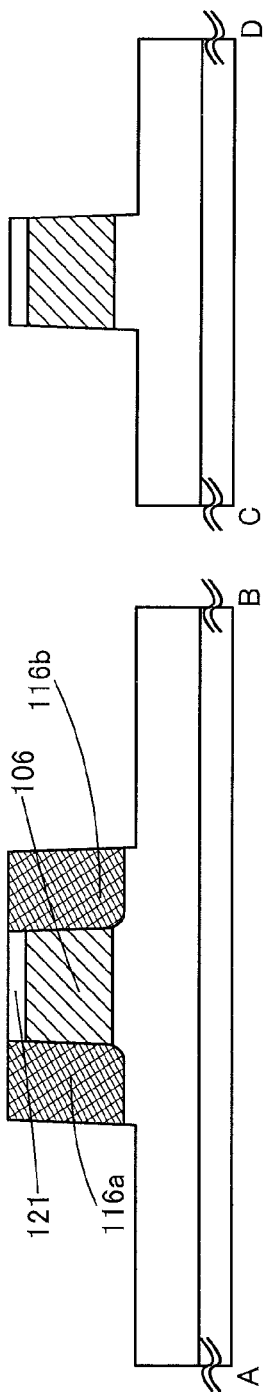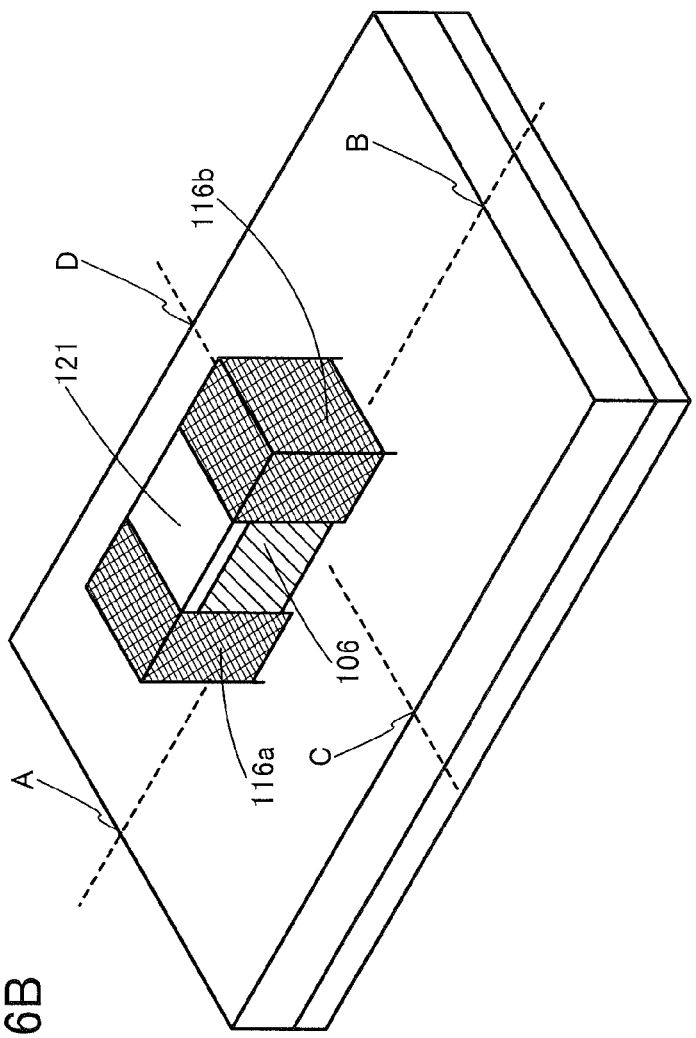
FIG. 6A
FIG. 6B

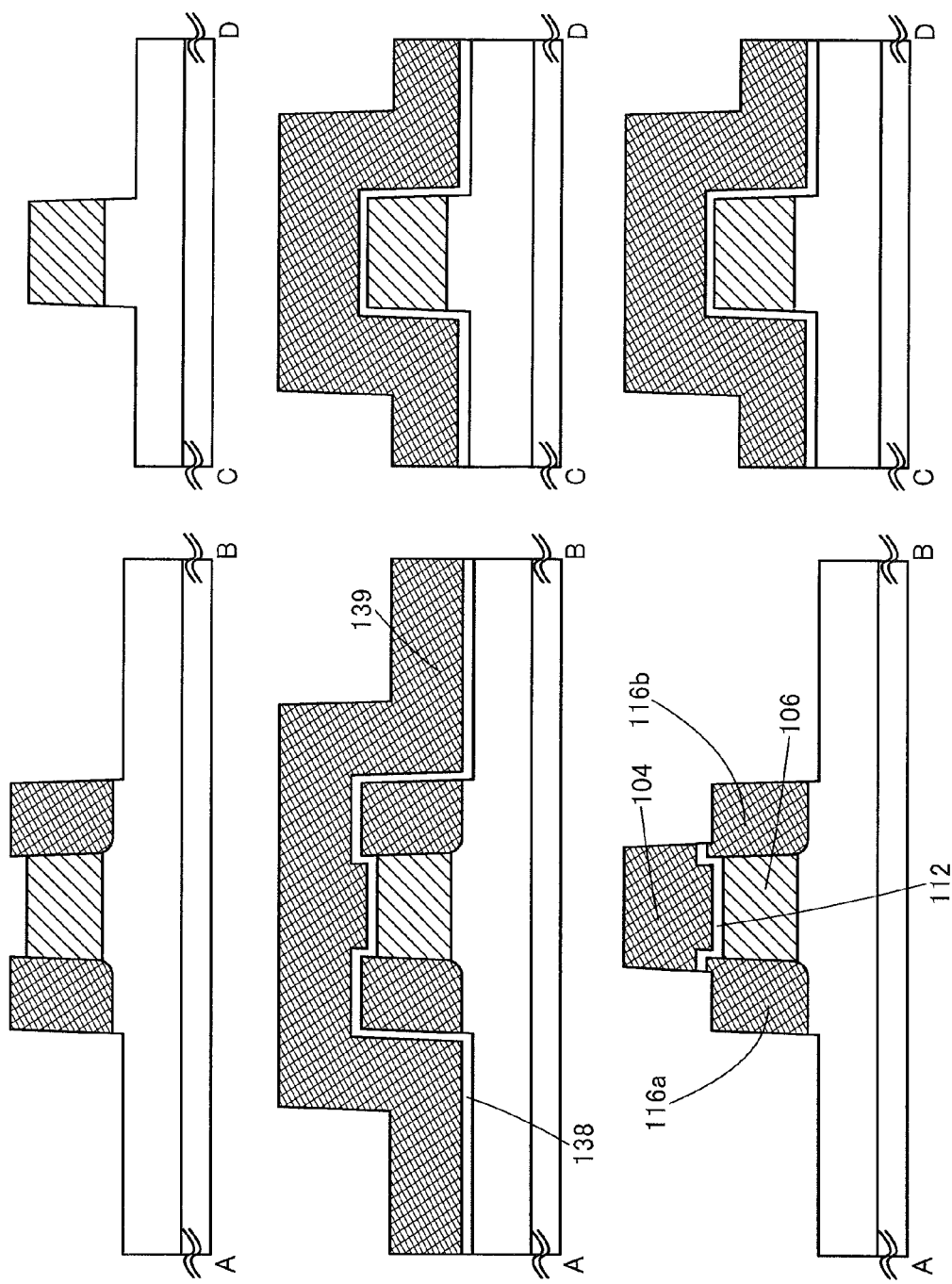

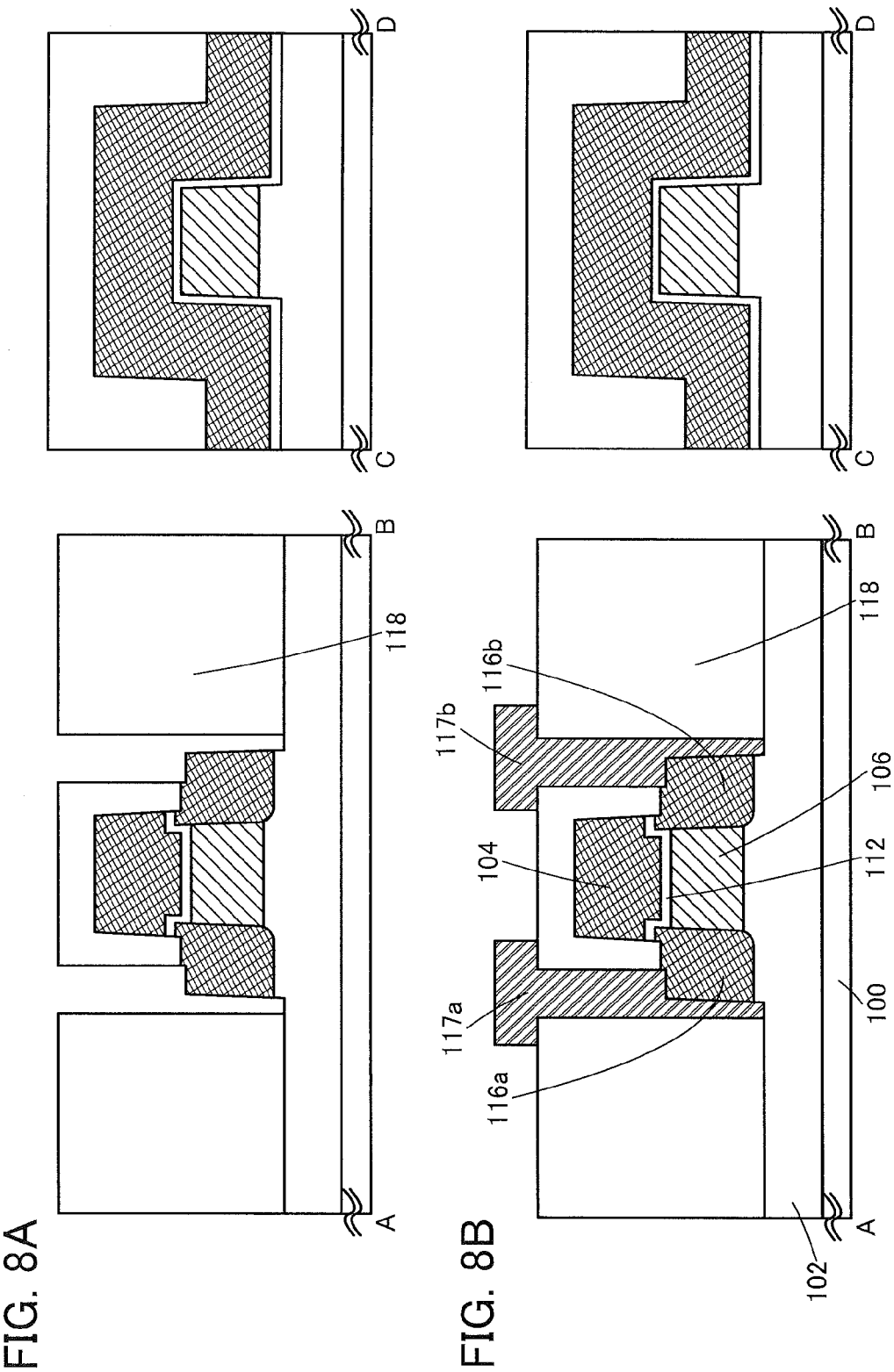

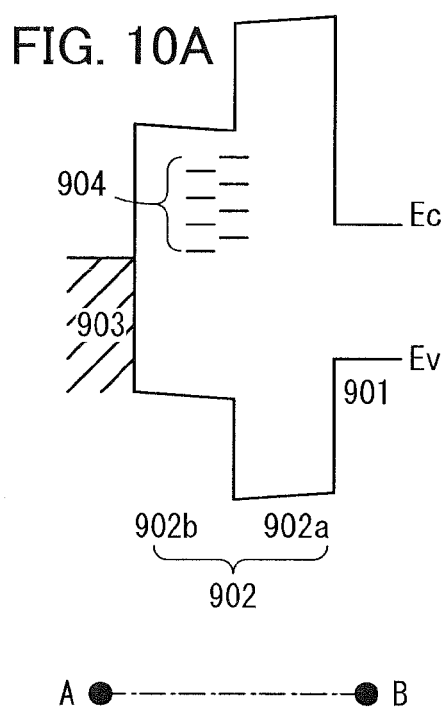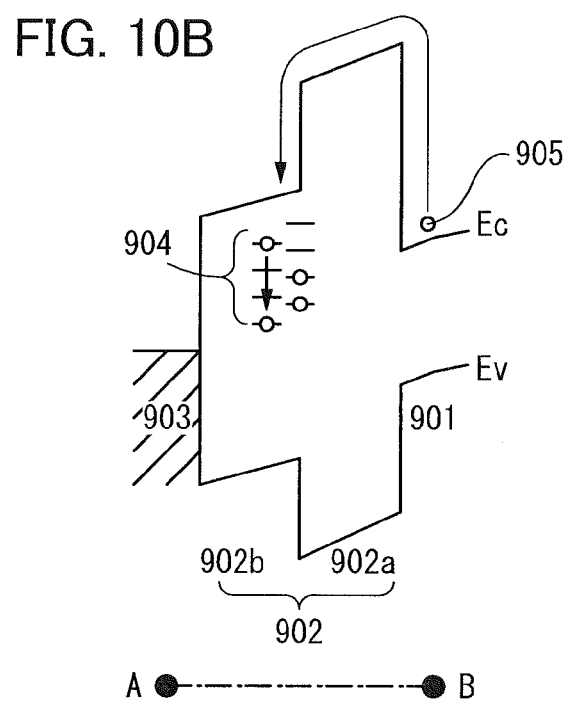

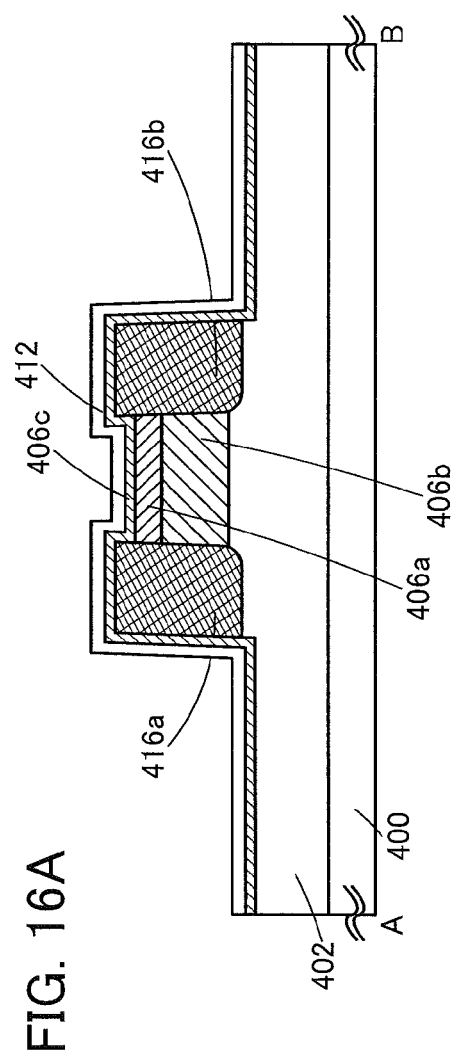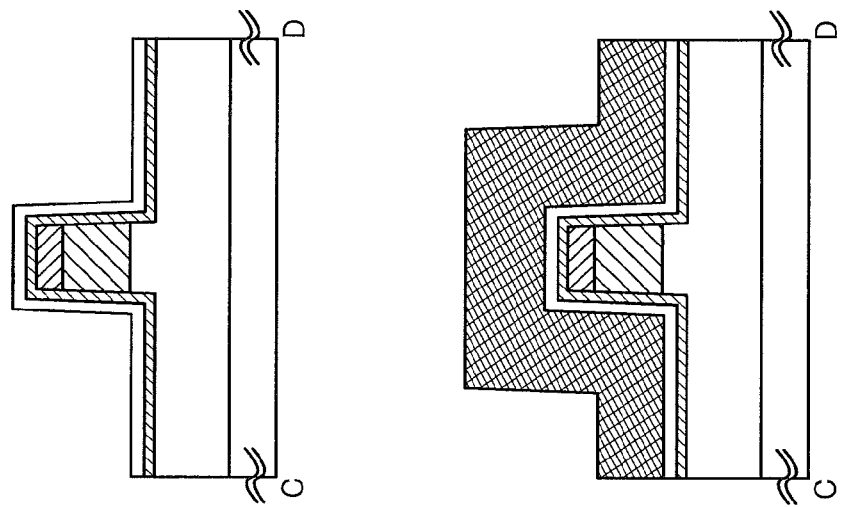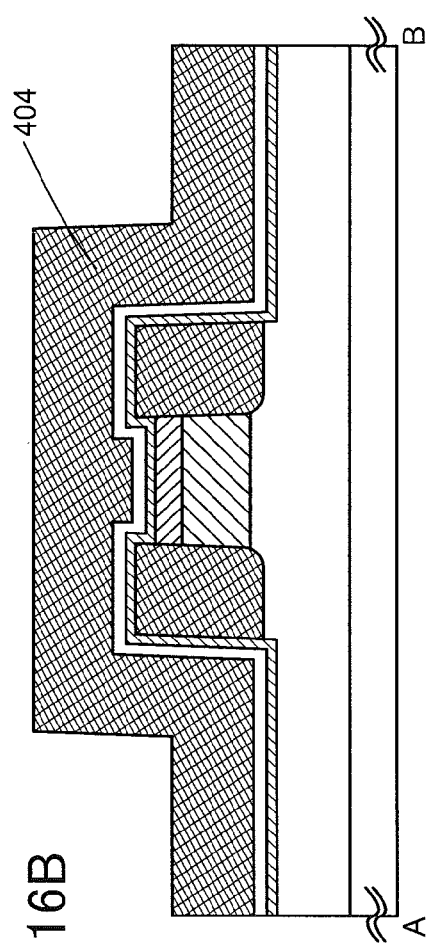
FIG. 16A
FIG. 16B

FIG. 17A
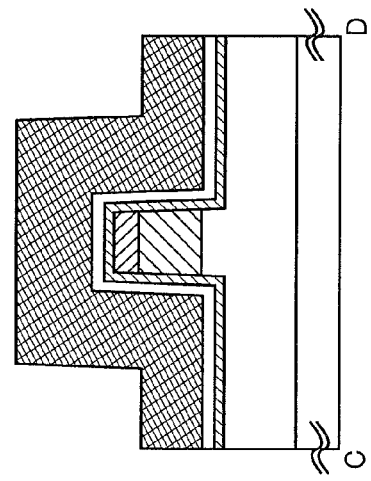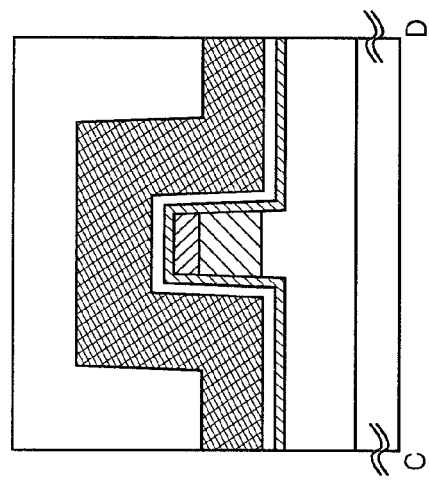
FIG. 17B
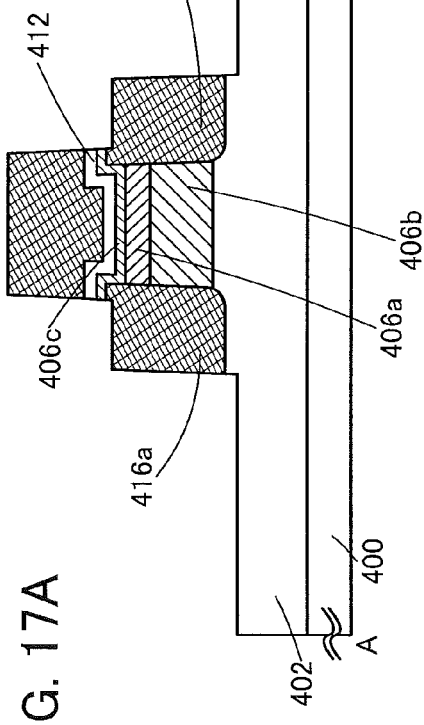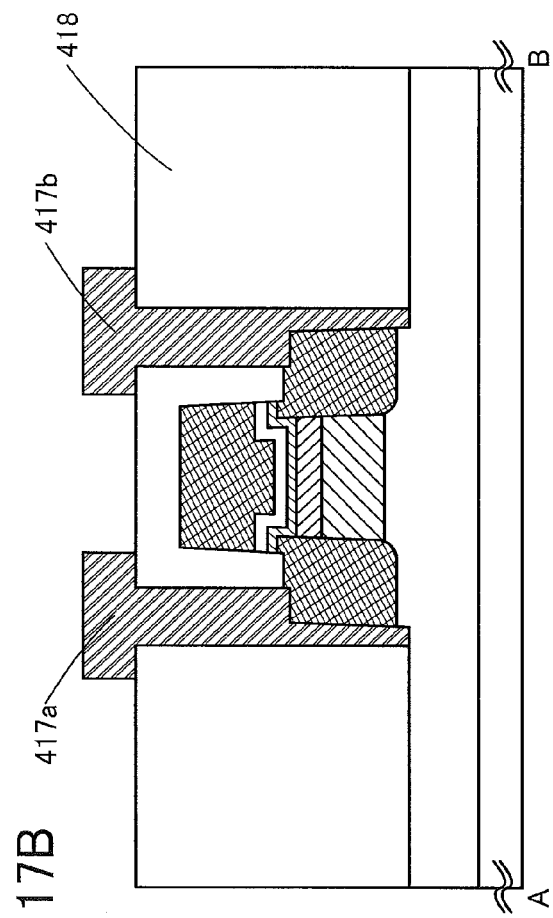

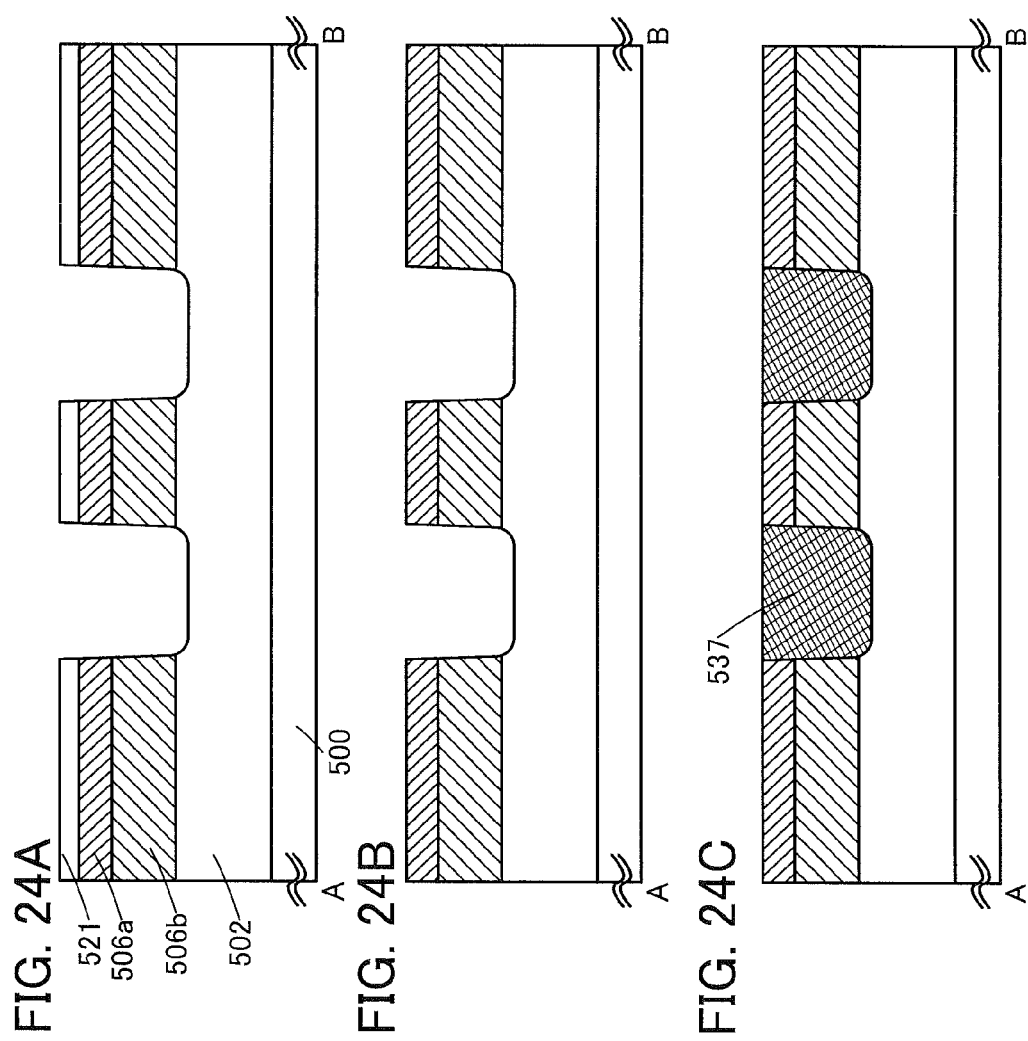

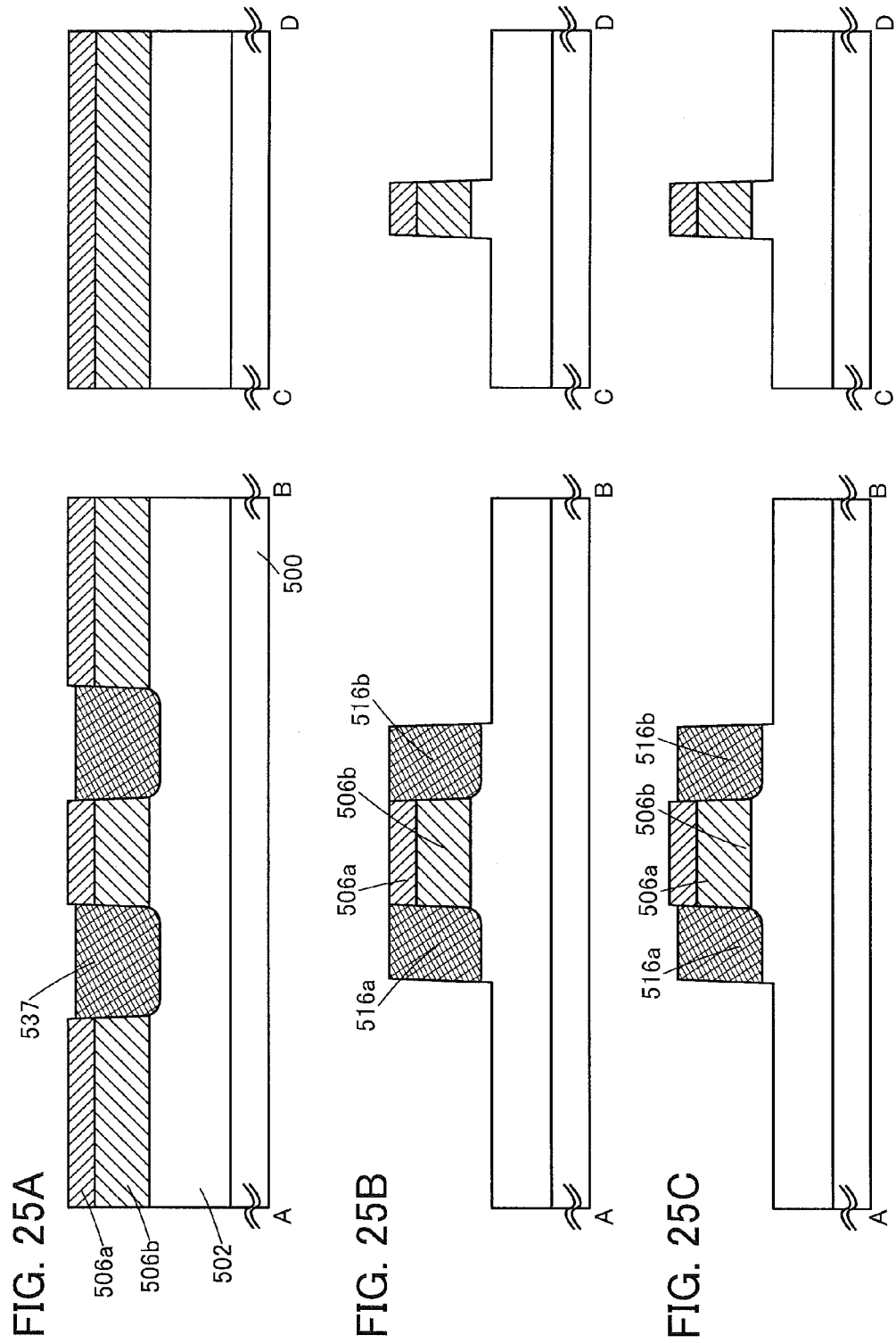

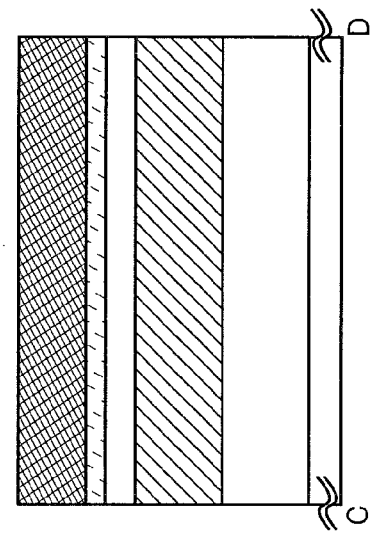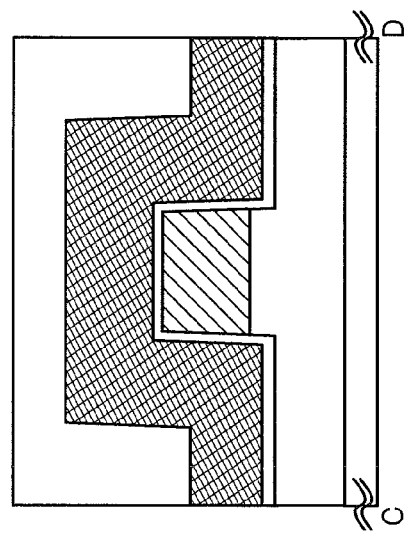
FIG. 31A
FIG. 31B

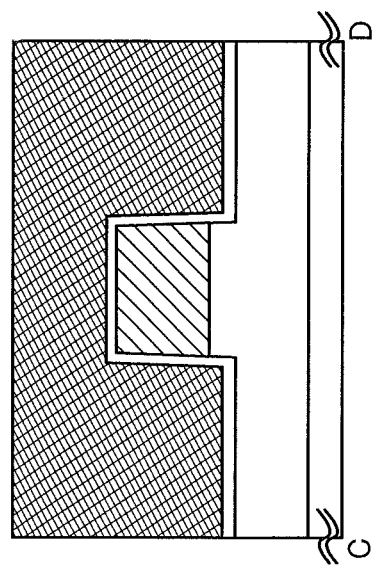
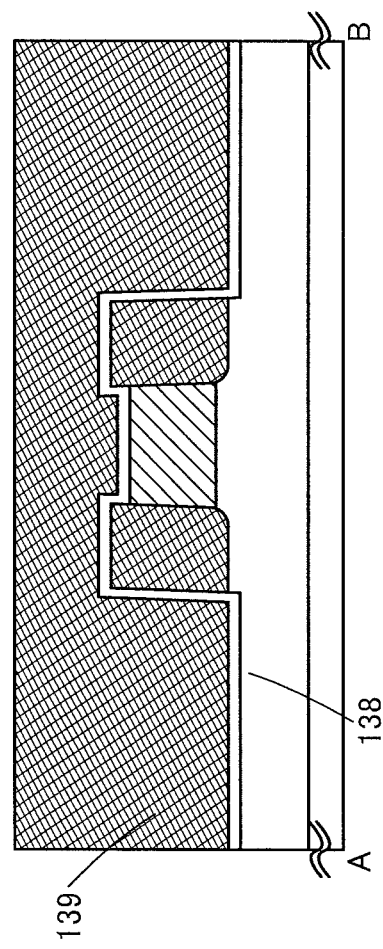
FIG. 32

FIG. 34A
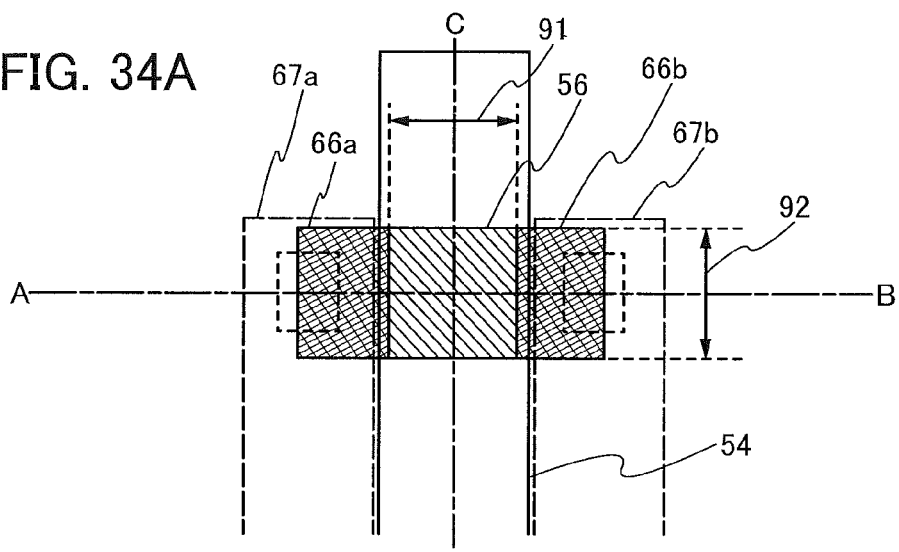
FIG. 34B
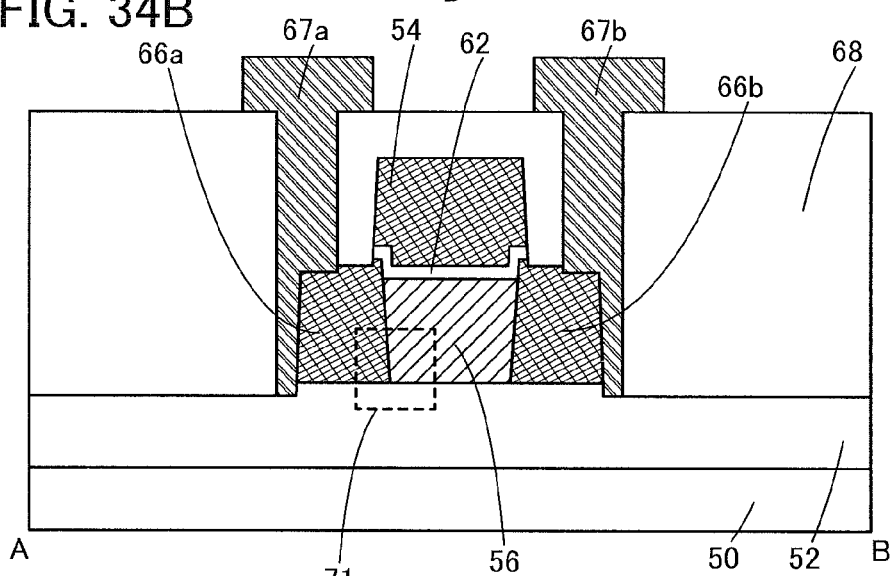
FIG. 34C
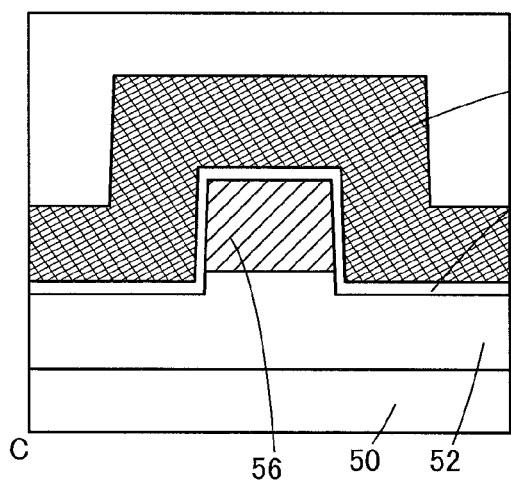
FIG. 34D

SEMICONDUCTOR DEVICE AND METHOD FOR MANUFACTURING THE SAME

CROSS-REFERENCE TO RELATED APPLICATIONS

This application is a divisional of U.S. application Ser. No. 14/462,824, filed Aug. 19, 2014, now allowed, which claims the benefit of a foreign priority application filed in Japan as Serial No. 2013-180228 on Aug. 30, 2013, both of which are incorporated by reference.

BACKGROUND OF THE INVENTION

1. Field of the Invention

The present invention relates to an object, a method, or a manufacturing method. The present invention relates to a process, a machine, manufacture, or a composition of matter. In particular, the present invention relates to, for example, a display device, a light-emitting device, or a driving method thereof; and a semiconductor device, a display device, or a light-emitting device each including a transistor, or a driving method thereof. The present invention relates to an electronic appliance including the semiconductor device, the display device, or the light-emitting device.

In this specification, the semiconductor device indicates all the devices that can function by utilizing semiconductor characteristics. A display device, an electro-optical device, a semiconductor circuit, an electronic device, and the like may include a semiconductor device.

2. Description of the Related Art

In recent years, a transistor that includes an oxide semiconductor film containing indium, gallium, and zinc has attracted attention.

A transistor including an oxide semiconductor film is known to have extremely low leakage current in an off state. For example, a low-power semiconductor device and the like utilizing the low leakage current of a transistor including an oxide semiconductor film and the high on-state current of a silicon transistor are disclosed (see Patent Document 1).

PATENT DOCUMENT

[Patent Document 1] Japanese Published Patent Application No. 2011-171702

SUMMARY OF THE INVENTION

An object is to provide a semiconductor device that operates at high speed. Another object is to provide a semiconductor device having favorable switching characteristics. Another object is to provide a highly integrated semiconductor device. Another object is to provide a miniaturized semiconductor device. Another object is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a manufacturing method of a semiconductor device, including the steps of: forming a semiconductor film including an opening, on an insulating surface; forming a conductive film over the semiconductor film and in the opening, and then removing the conductive film over the semiconductor film to form a conductive pillar in the opening; forming an island-shaped mask over the conductive pillar and the semiconductor film; etching the conductive pillar and the semiconductor film using the mask to form a first electrode and a first semiconductor; forming a gate insulating film on a top surface and a side surface of the first semiconductor; and forming a gate electrode that is in contact with a top surface of the gate insulating film and faces the top surface and the side surface of the first semiconductor.

Another embodiment of the present invention is a manufacturing method of a semiconductor device, including the steps of: forming a semiconductor film including a first opening and a second opening, on an insulating surface; forming a conductive film over the semiconductor film and in the first opening and the second opening, and then removing the conductive film over the semiconductor film to form a first conductive pillar and a second conductive pillar in the first opening and the second opening, respectively; forming an island-shaped mask over the first conductive pillar, the second conductive pillar, and the semiconductor film; etching the first conductive pillar, the second conductive pillar, and the semiconductor film using the mask to form a first electrode, a second electrode, and a first semiconductor between the first electrode and the second electrode; forming a gate insulating film on a top surface and a side surface of the first semiconductor; and forming a gate electrode that is in contact with a top surface of the gate insulating film and faces the top surface and the side surface of the first semiconductor.

In the above structures, the semiconductor film is preferably an oxide semiconductor film.

Another embodiment of the present invention is a semiconductor device including a first semiconductor film, a source electrode, and a drain electrode on an insulating surface; a gate insulating film over the first semiconductor film; and a gate electrode over the gate insulating film. The source electrode and the drain electrode are in contact with a side surface of the first semiconductor film. The first semiconductor film is sandwiched between the source electrode and the drain electrode. At least one side of the first semiconductor film is in contact with at least one side of the source electrode or the drain electrode.

In the above structure, the gate electrode preferably includes a region overlapping with at least one of the drain electrode and the source electrode. Alternatively, the semiconductor film preferably includes an electric-field relaxation region between a channel formation region of the semiconductor film and the source electrode or the drain electrode.

In the above structure, the first semiconductor film is preferably an oxide semiconductor film. Furthermore, the semiconductor device preferably includes a second semiconductor film below the first semiconductor film. The second semiconductor film is preferably an oxide semiconductor film and has a thickness larger than a thickness of the gate insulating film.

Another embodiment of the present invention is a semiconductor device including a first transistor using silicon; a first insulating film over the first transistor; an oxide semiconductor film, a source electrode, and a drain electrode over the first insulating film; a gate insulating film over the oxide semiconductor film; and a gate electrode over the gate insulating film. The source electrode and the drain electrode are in contact with a side surface of the oxide semiconductor film The oxide semiconductor film is sandwiched between the source electrode and the drain electrode. At least one side of the oxide semiconductor film is in contact with at least one side of the source electrode or the drain electrode.

A semiconductor device can be provided in which deterioration of electrical characteristics which becomes more noticeable as the transistor is miniaturized is suppressed. A semiconductor device that operates at high speed can be provided. A semiconductor device which possesses excellent switching characteristics can be provided. A highly integrated semiconductor device can be provided. A miniaturized semiconductor device can be provided. Note that one embodiment of the present invention is not limited to these effects. For example, depending on circumstances or conditions, one embodiment of the present invention might produce another effect or might not produce any of the above effects.

BRIEF DESCRIPTION OF THE DRAWINGS

FIGS. 3A to 3D are cross-sectional views illustrating an example of a transistor of one embodiment of the present invention.

FIGS. 5A and 5B are cross-sectional views illustrating an example of a method for manufacturing a semiconductor device of one embodiment of the present invention.

FIGS. 6A to 6B are cross-sectional views and a solid figure which illustrate an example of a method for manufacturing a semiconductor device of one embodiment of the present invention.

FIGS. 7A to 7C are cross-sectional views illustrating an example of a method for manufacturing a semiconductor device of one embodiment of the present invention.

FIGS. 8A and 8B are cross-sectional views illustrating an example of a method of manufacturing a semiconductor device of one embodiment of the present invention.

FIGS. 10A and 10B show band structures.

FIGS. 16A and 16B are cross-sectional views illustrating an example of a method for manufacturing a transistor of one embodiment of the present invention.

FIGS. 17A and 17B are cross-sectional views illustrating an example of a method for manufacturing a transistor of one embodiment of the present invention.

FIGS. 24A to 24C are cross-sectional views illustrating an example of a method for manufacturing a transistor of one embodiment of the present invention.

FIGS. 25A to 25C are cross-sectional views illustrating an example of a manufacturing method of a transistor of one embodiment of the present invention.

FIGS. 31A and 31B are cross-sectional views illustrating an example of a method of manufacturing the semiconductor device of one embodiment of the present invention.

FIG. 32 is a cross-sectional view illustrating an example of a method of manufacturing a semiconductor device of one embodiment of the present invention.

FIGS. 34A to 34D are cross-sectional views illustrating an example of a transistor of one embodiment of the present invention.

DETAILED DESCRIPTION OF THE INVENTION

Figure 1A:
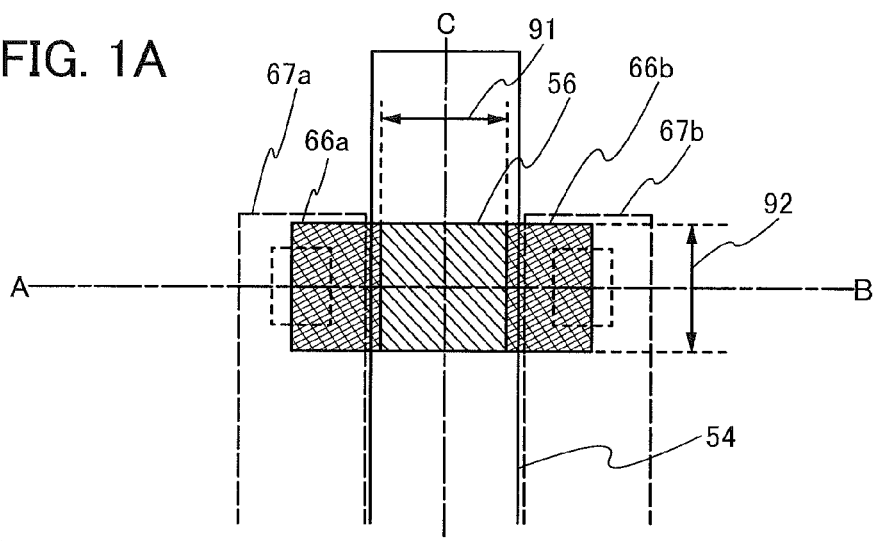
FIGS. 1A to 1C are a top view and cross-sectional views illustrating an example of a transistor of one embodiment of the present invention.

Hereinafter, embodiment of the present invention will be described in detail with the reference to the drawings. However, the present invention is not limited to the description below, and it is easily understood by those skilled in the art that modes and details disclosed herein can be modified in various ways. The present invention is not construed as being limited to description of the embodiments. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of layers, or regions in diagrams is sometimes exaggerated for simplicity. In embodiments of the present invention are not limited to such a scale.

A voltage usually refers to a potential difference between a given potential and a reference potential (e.g., a source potential or a ground potential (GND)); thus, a voltage can be referred to as a potential and vice versa.

Even when the expression "electrically connect" is used in this specification, in an actual circuit, there is a case in which no physical connection is made and a wiring is just extended.

Note that the ordinal numbers such as "first" and "second" in this specification are used for the sake of convenience and do not denote the order of steps or the stacking order of layers; thus, description can be made even when "first" is replaced with "second" or "third", for example. In addition, the ordinal numbers in this specification and the like are not necessarily the same as those which specify one embodiment of the present invention.

In this specification, for example, when the shape of an object is described with use of a term such as "diameter", "grain size (diameter)", "dimension", "size", or "width", the term can be regarded as the length of one side of a minimal cube where the object fits, or an equivalent circle diameter of a cross section of the object. The term "equivalent circle diameter of a cross section of the object" refers to the diameter of a perfect circle having the same area as that of the cross section of the object.

Note that a "semiconductor" may have characteristics of an "insulator" in some cases when the conductivity is sufficiently low, for example. Sometimes, a "semiconductor" and an "insulator" cannot be strictly distinguished from each other because the border between the "semiconductor" and the "insulator" is not clear. Thus, a "semiconductor" in this specification can be called an "insulator" in some cases. Similarly, an "insulator" in this specification can be called a "semiconductor" in some cases.

Furthermore, a "semiconductor" may have characteristics of a "conductor" in some cases when the conductivity is sufficiently high, for example. Sometimes, a "semiconductor" and a "conductor" cannot be strictly distinguished from each other because the border between the "semiconductor" and the "insulator" is not clear. Consequently, a "semiconductor" in this specification can be called a "conductor" in some cases. Similarly, a "conductor" in this specification can be called a "semiconductor" in some cases.

In this specification, a term "parallel" indicates that the angle formed between two straight lines is greater than or equal to −10° and less than or equal to 10°, and accordingly also includes the case where the angle is greater than or equal to 5° and less than or equal to 5°. A term "perpendicular" indicates that the angle formed between two straight lines is greater than or equal to 80° and less than or equal to 100°, and accordingly includes the case where the angle is greater than or equal to 85° and less than or equal to 95°.

Embodiment 1

In Embodiment 1, a transistor, a semiconductor device, and the like of one embodiment of the present invention will be described.

<Transistor Structure 1>

An example of a transistor structure of one embodiment of the present invention is described.

Figure 1B:
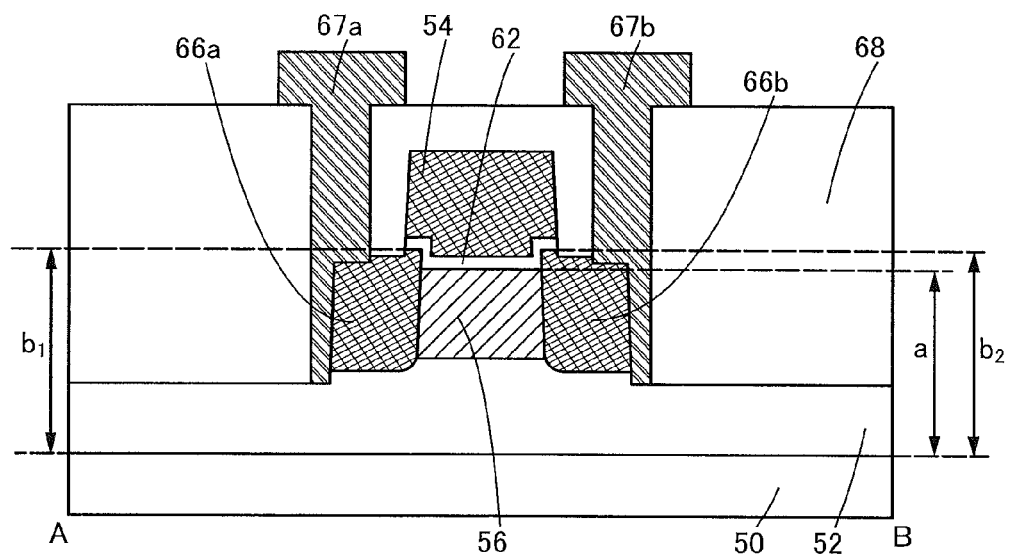
Figure 1C:
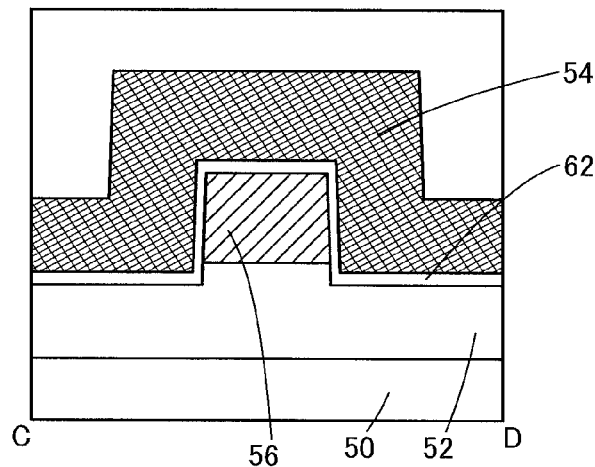

FIGS. 1A to 1C are a top view and cross-sectional views of the transistor. FIG. 1A is a top view of the transistor. FIG. 1B is a cross-sectional view taken along dashed-dotted line A-B in FIG. 1A. FIG. 1C is a cross-sectional view taken along dashed-dotted line C-D in FIG. 1A.

In FIG. 1B, the transistor includes an insulating film 52 over a substrate 50, a semiconductor film 56 over the insulating film 52, a gate insulating film 62 over the semiconductor film 56, a gate electrode 54 over the gate insulating film 62, and a source electrode 66a and a drain electrode 66b which are in contact with side surfaces of the semiconductor film 56. Note that the transistor preferably includes a protective insulating film 68 over the gate electrode 54 and the source and drain electrodes 66a and 66b, and wirings 67a and 67b over the protective insulating film 68. The gate insulating film 68 includes openings reaching the source electrode 66a and the drain electrode 66b. The wiring 67a and the wiring 67b are in contact with the source electrode 66a and the drain electrode 66b, respectively, through the openings. Note that the transistor does not necessarily include the insulating film 52 in some cases.

As illustrated in FIG. 1B, the source and drain electrodes 66a and 66b are in contact with the side surfaces of the semiconductor film 56. A channel formation region of the semiconductor film 56 is in contact with the source and drain electrodes 66a and 66b; thus, the resistance of the transistor can be reduced and the on-state current can be increased. Note that an electric-field relaxation region whose resistance is higher than that of the source and drain electrodes 66a and 66b may be provided between the channel formation region of the semiconductor film 56 and the source and drain electrodes 66a and 66b. In FIG. 1B, the distance a from the substrate top surface to the top surface of the semiconductor film 56 is smaller than the distance $b_1$ from the substrate top surface to the top surface of the source electrode and the distance $b_2$ from the substrate top surface to the top surface of the drain electrode, that is, $a<b_1$ and $a<b_2$. The relationships between a, $b_1$, and $b_2$ depend on the manufacturing method as will be shown in FIGS. 25B and 25C. In the case where the top surface is uneven, the distance from the substrate top surface to the highest point of the uneven top surface is used.

Here, the channel formation region is a region where the semiconductor film 56 overlap the gate electrode 54 in the top view and which is sandwiched between the source region and the drain region. The channel length is the distance between the source and drain regions in the top view. That is, the channel length in FIG. 1A corresponds to a channel length 91 indicated by an arrow. A width W of the semiconductor film 56 is the length of a portion where the source region and the drain region face each other in parallel and where the semiconductor film and the gate electrode overlap with each other. That is, the width W in FIG. 1A corresponds to a channel width 92 indicated by an arrow.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Thus, in this specification, a channel width is any one value, the maximum value, the minimum value, or the average value in a region where a channel is formed.

Depending on transistor structures, a channel width in a region where a channel is formed actually (hereinafter referred to as an effective channel width) is different from a channel width (e.g., the width 92 in FIG. 1A) shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a top surface of a semiconductor is higher than the proportion of a channel region formed in a side surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

In view of the above, in a top view of a transistor, an apparent channel width that is a length of a portion where a source and a drain face each other in a region where a semiconductor and a gate electrode overlap with each other may be referred to as a "surrounded channel width (SCW)" in this specification. Further, in this specification, in the case where the term "channel width" is simply used, it may denote a surrounded channel width and an apparent channel width in some cases; and in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image, for example.

In the case where electric field mobility, a current value per channel width, and the like of a transistor are obtained by calculation, a surrounded channel width may be used for the calculation. Here, the obtained value may be different from one in the case of using an effective channel width for the calculation.

A conductive material is preferably used for the source electrode 66a and the drain electrode 66b because the conductivity in the thickness direction can be uniform compared to the case where a semiconductor film is used for a source region and a drain region. When a semiconductor film is used for source and drain regions, impurities are added to reduce the resistance of the source and drain regions, for example; however, ion implantation or ion doping produces distribution of impurities in the depth direction.

For example, an oxide semiconductor film can be used as the semiconductor film 56 in FIGS. 1A to 1C. For the oxide semiconductor film, an oxide semiconductor film 106 described later is referred to. Alternatively, semiconductors such as silicon and germanium; compound semiconductors such as silicon germanium, silicon carbide, gallium nitride, GaAs (gallium arsenic), InAs (indium arsenic), and InGaAs (indium gallium arsenic); organic semiconductors; may be used for the semiconductor film 56.

The aspect ratio R of the semiconductor film 56 is defined as R=t/W, where t is thickness and W is width of the semiconductor film 56. R is preferably 0.01 to 100, inclusive; more preferably 0.05 to 50, inclusive; still more preferably 0.1 to 15, inclusive. Note that R is not limited to these ranges. In the case where the semiconductor film is a stacked layer, the thickness t of the semiconductor film is the sum of thicknesses of the stacked films.

Here, an angle at the interface between the semiconductor film 56 and the source and drain electrodes 66a and 66b will be described with reference to FIGS. 34A to 34D. FIG. 34A is a top view of the transistor. FIG. 34B is a cross-sectional view taken along dashed-dotted line A-B in FIG. 34A. FIG. 34C is a cross-sectional view taken along dashed-dotted line C-D in FIG. 34A. FIG. 34D is an enlarged view of a region 71 which is surrounded by broken line in FIG. 34B. Angle θ in FIG. 34D is formed by the bottom surface of the semiconductor film 56 and the interface between the semiconductor film 56 and the source electrode 66a in the cross-section corresponding to dashed-dotted line A-B in FIG. 34A. When $70°\leq\theta\leq90°$ is satisfied, a conductive film is easily formed in an opening and thus the coverage of the opening with the conductive film can be improved in some cases, for example. When $90°<\theta\leq110°$ is satisfied, the gate insulating film 62 and the gate electrode 54 can be formed over the source and drain electrodes 66a and 66b with high coverage in some cases.

The insulating film 52 illustrated in FIGS. 1A to 1C is, for example, an insulating film containing silicon oxide or silicon oxynitride, which can be a single layer or a stacked layer. The thickness of the insulating film 52 is, for example, greater than or equal to 20 nm and less than or equal to 1000 nm, preferably greater than or equal to 50 nm and less than or equal to 1000 nm, more preferably greater than or equal to 100 nm and less than or equal to 1000 nm, still more preferably greater than or equal to 200 nm and less than or equal to 1000 nm.

In particular, when an oxide semiconductor film is used as the semiconductor film 56, an insulating film containing excess oxygen is preferably used as the insulating film 52. The insulating film containing excess oxygen can be formed by adding oxygen. The addition of oxygen may be performed, for example, by an ion implantation method at an acceleration voltage of higher than or equal to 2 kV and lower than or equal to 100 kV and at a concentration of greater than or equal to $5\times10^{14}$ ions/cm² and less than or equal to $5\times10^{16}$ ions/cm².

The insulating film 52 may be a stacked layer including a silicon nitride film as a first layer and a silicon oxide film as a second layer. A silicon oxynitride film may be used instead of the silicon oxide film. A silicon nitride oxide film may be used instead of the silicon nitride film. It is preferable to use a silicon oxide film whose defect density is small as the silicon oxide film. Specifically, a silicon oxide film whose spin density attributed to a signal with a g factor of 2.001 in electron spin resonance (ESR) is lower than or equal to $3\times10^{17}$ spins/cm³, preferably lower than or equal to $5\times10^{16}$ spins/cm³ is used. When an oxide semiconductor film is used as the semiconductor film 56, for example, a silicon nitride film from which hydrogen and ammonia are less likely to be released is used in the insulating film 52. The amount of released hydrogen and ammonia can be measured by thermal desorption spectroscopy (TDS). As the silicon nitride film, a silicon nitride film which does not transmit or hardly transmits hydrogen, water, and oxygen is used.

Alternatively, the insulating film 52 may be a stacked layer including a silicon nitride film as a first layer, a first silicon oxide film as a second layer, and a second silicon oxide film as a third layer. In that case, the first and/or second silicon oxide film may be a silicon oxynitride film. A silicon nitride oxide film may be used instead of the silicon nitride film. It is preferable to use a silicon oxide film whose defect density is small as the first silicon oxide film. Specifically, a silicon oxide film whose spin density attributed to a signal with a g factor of 2.001 in ESR is lower than or equal to $3 \times 10^{17}$ spins/cm$^3$, preferably lower than or equal to $5 \times 10^{16}$ spins/cm$^3$ is used. When an oxide semiconductor film is used as the semiconductor film 56, a silicon oxide film containing excess oxygen is used as the second silicon oxide film. As the silicon nitride film, a silicon nitride film from which hydrogen and ammonia are discharged as less as possible is used. As the silicon nitride film, a silicon nitride film which does not transmit or hardly transmits hydrogen, water, and oxygen is used.

Further alternatively, an insulating film containing a high-k material such as aluminum oxide, hafnium oxide, tantalum oxide, zirconium oxide, lead zirconate titanate (PZT), strontium titanate (SrTiO$_3$), or (Ba, Sr)TiO3 (BST) can be used as the insulating film 52. The insulating film may be a single layer or a stacked layer. The insulating film may contain oxide such as aluminum oxide, bismuth oxide, germanium oxide, niobium oxide, silicon oxide, titanium oxide, tungsten oxide, yttrium oxide, or zirconium oxide. A layer of silicon oxide, silicon oxynitride, or silicon nitride may be stacked over the insulating film.

The source electrode 66a and the drain electrode 66b may be formed using a single layer or a stacked layer of a conductive film containing aluminum, titanium, chromium, cobalt, nickel, copper, yttrium, zirconium, molybdenum, ruthenium, silver, tantalum, or tungsten. The source electrode 66a and the drain electrode 66b are formed preferably by sputtering, a CVD method (including a metal organic chemical vapor deposition (MOCVD) method, an atomic layer deposition (ALD) method, or a plasma-enhanced CVD (PECVD) method), vacuum evaporation, a pulse laser deposition (PLD) method. To reduce damage to the deposition surface and the deposited film, CVD is preferable, and MOCVD or ALD is more preferable.

The gate insulating film 62 is an insulating film containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide, which can be a single layer or a stacked layer. An insulating film containing excess oxygen is preferably used as the gate insulating film 62. The thickness (equivalent oxide thickness) of the gate insulating film 62 is, for example, greater than or equal to 0.4 nm and less than or equal to 500 nm, preferably greater than or equal to 0.4 nm and less than or equal to 300 nm, more preferably greater than or equal to 1 nm and less than or equal to 100 nm, still more preferably greater than or equal to 1 nm and less than or equal to 50 nm.

The gate insulating film 62 may be, for example, a stacked film including a silicon nitride film as a first layer and a silicon oxide film as a second layer. A silicon oxynitride film may be used instead of the silicon oxide film. A silicon nitride oxide film may be used instead of the silicon nitride film. It is preferable to use a silicon oxide film whose defect density is small as the silicon oxide film. Specifically, a silicon oxide film whose spin density attributed to a signal with a g factor of 2.001 in ESR is lower than or equal to $3 \times 10^{17}$ spins/cm$^3$, preferably lower than or equal to $5 \times 10^{16}$ spins/cm$^3$ is used. As the silicon oxide film, a silicon oxide film containing excess oxygen is preferably used. As the silicon nitride film, a silicon nitride film from which a hydrogen gas and an ammonia gas are less likely to be released is used. The amount of released hydrogen and ammonia gases can be measured by TDS.

The gate insulating film 62 is formed preferably by sputtering, CVD (including MOCVD, ALD, or PECVD), vacuum evaporation, PLD. To reduce damage to the deposition surface and the deposited film, CVD is preferable, and MOCVD or ALD is more preferable.

For example, like a stacked-layer film of silicon oxide and hafnium oxide, a material having a lot of electron trap states, such as hafnium oxide, aluminum oxide, or tantalum oxide, is used for part of the gate insulating film 62 and the state where the potential of the gate electrode 54 is higher than that of the source electrode 66a or the drain electrode 66b is kept for one second or more, typically one minute or more at a higher temperature (a temperature higher than the operating temperature or the storage temperature of the semiconductor device, or a temperature of 125° C. or higher and 450° C. or lower, typically a temperature of 150° C. or higher and 300° C. or lower). Electrons are thus moved from the semiconductor film 56 to the gate electrode 54, and some of the electrons are trapped by the electron trap states.

In the semiconductor device in which a necessary amount of electrons is trapped by the electron trap states in this manner, the threshold voltage shifts in the positive direction. By controlling the voltage of the gate electrode 54, the amount of electrons to be trapped can be controlled, and thus the threshold voltage can be controlled. The treatment for trapping the electrons is performed in the manufacturing process of the semiconductor device.

The treatment may be performed at any of the following timings before leaving the factory, for example: after formation of wiring metal connected to the source electrode 66a or the drain electrode 66b of the semiconductor device, after backplane process (wafer process), after wafer dicing, and after packaging. In either case, it is preferable that the semiconductor device be not exposed to temperatures of 125° C. or higher for 1 hour or more after the treatment.

An example in which the gate insulating film 62 is used also as an electron trap layer is described with reference to simplified cross-sectional views.

Figure 9A:
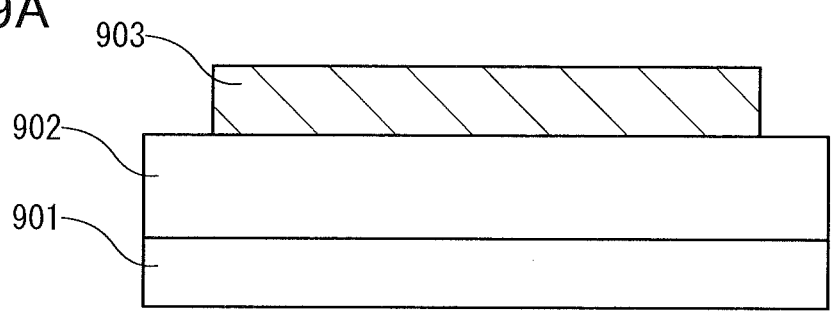
FIGS. 9A to 9C are cross-sectional views of a transistor.

FIG. 9A illustrates a semiconductor device including a semiconductor film 901, an electron trap layer 902, and a gate electrode 903. The electron trap layer 902 corresponds to the gate insulating film 62 in FIGS. 1A to 1C and the like. The gate electrode 903 corresponds to the gate electrode 54 in FIGS. 1A to 1C and the like.

The electron trap layer 902 includes a state that traps an electron (electron trap state). Alternatively, the electron trap layer 902 is a layer in which an electron is trapped by a given means or processing. Alternatively, the electron trap layer 902 is a layer in which an electron is to be trapped by a given means or processing. Depending on the formation method and formation conditions, such a state is not formed even when the electron trap layer 902 is formed of the same constituent elements.

Figure 9B:
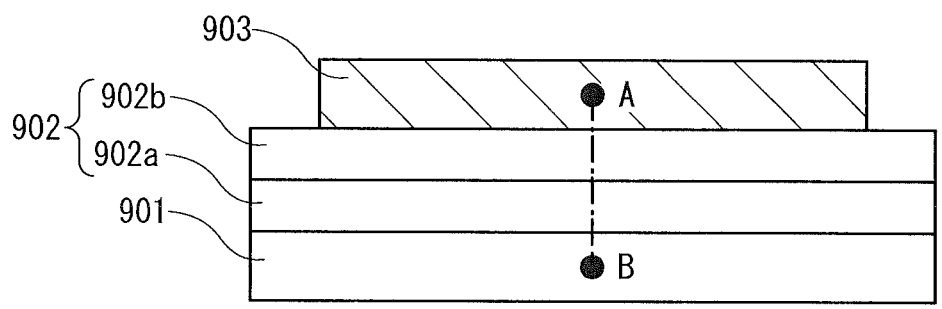
Figure 9C:
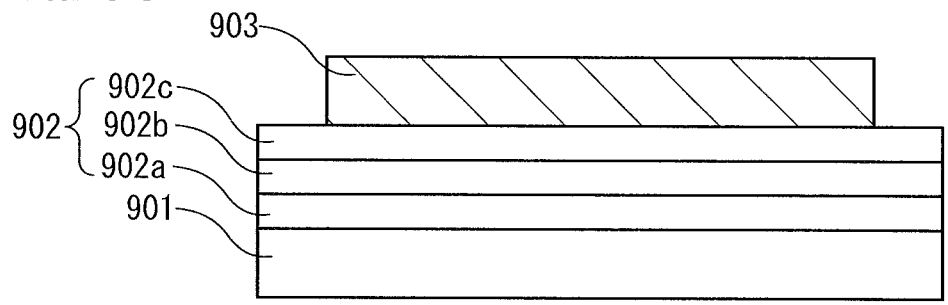

As the electron trap layer 902, for example, a stacked body of a first insulating film 902a and a second insulating film 902b as shown in FIG. 9B, a stacked body of the first insulating film 902a, the second insulating film 902b, and a third insulating film 902c as shown in FIG. 9C, or a stacked body of four or more layers may be used.

The constituent elements of the first to third insulating films may be all the same as each other or partly different from each other. The methods (conditions) for forming the first to third insulating films may be all the same as each other or partly different from each other.

For example, an insulating film formed by sputtering and an insulating film formed by CVD or ALD may be used as the second insulating film 902b and the first insulating film 902a, respectively. In the structure of FIG. 9C, the third insulating film 902c may be formed in the same way as the first insulating film 902a. Note that one embodiment of the present invention is not limited to this, and an insulating film formed by CVD or ALD and an insulating film formed by sputtering may be used as the second insulating film 902b and the first insulating film 902a, respectively.

The insulating film formed by CVD can serve as a normal gate insulating film. Thus, leakage current between a gate and a drain or a source can be reduced. In contrast, the insulating film formed by sputtering has a high density of electron trap states and thereby can make the threshold voltage of the transistor high. This structure enables small leakage current and appropriate threshold voltage adjustment.

Furthermore, the formation method of the semiconductor film 901 and the formation method of the first insulating film 902a that is in contact with the semiconductor film 901 may be the same for easy successive formation. For example, in the case of forming the semiconductor film 901 by a sputtering method, the first insulating film 902a may also be formed by a sputtering method and then the second insulating film 902b may be formed by a CVD method or an ALD method. In the case of FIG. 9C, the third insulating film 902c may also be formed by a sputtering method. Similarly, in the case of forming the semiconductor film 901 by a CVD method, the first insulating film 902a may also be formed by a CVD method and then the second insulating film 902b may be formed by a sputtering method. In the case of FIG. 9C, the third insulating film 902c may also be formed by a CVD method. These structures enable small leakage current, appropriate threshold voltage adjustment, and easy manufacturing. Note that one aspect of one embodiment of the present invention is not limited to these.

As the CVD method, various methods can be employed: a thermal CVD method, a photo CVD method, a plasma CVD method, an MOCVD method, an LPCVD method or the like can be used. Thus, insulating films may be formed by different CVD methods.

FIG. 10A illustrates a band diagram example of the semiconductor device illustrated in FIG. 9B, from point A to point B. In FIG. 10A, Ec and Ev denote the bottom of the conduction band and the top of the valence band, respectively. In FIG. 10A, the potential of the gate electrode 903 is equal to the potential of a source electrode or a drain electrode (not illustrated).

Note that the third insulating film 902c in FIG. 9C having a smaller electron affinity than the second insulating film 902b in the electron trap layer 902 is effective in holding electrons trapped by electron trap states in the second insulating film 902b or at the interface between the second insulating film 902b and another insulating film In this case, if the physical thickness of the third insulating film 902c is large enough, electrons trapped by electron trap states 904 can be held even when the second insulating film 902b has a small thickness.

The second insulating film 902b is formed by a formation method (or formation conditions) that makes the density of electron trap states 904 higher. Consequently, a large number of electron trap states are formed at the interface between the first insulating film 902a and the second insulating film 902b and at the interface between the second insulating film 902b and the third insulating film 902c.

When the gate electrode 903 has the above-described potential and temperature, electrons 905 are transferred from the semiconductor film 901 toward the gate electrode 903, and are transferred to the electron trap layer 902 by Fowler-Nordheim tunnel effect, Poole-Frenkel conduction, and thermal excitation, or a combination of them. Some electrons 905 are trapped by the electron trap states 904, and the electron trap layer 902 is negatively charged (see FIG. 10B).

Figure 35A:
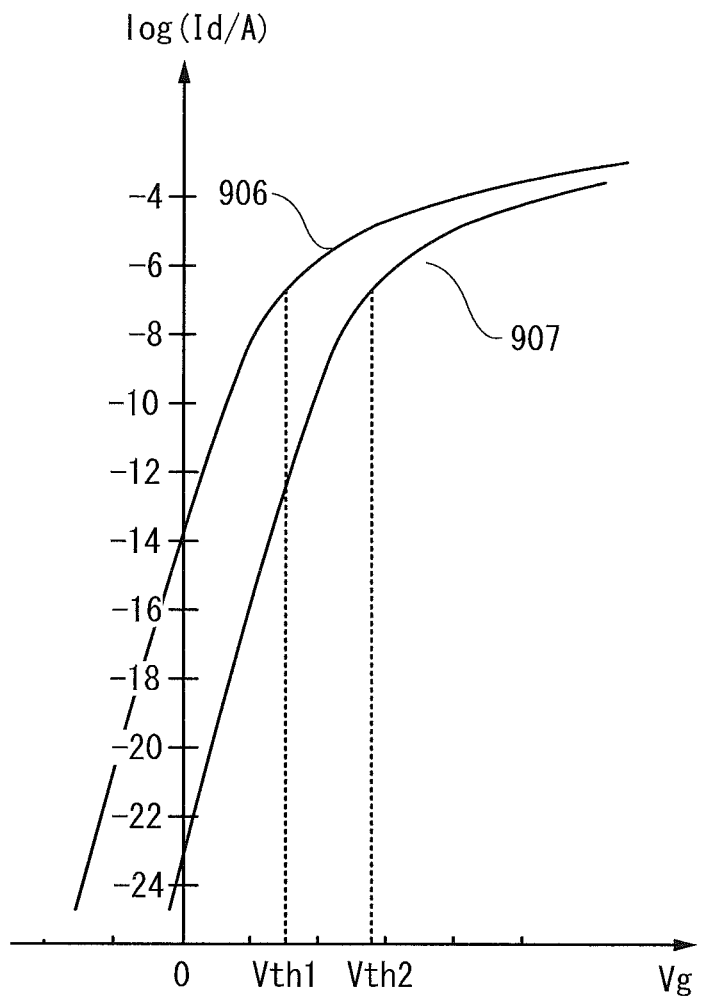
FIGS. 35A and 35B show electric characteristics of transistors.

As described above, the threshold voltage of the semiconductor device is increased by the trap of electrons in the electron trap layer 902 as illustrated in FIG. 35A. In particular, when the semiconductor film 901 is formed using a wide band gap material, a source-drain current (Icut) when the potential of the gate electrode 903 is equal to the potential of the source electrode can be significantly decreased.

For example, the Icut current density (a current value per micrometer of a channel width) of an In—Ga—Zn-based oxide whose band gap is 3.2 eV is 1 zA/μm ($1\times10^{-21}$ A/μm) or less, typically 1 yA/μm ($1\times10^{-24}$ A/μm) or less.

FIG. 35A schematically shows dependence of current per micrometer of channel width (Id) between source and drain electrodes on the potential of the gate electrode 903 (Vg) at room temperature, before and after electron trap in the electron trap layer 902. Note that each potential of the source electrode and the gate electrode 903 is 0 V and the potential of the drain electrode is +1 V. Although current smaller than 1 fA cannot be measured directly, it can be estimated from a value measured by another method, the subthreshold value, and the like.

As indicated by a curve 906, the threshold voltage of the semiconductor device is Vth1 at first. After electron trapping, as indicated by a curve 906, the threshold voltage is increased (shifts in the positive direction) to become Vth2. As a result, the current density when Vg=0 becomes 1 aA/μm ($1\times10^{-18}$ A/μm) or less, for example, greater than or equal to 1 zA/μm and less than or equal to 1 yA/μm.

Figure 35B:
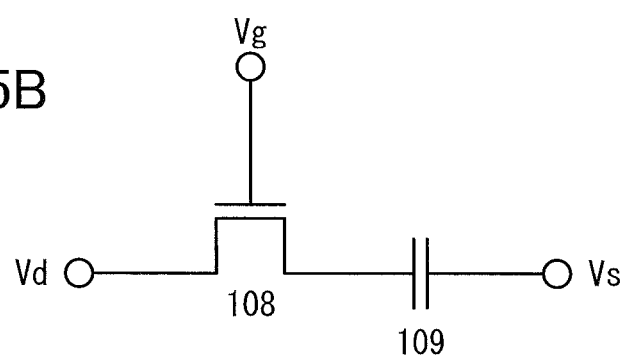

FIG. 35B illustrates a circuit in which charge stored in a capacitor 909 is controlled by a transistor 908. Leakage current between electrodes of the capacitor 909 is ignored. The capacitance of the capacitor 909 is 1 fF, the potential of the capacitor 909 on the transistor 908 side is +1 V, and the potential of Vd is 0 V.

The curve 906 in FIG. 35A denotes the Id-Vg characteristics of the transistor 908. When the channel width is 0.1 μm, the Icut density is approximately 1 fA and the resistivity of the transistor 908 at this time is approximately $1\times10^{15}$Ω. Accordingly, the time constant of a circuit composed of the transistor 908 and the capacitor 909 is approximately one second. This means that most of the charge stored in the capacitor 909 is lost in approximately one second.

The curve 907 in FIG. 35A denotes the Id-Vg characteristics of the transistor 908. When the channel width is 0.1 μm, the Icut density is approximately 1 yA and the resistivity of the transistor 908 at this time is approximately $1\times10^{24}$Ω. Accordingly, the time constant of the circuit composed of the transistor 908 and the capacitor 909 is approximately $1\times10^9$ seconds (=approximately 31 years). This means that one-third of the charge stored in the capacitor 909 is left after 10 years.

From this, charge can be held for 10 years in a simple circuit composed of a transistor and a capacitor without application of a too high voltage.

Various materials can be used for the electron trap layer 902. For example, an insulating film containing one or more of hafnium oxide (oxygen, hafnium), aluminum oxide (oxygen, aluminum), tantalum oxide (oxygen, tantalum), aluminum silicate (oxygen, silicon, aluminum), and the like can be used. The electron trap layer 902 may contain elements such as nitrogen, silicon, hydrogen, or halogen. The electron trap layer 902 having a multi-layer structure can be formed as follows: a layer containing silicon oxide, silicon oxynitride, silicon nitride oxide, silicon nitride, or the like is formed over, below, or on the both sides of the layer containing the above-described element or at the interface between the layers.

As the semiconductor film 901, it is effective to use a material in which the effective mass of a hole is extremely large or is substantially localized like an intrinsic or substantially intrinsic oxide semiconductor. In this case, the injection of holes from the semiconductor film 901 to the electron trap layer 902 does not occur and consequently a phenomenon in which electrons trapped by the electron trap states 904 bond to holes and disappear does not occur. Thus, the charge retention characteristics can be improved.

The gate electrode 54 illustrated in FIGS. 1A to 1C is formed of a single layer or a stacked layer of a conductive film containing aluminum, titanium, chromium, cobalt, nickel, copper, yttrium, zirconium, molybdenum, ruthenium, silver, tantalum, tungsten, titanium nitride, tantalum nitride, or silicon, for example. When silicon is used, silicon containing an n-type dopant (e.g., phosphorus or arsenic) or a p-type dopant (e.g., boron or aluminum) is used. The gate electrode 54 is formed preferably by sputtering, CVD (including MOCVD, ALD, or PECVD), vacuum evaporation, PLD. To reduce damage to the deposition surface and the deposited film, CVD is preferable, and MOCVD or ALD is more preferable.

Note that the gate electrode 54 may be formed by stacking two layers. In the case of the semiconductor film is formed using silicon, impurities are added in order to control the threshold of the transistor; however, in the case of using ion implantation or the like, the film is damaged by adding impurities to decrease the characteristics. In the case of using an oxide semiconductor film as the semiconductor film, it is difficult to control the threshold by impurities. The threshold control by the work function of the gate electrode is thus desirable. In the case of stacking two layers as the gate electrode, an electrode material capable of controlling the threshold is selected for the lower layer which is in contact with the gate insulating film As the upper layer, a film with low resistance, good processability, and good coverage may be used. An example of stacking two layers as the gate electrode will be described as Transistor structure 2 of FIGS. 33A to 33C.

An insulating film containing silicon oxide, silicon oxynitride, silicon nitride, aluminum oxide, germanium oxide, yttrium oxide, zirconium oxide, lanthanum oxide, neodymium oxide, hafnium oxide, or tantalum nitride, for example, can be used as the protective insulating film 68. Alternatively, an insulating film containing a low-k material such as silicon oxide to which carbon is added (SiOC), silicon oxide to which hydrocarbon is added (SiOCH), silicon oxide to which fluorine is added (SiOF), hydrogen silsesquioxane (HSQ), boron phosphorus silicate glass (BPSG), or phosphorus silicate glass (PSG) can be used. In addition, a Si-rich oxide (SRO) film can be used. The content of silicon in SRO is greater than that of general $SiO_2$ in the stoichiometric composition, and SRO contains a silicon atom with dangling bond; thus, SRO is effective in trapping impurities such as a fluorine atom to prevent diffusion of the impurities. Note that the protective insulating film 68 may be formed by stacking a plurality of insulating films formed of these materials. The thickness of the protective insulating film 68 is, for example, greater than or equal to 20 nm and less than or equal to 1000 nm, preferably greater than or equal to 50 nm and less than or equal to 1000 nm, further preferably greater than or equal to 100 nm and less than or equal to 1000 nm, still further preferably greater than or equal to 200 nm and less than or equal to 1000 nm.

The wirings 67a and 67b may be formed using, for example, a single layer or a stacked layer of a conductive film containing aluminum, titanium, chromium, cobalt, nickel, copper, yttrium, zirconium, molybdenum, ruthenium, silver, tantalum, tungsten, titanium nitride, or tantalum nitride.

There is no particular limitation on the substrate 50. For example, a glass substrate, a ceramic substrate, a quartz substrate, or a sapphire substrate may be used as the substrate 50. Alternatively, a single crystal semiconductor substrate or a polycrystalline semiconductor substrate made of silicon, silicon carbide, germanium or the like, a compound semiconductor substrate made of silicon germanium or the like, a silicon-on-insulator (SOI) substrate, or the like may be used. Still alternatively, any of these substrates provided with a semiconductor element may be used as the substrate 50.

A flexible substrate may alternatively be used as the substrate 50. Note that as a method for forming a transistor over a flexible substrate, there is another method in which, after a transistor is formed over a non-flexible substrate, the transistor is separated from the non-flexible substrate and transferred to the substrate 50 which is a flexible substrate. In that case, a separation layer is preferably provided between the non-flexible substrate and the transistor.

Figure 2A:
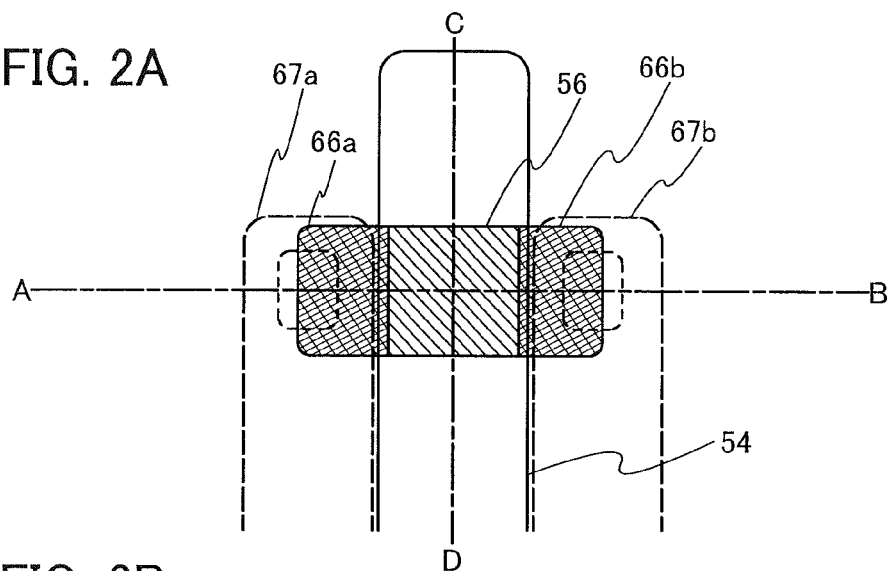
FIGS. 2A to 2C are cross-sectional views illustrating an example of a transistor of one embodiment of the present invention.
Figure 2B:
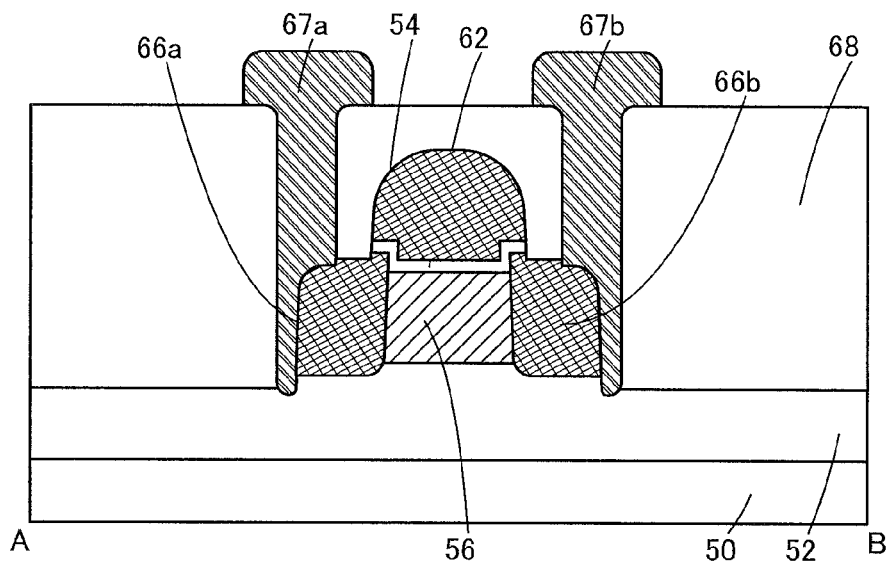
Figure 2C:
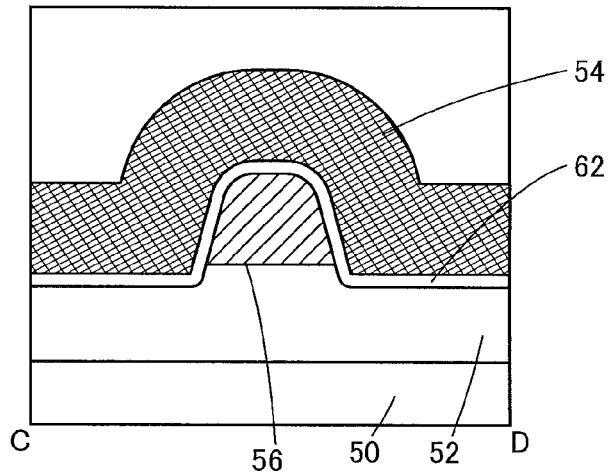

Note that in the transistor in FIGS. 1A to 1C, the edges of the electrode, the semiconductor film, and the like may be rounded as shown in FIGS. 2A to 2C.

Note that a manufacturing method of a transistor in FIGS. 3A to 3D that will be described later is referred to for a manufacturing method of the transistor in FIGS. 1A to 1C.
<Transistor Structure 2>

As an example of a transistor structure and a manufacturing method of the transistor according to one embodiment of the present invention, a structure in which an oxide semiconductor film is used as a semiconductor film in Transistor structure 1 is described.

FIGS. 3A to 3C are a top view and cross-sectional views of the transistor. FIG. 3A is a top view of the transistor. FIG. 3B is the cross-sectional view taken along dashed-dotted line A-B in FIG. 3A. FIG. 3C is the cross-sectional view taken along dashed-dotted line C-D in FIG. 3A.

In FIG. 3B, the transistor includes an insulating film 102 over a substrate 100, an oxide semiconductor film 106 over the insulating film 102, a gate insulating film 112 over the oxide semiconductor film 106, a gate electrode 104 over the gate insulating film 112, and a source electrode 116a and a drain electrode 116b which are in contact with side surfaces of the oxide semiconductor film 106. Note that the transistor preferably includes a protective insulating film 118 over the gate electrode 104 and the source and drain electrodes 116a and 116b, and wirings 117a and 117b over the protective insulating film 118. The gate insulating film 118 includes openings reaching the source electrode 116a and the drain electrode 116b. The wiring 117a and the wiring 117b are in contact with the source electrode 116a and the drain electrode 116b, respectively, through the openings. Note that the transistor does not necessarily include the insulating film 102 in some cases.

A structure of the oxide semiconductor film 106 is described below.

The oxide semiconductor film 106 is an oxide containing indium. An oxide containing indium can have a high carrier mobility (electron mobility), for example. The oxide semiconductor film 106 preferably contains an element M. The element M is aluminum, gallium, yttrium, or tin, for example. The element M is an element having a high bonding energy with oxygen, for example. The element M is an element that can increase the energy gap of the oxide, for example. Further, the oxide semiconductor film 106 preferably contains zinc. In the case where an oxide contains zinc, the oxide is likely to be crystallized. The energy at the top of the valence band of an oxide can be controlled with the atomic ratio of zinc.

Note that the oxide semiconductor film 106 is not limited to the oxide containing indium. The oxide semiconductor film 106 may be, for example, a Zn—Sn oxide or a Ga—Sn oxide.

As the oxide semiconductor film 106, an oxide with a wide energy gap is used. For example, the energy gap of the oxide semiconductor film 106 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

In the case where the oxide semiconductor film 106 is formed by a sputtering method, a target containing indium is preferably used in order to reduce the number of particles. In addition, if an oxide target having a high atomic ratio of the element M is used, the conductivity of the target may be decreased. Particularly in the case where a target containing indium is used, the conductivity of the target can be increased and DC discharge or AC discharge is facilitated; thus, deposition over a large substrate can be easily performed. Thus, semiconductor devices can be manufactured with improved productivity.

In the case where the oxide semiconductor film 106 is formed by a sputtering method, the atomic ratio of In to M and Zn contained in the target may be 3:1:1, 3:1:2, 3:1:4, 1:1:0.5, 1:1:1, 1:4:4, or the like.

In the case where the oxide semiconductor film 106 is formed by a sputtering method, a film having an atomic ratio deviated from the atomic ratio of the target is formed in some cases. Especially for zinc, the atomic ratio of zinc in a deposited film is smaller than the atomic ratio of the target in some cases. Specifically, the film has an atomic ratio of zinc of 40 atomic % to 90 atomic % of the atomic ratio of zinc in the target. The target used for the sputtering is preferably polycrystalline.

The oxide semiconductor film 106 in FIGS. 3A to 3D may be a single layer or a three-layered structure as in FIG. 3D in which an oxide semiconductor film 106a is sandwiched between a first oxide semiconductor film 106b and a second oxide semiconductor film 106c. One of the first oxide semiconductor film 106b and the second oxide semiconductor film 106c is not necessarily provided. Note that the second oxide semiconductor film 106c is provided closer to the gate electrode 104 than the first oxide semiconductor film 106b is.

The first oxide semiconductor film 106b and the second oxide semiconductor film 106c each contain one or more elements that are not oxygen and are contained in the oxide semiconductor film 106a. Since the first oxide semiconductor film 106b and the second oxide semiconductor film 106c contain one or more elements that are not oxygen and are contained in the oxide semiconductor film 106a, an interface state is unlikely to be formed at the interface between the oxide semiconductor film 106a and the first and second oxide semiconductor films 106b and 106c.

In the case of using an In-M-Zn oxide as the first oxide semiconductor film 106b, when summation of In and M is assumed to be 100 atomic %, the proportions of In and M are preferably set to less than 50 atomic % and greater than or equal to 50 atomic %, respectively, and more preferably less than 25 atomic % and greater than or equal to 75 atomic %, respectively. In the case of using an In-M-Zn oxide as the oxide semiconductor film 103a, when summation of In and M is assumed to be 100 atomic %, the proportions of In and M are preferably set to greater than or equal to 25 atomic % and less than 75 atomic %, respectively, and more preferably greater than or equal to 34 atomic % and less than 66 atomic %, respectively. In the case of using an In-M-Zn oxide as the second oxide semiconductor film 106c, when summation of In and M is assumed to be 100 atomic %, the proportions of In and M are preferably set to less than 50 atomic % and greater than or equal to 50 atomic %, respectively, and more preferably less than 25 atomic % and greater than or equal to 75 atomic %, respectively. Note that the second oxide semiconductor film 106c may be formed using the same kind of oxide as that of the first oxide semiconductor film 106b.

Here, in some cases, there is a mixed region of the first oxide semiconductor film 106b and the oxide semiconductor film 106a between the first oxide semiconductor film 106b and the oxide semiconductor film 106a. Further, in some cases, there is a mixed region of the oxide semiconductor film 106a and the second oxide semiconductor film 106c between the oxide semiconductor film 106a and the second oxide semiconductor film 106c. The mixed region has a low density of interface states. For that reason, the stack including the first oxide semiconductor film 106b, the oxide semiconductor film 106a, and the second oxide semiconductor film 106c has a band structure where energy at each interface is changed continuously (continuous junction).

As the oxide semiconductor film 106a, an oxide having an electron affinity higher than that of the first oxide semiconductor film 106b and the second oxide semiconductor film 106c is used. For example, as the oxide semiconductor film 106a, an oxide having an electron affinity higher than that of the first oxide semiconductor film 106b and the second oxide semiconductor film 106c by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that electron affinity is an energy gap between the vacuum level and the bottom of the conduction band.

In that case, when an electric field is applied to the gate electrode 104, a channel is formed in the oxide semiconductor film 106a having an electron affinity higher than those of the first oxide semiconductor film 106b and the second oxide semiconductor film 106c.

To increase the on-state current of the transistor, the thickness of the second oxide semiconductor film 106c is preferably as small as possible. The thickness of the second oxide semiconductor film 106c is set to less than 10 nm, preferably less than or equal to 5 nm, more preferably less than or equal to 3 nm, for example. Meanwhile, the second oxide semiconductor film 106c has a function of blocking elements other than oxygen (such as silicon) contained in the gate insulating film 112 from entering the oxide semiconductor film 106a where a channel is formed. For this reason, the second oxide semiconductor film 106c preferably has a certain degree of thickness. The thickness of the second oxide semiconductor film 106c is set to greater than 0.3 nm, preferably greater than or equal to 1 nm, more preferably greater than or equal to 2 nm, for example.

To increase reliability, the first oxide semiconductor film 106b is preferably formed thick and the oxide semiconductor film 106a and the second oxide semiconductor film 106c are preferably thinned thin Specifically, the thickness of the first oxide semiconductor film 106b is greater than or equal to 5 nm, preferably greater than or equal to 10 nm, more preferably greater than or equal to 20 nm, still more preferably greater than or equal to 40 nm. In that case, the distance from the interface between the insulating film 102 and the first oxide semiconductor film 106b to the oxide semiconductor film 106a where a channel is formed can be greater than or equal to 5 nm, preferably greater than or equal to 10 nm, more preferably greater than or equal to 20 nm, still more preferably greater than or equal to 40 nm. To prevent the productivity of the semiconductor device from being lowered, the thickness of the first oxide semiconductor film 106b is less than or equal to 200 nm, preferably less than or equal to 120 nm, more preferably less than or equal to 80 nm. The thickness of the oxide semiconductor film 106a is greater than or equal to 3 nm and less than or equal to 100 nm, preferably greater than or equal to 3 nm and less than or equal to 40 nm, more preferably greater than or equal to 3 nm and less than or equal to 20 nm.

For example, the first oxide semiconductor film 106b may be thicker than the oxide semiconductor film 106a, and the oxide semiconductor film 106a may be thicker than the second oxide semiconductor film.

The influence of impurities in the oxide semiconductor film 106a is described below. In order that the transistor have stable electrical characteristics, it is effective to reduce the concentration of impurities in the oxide semiconductor film 103 so that the oxide semiconductor film 106a has a lower carrier density and is highly purified. The carrier density of the oxide semiconductor film 106a is set to lower than $1\times10^{17}/cm^3$, lower than $1\times10^{15}/cm^3$, or lower than $1\times10^{13}/cm^3$. In order to reduce the concentration of impurities in the oxide semiconductor film 106a, the concentration of impurities in a film that is adjacent to the oxide semiconductor film 106a is also preferably reduced.

Silicon contained in the oxide semiconductor film 106a might serve as a carrier trap or a carrier generation source. The concentration of silicon in a region between the oxide semiconductor film 106a and the first oxide semiconductor film 106b, which is measured by secondary ion mass spectrometry (SIMS), is preferably lower than $1\times10^{19}$ atoms/$cm^3$, more preferably lower than $5\times10^{18}$ atoms/$cm^3$, still more preferably lower than $2\times10^{18}$ atoms/$cm^3$. The concentration of silicon in a region between the oxide semiconductor film 106a and the second oxide semiconductor film 106c, which is measured by SIMS, is lower than $1\times10^{19}$ atoms/$cm^3$, preferably lower than $5\times10^{18}$ atoms/$cm^3$, more preferably lower than $2\times10^{18}$ atoms/$cm^3$.

When hydrogen is contained in the oxide semiconductor film 106a, carrier density might be increased. The concentration of hydrogen in the oxide semiconductor film 106a measured by SIMS is lower than or equal to $2\times10^{20}$ atoms/$cm^3$, preferably lower than or equal to $5\times10^{19}$ atoms/$cm^3$, more preferably lower than or equal to $1\times10^{19}$ atoms/$cm^3$, still more preferably lower than or equal to $5\times10^{18}$ atoms/$cm^3$. When nitrogen is contained in the oxide semiconductor film 106a, carrier density might be increased. The concentration of nitrogen in the oxide semiconductor film 106a measured by SIMS is lower than $5\times10^{19}$ atoms/$cm^3$, preferably lower than or equal to $5\times10^{18}$ atoms/$cm^3$, more preferably lower than or equal to $1\times10^{18}$ atoms/$cm^3$, still more preferably lower than or equal to $5\times10^{17}$ atoms/$cm^3$.

It is preferable to reduce the concentration of hydrogen in the first oxide semiconductor film 106b and the second oxide semiconductor film 106c in order to reduce the concentration of hydrogen in the oxide semiconductor film 106a. The concentration of hydrogen in the first oxide semiconductor film 106b and the second oxide semiconductor film 106c measured by SIMS can be lower than or equal to $2\times10^{20}$ atoms/$cm^3$, preferably lower than or equal to $5\times10^{19}$ atoms/$cm^3$, more preferably lower than or equal to $1\times10^{19}$ atoms/$cm^3$, still more preferably lower than or equal to $5\times10^{18}$ atoms/$cm^3$. Further, it is preferable to reduce the concentration of nitrogen in the first oxide semiconductor film 106b and the second oxide semiconductor film 106c in order to reduce the concentration of nitrogen in the oxide semiconductor film 106a. The concentration of nitrogen in the first oxide semiconductor film measured by SIMS is lower than $5\times10^{19}$ atoms/$cm^3$, preferably lower than or equal to $5\times10^{18}$ atoms/$cm^3$, more preferably lower than or equal to $1\times10^{18}$ atoms/$cm^3$, still more preferably lower than or equal to $5\times10^{17}$ atoms/$cm^3$.

Here, a structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

From the TEM image of the CAAC-OS film observed in the direction substantially parallel to a sample surface (cross-sectional TEM image), metal atoms are arranged in a layered manner in the crystal parts. The shape of the metal atom layer reflects a surface over which the CAAC-OS film is formed (hereinafter, a surface over which the CAAC-OS film is formed is referred to as a formation surface) or the top surface of the CAAC-OS film, and is arranged parallel to the formation surface or the top surface of the CAAC-OS film.

On the other hand, as seen from the TEM image of the CAAC-OS film observed in the direction substantially perpendicular to the sample surface (plane TEM image), metal atoms are arranged in a triangular or hexagonal configuration in the crystal parts. However, there is no regularity of arrangement of metal atoms between different crystal parts.

From the results of the cross-sectional TEM image and the plane TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5$\mu\mu^2$ or more, or 1000$\mu\mu^2$ or more is observed in some cases in the plane TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in the direction substantially perpendicular to the formation surface or the top surface of the CAAC-OS film.

On the other hand, when the CAAC-OS film is analyzed by an in-plane method in which an X-ray enters a sample in the direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

From the above results, in the CAAC-OS film having c-axis alignment, while the directions of a-axes and b-axes are different between crystal parts, the c-axes are aligned in the direction parallel to a normal vector of the formation surface or a normal vector of the top surface of the CAAC-OS film. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in the direction parallel to a normal vector of the formation surface or a normal vector of the top surface of the CAAC-OS film Thus, for example, in the case where a shape of the CAAC-OS film is changed by etching or the like, the c-axis of the crystal might not be necessarily parallel to a normal vector of the formation surface or a normal vector of the top surface of the CAAC-OS film Further, the degree of crystallinity in the CAAC-OS film is not necessarily uniform. For example, in the case where crystal growth leading to the CAAC-OS film occurs from the vicinity of the top surface of the film, the proportion of the c-axis aligned crystal parts in the vicinity of the top surface is higher than that in the vicinity of the formation surface in some cases. Further, when impurities are added to the CAAC-OS film, a region to which the impurities are added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 20 appear at around 31° and a peak of 2θ not appear at around 36°.

The CAAC-OS film is an oxide semiconductor film having a low impurity concentration. The impurity is an element other than the main components of the oxide semiconductor film, such as hydrogen, carbon, silicon, and a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, heavy metals such as iron and nickel, argon, carbon dioxide, and the like each have a large atomic radius (molecular radius), and thus disturb the atomic arrangement of the oxide semiconductor film and causes a decrease in crystallinity when any of them is contained in the oxide semiconductor film. Note that the impurity contained in the oxide semiconductor film might serve as a carrier trap or a carrier generation source.

Further, the CAAC-OS film is an oxide semiconductor film having a low density of defect states. For example, oxygen vacancies in the oxide semiconductor film serve as carrier traps or serve as carrier generation sources in some cases when hydrogen is captured therein.

The state in which the impurity concentration is low and the density of defect states is low (the number of oxygen vacancies is small) is referred to as a highly purified intrinsic state or a substantially highly purified intrinsic state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has small variations in electrical characteristics and high reliability. Electrical charge trapped by the carrier traps in the oxide semiconductor film takes a long time to be released, and might behave like fixed electrical charge. Thus, a transistor including an oxide semiconductor film having a high impurity concentration and a high density of defect states has unstable electrical characteristics in some cases.

In a transistor using the CAAC-OS film, change in electrical characteristics due to irradiation with visible light or ultraviolet light is small.

Next, a microcrystalline oxide semiconductor film is described.

In an image obtained with TEM, crystal parts cannot be found clearly in the microcrystalline oxide semiconductor film in some cases. In most cases, the size of a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm or a size greater than or equal to 1 nm and less than or equal to 3 nm is specifically referred to as nanocrystal (nc). An oxide semiconductor film including a nanocrystal is referred to as a nanocrystalline oxide semiconductor (nc-OS) film. In an image obtained with TEM, a crystal grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than a crystal part, a peak that shows a crystal plane does not appear. Further, a halo-like pattern is shown in a selected-area electron diffraction pattern of the nc-OS film that is obtained by using an electron beam having a probe diameter (e.g., larger than or equal to 50 nm) larger than the diameter of a crystal part. Meanwhile, spots are shown in a nanobeam electron diffraction pattern of the nc-OS film that is obtained by using an electron beam having a probe diameter (e.g., larger than or equal to 1 nm and smaller than or equal to 30 nm) close to, or smaller than or equal to the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film having more regularity than the amorphous oxide semiconductor film; thus, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stack including two or more films of an amorphous oxide semiconductor film, a microcrystalline oxide semiconductor film, and a CAAC-OS film.

The description of the insulating film 52 is referred to for the insulating film 102 in FIGS. 3A to 3D. The description of the source electrode 66a and the drain electrode 66b is referred to for the source electrode 116a and the drain electrode 116b. The description of the gate insulating film 62 is referred to for the gate insulating film 112. The description of the gate electrode 54 is referred to for the gate electrode 104. The description of the protective insulating film 68 is referred to for the protective insulating film 118. The description of the wirings 67a and 67b is referred to for the wirings 117a and 117b. The description of the substrate 50 is referred to for the substrate 100.

Note that in the transistor in FIGS. 3A to 3C, the edges of the electrode, the semiconductor film, and the like may be rounded.

An manufacturing method of Transistor Structure 2 is described below.

FIGS. 4A to 4C, FIGS. 5A and 5B, FIGS. 6A and 6B, FIGS. 7A to 7C, and FIGS. 8A and 8B are cross-sectional views corresponding to those in FIGS. 3A and 3B.

First, the substrate 100 is prepared.

Next, the insulating film 102 is deposited. The insulating film 102 may be formed using an insulating film selected from the insulating films described as examples of the insulating film 102. The insulating film 102 can be deposited by a sputtering method, a chemical vapor deposition (CVD) method, a molecular beam epitaxy (MBE) method, an atomic layer deposition (ALD) method, or a pulsed laser deposition (PLD) method.

Then, in order to planarize the surface of the insulating film 102, chemical mechanical polishing (CMP) treatment may be performed. By CMP treatment, the insulating film 102 has an average surface roughness ($R_a$) of less than 1 nm, preferably less than or equal to 0.3 nm, more preferably less than or equal to 0.1 nm. In some cases, $R_a$ that is less than or equal to 1 nm can increase the crystallinity of the oxide semiconductor film 136. $R_a$ can be measured using an atomic force microscope (AFM).

Then, oxygen ions may be added into the insulating film 102 so that an insulating film containing excess oxygen can be formed. The addition of oxygen may be performed by an ion implantation method at an acceleration voltage of higher than or equal to 2 kV and lower than or equal to 100 kV and at a concentration of greater than or equal to $5\times10^{14}$ ions/$cm^2$ and less than or equal to $5\times10^{16}$ ions/$cm^2$, for example.

Next, the oxide semiconductor film 136 is formed. The oxide semiconductor film 136 can be formed any of the oxide semiconductor films which can be used as the oxide semiconductor film 106, by a sputtering method, a CVD method (including an MOCVD method, an ALD method, or a PECVD method), a vacuum deposition method, or a PLD method. To reduce damage to the deposition surface and the deposited film, CVD is preferable, and MOCVD or ALD is more preferable. A film with a uniform thickness can be formed by ALD.

Then, a hard mask 121 is deposited over the oxide semiconductor film 136. A tungsten film, a titanium nitride film, or the like can be used for the hard mask 121. Then, a layer to be a resist mask 122 is deposited over the hard mask 121.

The layer serving as the resist mask 122 may be formed using a photosensitive organic layer or inorganic layer. The layer serving as the resist mask 122 may be formed by a spin coating method or the like.

Next, the layer to be the resist mask 122 is irradiated with light through a photomask. As such light, KrF excimer laser light, ArF excimer laser light, extreme ultraviolet (EUV) light, or the like may be used. Alternatively, a liquid immersion technique may be employed in which a portion between a substrate and a projection lens is filled with liquid (e.g., water) to perform light exposure. The layer to be the resist mask 122 may be irradiated with an electron beam or an ion beam instead of the above light. Note that a photomask is not necessary in the case of using an electron beam or an ion beam. In the case where fine processing is not particularly required, the layer to be the resist mask 122 may be irradiated with a g-line, an i-line, or the like of a high pressure mercury lamp.

Figures 4A, 4B, 4C:
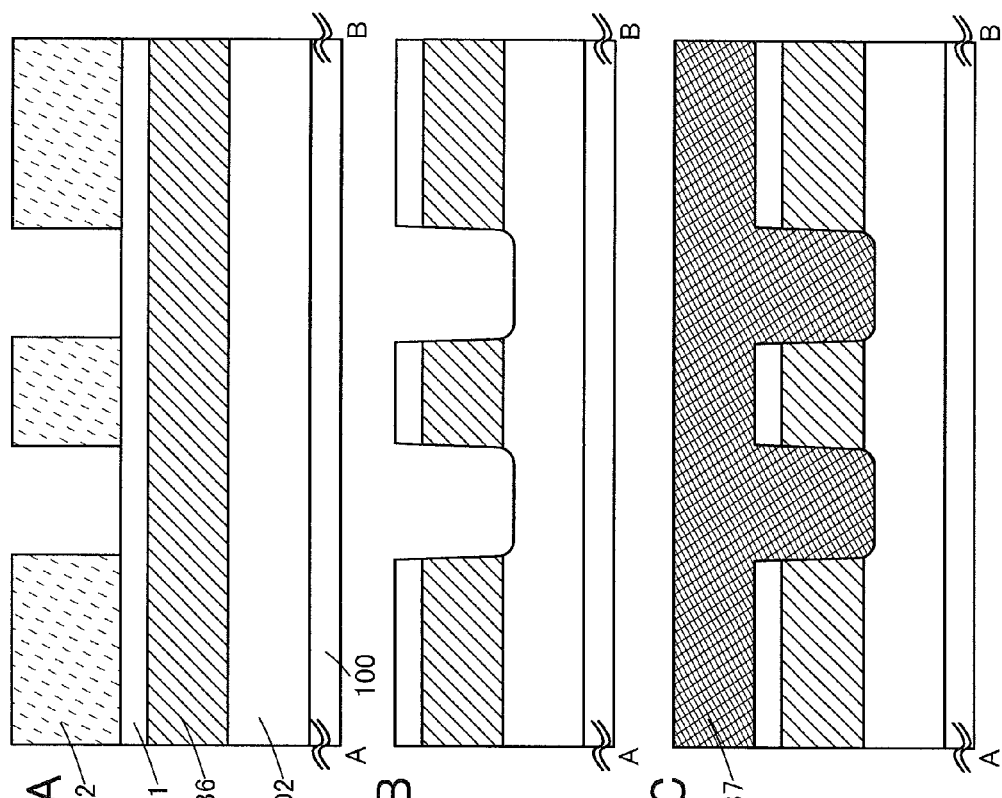
FIGS. 4A to 4C are cross-sectional views illustrating an examples of a method for manufacturing a semiconductor device of one embodiment of the present invention.

Then, the substrate 100 is immersed in a developer to remove/leave a region of the layer to be the resist mask 122 that has been exposed to light, so that the resist mask 122 is formed (see FIGS. 4A).

Next, the hard mask 121 and part of the oxide semiconductor film 136 are etched using the resist mask 122 to form openings in the hard mask 121 and part of the oxide semiconductor film 136. Dry etching is preferably employed to etch the hard mask 121. Note that when minute processing is not required, processing may be performed only with the resist mask without using the hard mask.

Dry etching treatment is preferably employed as a method for etching part of the oxide semiconductor film 136. The dry etching treatment may be performed in an atmosphere containing methane and a rare gas.

Next, the resist mask 122 is removed (see FIG. 4B). The resist mask 122 may be removed by plasma treatment, chemical liquid treatment, or the like. Preferably, the resist mask 122 is removed by plasma ashing.

A conductive film 137 is formed in the openings of the oxide semiconductor film 136 and the hard mask 121 and over the hard mask 121 (see FIG. 4C). The conductive film 137 can be formed using any of the conductive films which can be used as the source electrode 116a and the drain electrode 116b. When the openings are tapered, the conductive film can be easily deposited in the opening in some cases. The conductive film 137 is formed preferably by sputtering, CVD (including MOCVD, ALD, or PECVD), vacuum evaporation, PLD. To reduce damage to the deposition surface and the deposited film, CVD is preferable, and MOCVD or ALD is more preferable. To adequately cover an underlying component, CVD is preferable and MOCVD or ALD is more preferable. CVD is favorable for film formation even in the opening with a high aspect ratio. ALD is favorable for improving adhesive of the conductive film or the like.

For example, a conductive film 140 may be formed between the conductive film 137 and the oxide semiconductor film 136 and the hard mask 121 as illustrated in FIG. 31A to increase their adhesive. For example, a titanium nitride film is formed as the conductive film 140 by ALD to increase the adhesive, and then, a tungsten film is formed as the conductive film 137 by MOCVD. In this case, the source electrode 116a and the drain electrode 116b in the transistor can be formed as illustrate in FIG. 31B.

The oxide semiconductor film 136 may have a low-resistance region on the surface that is in contact with the conductive film. The low-resistance region can be formed in such a manner that the openings are formed in the oxide semiconductor film 136 and the hard mask 121 as illustrated in FIG. 4B, and then, impurities are added to the surface of the oxide semiconductor film 136. The addition of the impurities may be performed by an ion implantation method or an ion doping method, for example.

After forming openings in the oxide semiconductor film 136, a conductive film is formed by sputtering or the like in the openings in the oxide semiconductor film 136. Thus, a low-resistance region can sometimes be formed in the vicinity of the surface of the oxide semiconductor film 136 that is in contact with the conductive film. The "vicinity of the surface" is preferably a region whose depth from the surface is 1 nm to 10 nm, inclusive, for example. Here, argon or the like is preferably used as deposition gas. For example, when a conductive film is formed over the oxide semiconductor film 136 by sputtering, oxygen vacancy may be formed in the vicinity of the surface of the oxide semiconductor film 136. Hydrogen enters the oxygen vacancy to form donor levels and generate carriers; thus, a low-resistance region can be formed. Oxygen vacancy is likely to be generated by, for example, injection of argon ions in deposition of a conductive film or reaction of the conductive film and oxygen contained in the oxide semiconductor film. The conductive film is preferably formed of a material which can be used for the conductive film 137, more preferably formed of tungsten or titanium. After the conductive film is formed by sputtering, the conductive films 140 and 137 may be stacked over the conductive film to form a three-layered conductive film Next, the conductive film 137 is partly removed by polishing treatment to leave the conductive film 137 embedded in the openings in the oxide semiconductor film 136 and the hard mask 121 (see FIG. 5A). To remove the conductive film 137, chemical mechanical polishing (CMP) treatment or the like can be performed. Thus, a conductive pillar can be formed in the openings. Note that the hard mask 121 can sometimes be partly removed by the polishing treatment.

FIG. 4C is a cross-sectional view illustrating the state before the polishing treatment. When the surface is uneven, the film on a projection is preferentially polished by the polishing treatment and a polishing residue can sometimes be left in a depression. Thus, the conductive film to be removed is preferably over a planar surface or a projection. FIG. 4C illustrates a preferred state in which the surface is flat with little projection and depression.

The oxide semiconductor film 136 is to be the oxide semiconductor film 106. The conductive film 137 is a film to be the source electrode 116a and the drain electrode 116b. The conductive film 137 is embedded in the openings of the oxide semiconductor film 136, and consequently faces of the oxide semiconductor film 106 that are in contact with the source and drain electrodes 116a and 116b can be obtained.

Next, the resist mask 123 is formed (see FIG. 5B). The formation method of the resist mask 122 is referred to for the resist mask 123.

Subsequently, the oxide semiconductor film 136, the hard mask 121, and the conductive film 137 are partly etched using the resist mask 123 to form the island-shaped oxide semiconductor film 106 and the island-shaped source and drain electrodes 116a and 116b. Then, the resist mask 123 is removed (see FIGS. 6A and 6B). FIG. 6B is a three-dimensional image. In FIG. 6B, rounded corners of the electrodes, the semiconductor film, and the like are not illustrated. As in FIG. 6B, the oxide semiconductor film 106 and the source and drain electrodes 116a and 116b are processed into an island shape, and side surfaces of the oxide semiconductor film 106 and the source and drain electrodes 116a and 116b on one side are continuously connected. Top edges of the side surfaces may be continuously connected. At least one side of the oxide semiconductor film 106 may be in contact with at least one side of the source electrode 116a or the drain electrode 116b. Moreover, the source and drain electrodes 116a and 116b are processed into a columnar shape as in FIG. 6B. Here, a columnar shape includes a shape in which the area of a bottom surface is smaller or larger than that of a top surface, and a shape with a rounded bottom or top surface. Note that the oxide semiconductor film 106 and the source and drain electrodes 116a and 116b in FIGS. 6A and 6B can be replaced with the semiconductor film 56 and the source and drain electrodes 66a and 66b in Transistor structure 1.

Dry etching is preferably used for etching the oxide semiconductor film 136, the hard mask 121, and the conductive film 137. For example, using dry etching, the hard mask 121 and the oxide semiconductor film 136 are etched first, and then the conductive film 137 is etched.

The oxide semiconductor film 136, the hard mask 121, and the conductive film 137 may be etched at the same time. Alternatively, the conductive film 137 may be etched first, and then, the hard mask 121 and the oxide semiconductor film 136 are etched. The description of the resist mask 122 is referred to for removal of the resist mask 123.

The contact faces of the oxide semiconductor film 106 and the source and drain electrodes 116a and 116b are formed first, and then, the source and drain electrodes 116a and 116b and the oxide semiconductor film 106 are processed. The source electrode 116a, the drain electrode 116b, and the oxide semiconductor film 106 can be processed using the same mask and thus can be integrated as shown in FIGS. 6A and 6B. When the semiconductor film and the electrodes are processed using different masks, it is necessary to provide a margin of the layout in consideration of misalignment of the semiconductor film and the electrodes. On the other hand, when they are processed using the same mask, the margin can be smaller, which is favorable for miniaturization.

In the transistor structure of FIGS. 3A to 3D, in fabricating a transistor with a small channel length and a small channel width, when an electrode, a semiconductor film, or the like is processed while a resist mask is reduced in size, the electrode, the semiconductor film, or the like has a round end portion (curved surface) in some cases. With this structure, the coverage with the gate insulating film 62, the gate electrode 54, and the protective insulating film 68, which are to be formed over the semiconductor film 56, can be improved. Furthermore, concentration of electric field can be relaxed. By miniaturization of the transistor, a high degree of integration and a high density can be achieved.

The hard mask 121 is removed (see FIG. 7A). For example, when a tungsten film is used as a film serving as the hard mask 121, the tungsten film is etched by dry etching. In this case, a fluorocarbon-based gas such as $CF_4$, a chlorine-based gas such as $Cl_2$, a mixed gas containing any of these gases and oxygen, or the like can be used in the etching.

Then, an insulating film 138 and a conductive film 139 are deposited (see FIG. 7B). The insulating film 138 may be formed using any of the oxide semiconductor films given as examples of the insulating film 112. The conductive film 139 is formed preferably by sputtering, CVD (including MOCVD, ALD, or PECVD), vacuum evaporation, PLD. To reduce damage to the deposition surface and the deposited film, CVD is preferable, and MOCVD or ALD is more preferable.

The conductive film 139 may be formed using any of the oxide semiconductor films given as examples of the gate electrode 104. The conductive film 139 is formed preferably by sputtering, CVD (including MOCVD, ALD, or PECVD), vacuum evaporation, PLD. To reduce damage to the deposition surface and the deposited film, CVD is preferable, and MOCVD or ALD is more preferable.

Next, the conductive film 139 is processed by a photolithography method or the like, so that the gate electrode 104 is formed. The insulating film 138 is etched using the gate electrode 104 as a mask to form the gate insulating film 112 (see FIG. 7C). Although the case is described here in which the insulating film 138 is etched using the gate electrode 104 as a mask, one embodiment of the present invention is not limited to this method. For example, the insulating film 138 may be etched using the resist mask used to form the gate electrode 104 by etching.

Figure 33A:
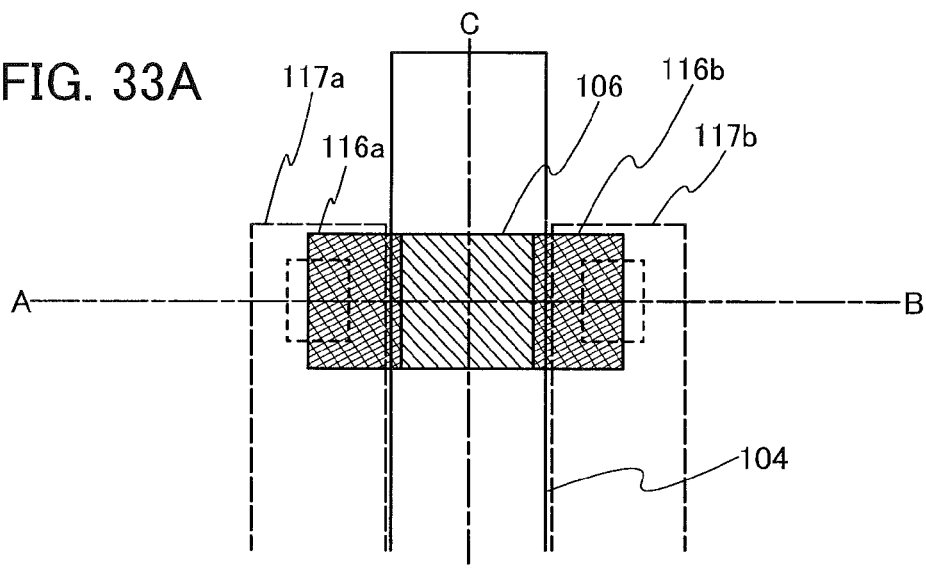
FIGS. 33A to 33C are cross-sectional views illustrating an example of a transistor of one embodiment of the present invention.
Figure 33B:
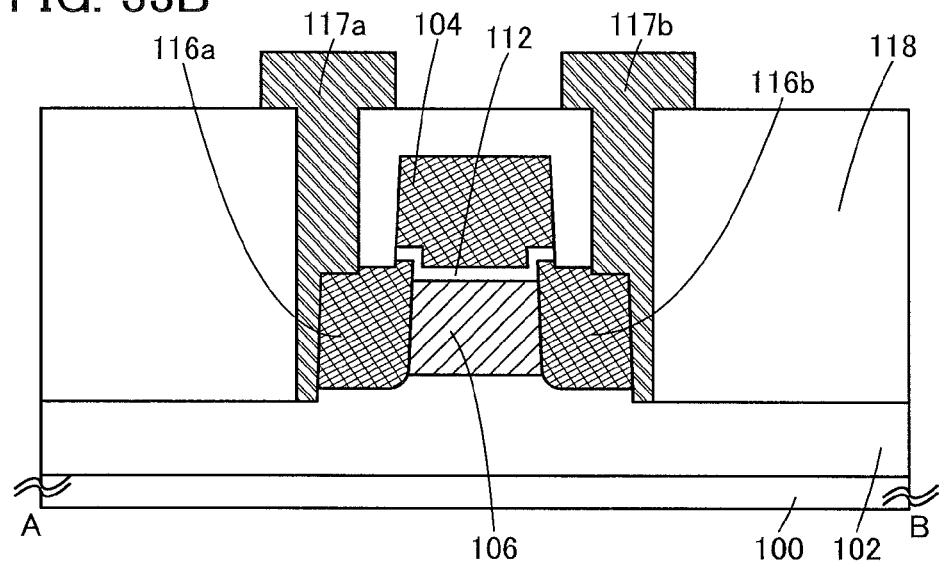
Figure 33C:
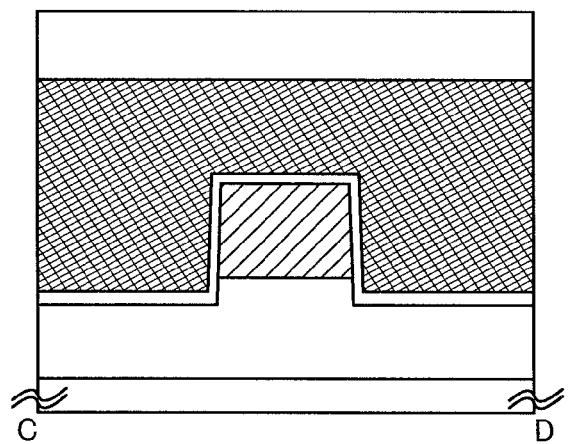

As shown in FIG. 32, the conductive film 139 can be formed by stacking two films so that the top surface of an upper layer is flat, for example. In that case, the transistor structure shown in FIGS. 33A to 33C is obtained. FIG. 33A is the top view of the transistor. FIG. 33B is a cross-sectional view taken along the dashed-dotted line A-B in FIG. 33A. FIG. 33C is a cross-sectional view taken along the dashed-dotted line C-D in FIG. 33A. In the case of the semiconductor film is formed using silicon, impurities are added in order to control the threshold of the transistor; however, in the case of using ion implantation or the like, the film is damaged by adding impurities to decrease the characteristics. In the case of using an oxide semiconductor film as the semiconductor film, it is difficult to control the threshold by impurities. The threshold control by the work function of the gate electrode is thus desirable. In the case of stacking two layers as the gate electrode, an electrode material capable of controlling the threshold is selected for the lower layer which is in contact with the gate insulating film. As the upper layer, a film with low resistance, good processability, and good coverage may be used. When the top surface of the upper layer is flat, variation in line widths of resist patterns for fine photolithography, for example, can be reduced.

Next, the protective insulating film 118 is formed. The insulating film 118 may be formed using any of the oxide semiconductor films given as examples of the insulating film 118. The protective insulating film 118 can be deposited by a sputtering method, a CVD method, an MBE method, an ALD method, or a PLD method. The protective insulating film 118 is formed preferably by sputtering, CVD (including MOCVD, ALD, or PECVD), vacuum evaporation, PLD. To reduce damage to the deposition surface and the deposited film, CVD is preferable, and MOCVD or ALD is more preferable. To adequately cover an underlying component, CVD is preferable and MOCVD or ALD is more preferable. CVD is favorable for film formation even in the opening with a high aspect ratio. Any of these methods may be combined to form the protective insulating film 118. For example, a stacked film containing aluminum oxide and silicon oxynitride may be formed as the protective insulating film 118 as follows: an aluminum oxide film is formed by ALD and then a stacked film of aluminum oxide and silicon oxynitride is formed by sputtering.

Next, openings are formed in the protective insulating film 118 to partly expose the source electrode 116a and the drain electrode 116b (see FIG. 8A).

Next, a conductive film to be the wiring 117a and the wiring 117b is formed. The conductive film can be selected from the conductive films given as examples of a conductive film that can be used for the wirings 117a and 117b. The conductive film is formed preferably by sputtering, CVD (including MOCVD, ALD, or PECVD), vacuum evaporation, PLD. To reduce damage to the deposition surface and the deposited film, CVD is preferable, and MOCVD or ALD is more preferable. To adequately cover an underlying component, CVD is preferable and MOCVD or ALD is more preferable. CVD is favorable for film formation even in the opening with a high aspect ratio.

Then, the conductive film is processed by a photolithography method or the like to form the wirings 117a and 117b (see FIG. 8B).

Through the above steps, the transistor illustrated in FIGS. 2A to 2C can be manufactured.

<MODIFICATION EXAMPLE 1 OF TRANSISTOR STRUCTURE 2>

Figure 11A:
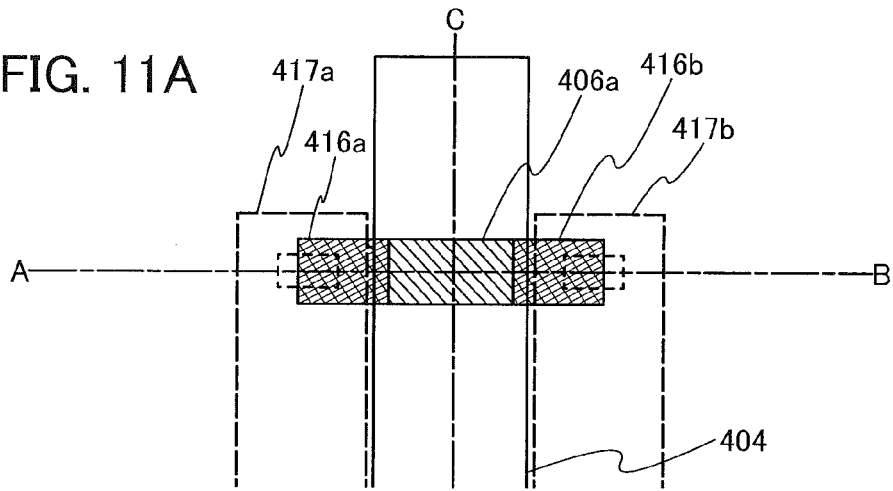
FIGS. 11A to 11C are cross-sectional views illustrating an example of a transistor of one embodiment of the present invention.
Figure 11B:
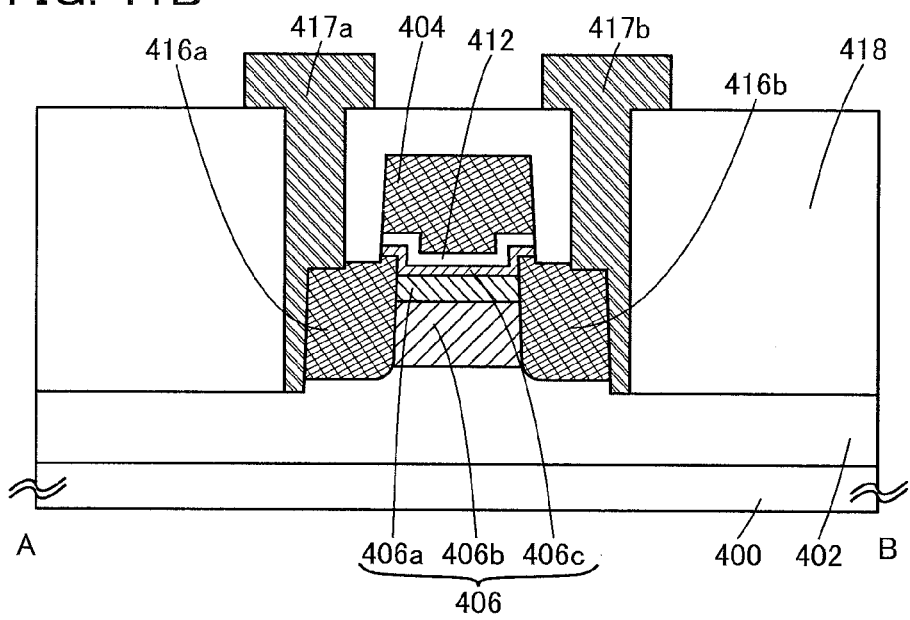
Figure 11C:
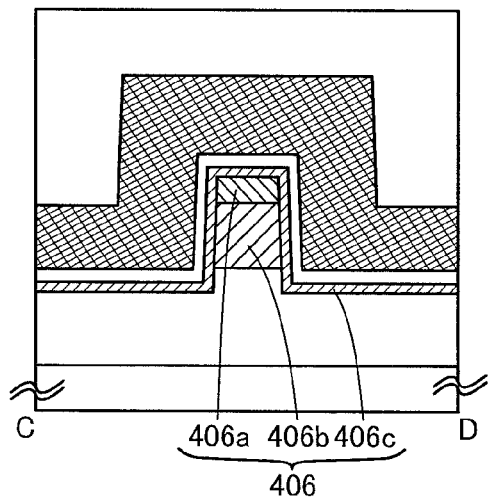

FIGS. 11A to 11C are Modification example 1 of Transistor structure 2. Unlike the transistor in FIGS. 3A to 3C, an oxide semiconductor film of the transistor in FIGS. 11A to 11C is a three-layered film The shape of the three-layered oxide semiconductor film is different from the oxide semiconductor film in FIGS. 3A to 3C. Part of an oxide semiconductor film 406c in FIGS. 11A to 11C is on and in contact with source and drain electrodes 416a and 416b.

FIGS. 11A to 11C are a top view and cross-sectional views of the transistor. FIG. 11A is a top view of the transistor. FIG. 11B is the cross-sectional view taken along dashed-dotted line A-B in FIG. 11A. FIG. 11C is the cross-sectional view taken along dashed-dotted line C-D in FIG. 11A.

The transistor in FIG. 11B includes an insulating film 402 over a substrate 400, an oxide semiconductor film 406b over the insulating film 402, an oxide semiconductor film 406a over the oxide semiconductor film 406b, the source and drain electrodes 416a and 416b in contact with side surfaces of the oxide semiconductor films 406a and 406b, the oxide semiconductor film 406c over the oxide semiconductor film 406a and the source and drain electrodes 416a and 416b, a gate insulating film 412 over the oxide semiconductor film 406c, and a gate electrode 404 over the gate insulating film 412. Note that the transistor preferably includes a protective insulating film 418 over the gate electrode 404 and the source and drain electrodes 416a and 416b, and wirings 417a and 417b over the protective insulating film 418. Furthermore, the protective insulating film 418 includes openings reaching the source electrode 416a and the drain electrode 416b, and the wiring 417a and the wiring 417b are in contact with the source electrode 416a and the drain electrode 416b, respectively, through the openings. Note that the transistor does not necessarily include the base insulating film 402 in some cases.

For the substrate 400, the description of the substrate 100 is referred to. The description of the insulating film 102 can be referred to for the insulating film 402. The description of the source electrode 116a and the drain electrode 116b are referred to for the source electrode 416a and the drain electrode 416b. For the gate insulating film 412, the description of the gate insulating film 112 is referred to. For the gate electrode 404, the description of the gate electrode 104 is referred to. For the protective insulating film 418, the description of the protective insulating film 118 is referred to. For the wirings 417a and 417b, the description of the wirings 117a and 117b is referred to.

The description of the oxide semiconductor film 106 is referred to for the oxide semiconductor films 406a, 406b, and 406c. In the description of the oxide semiconductor film 106, the first oxide semiconductor film 106b and the second oxide semiconductor film 106c can be replaced with the oxide semiconductor film 406b and the oxide semiconductor film 406c, respectively.

Figure 12A:
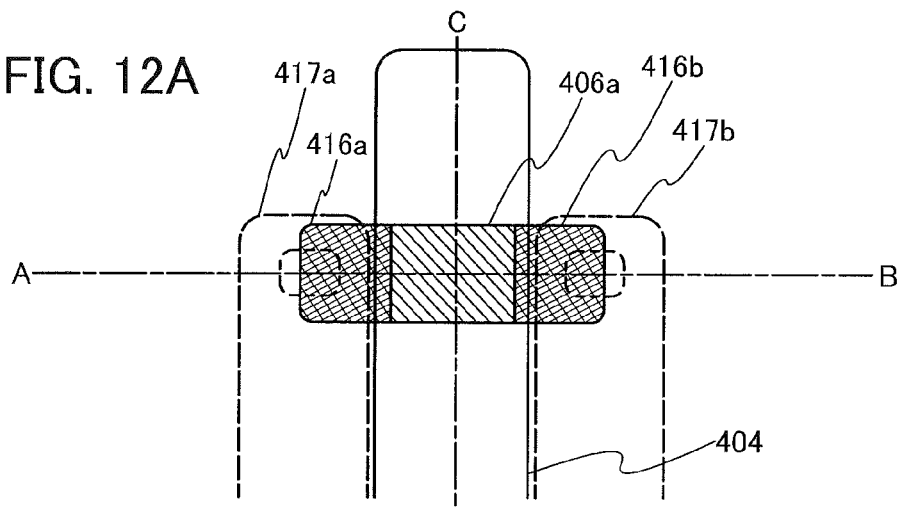
FIGS. 12A to 12C are cross-sectional views illustrating an example of a transistor of one embodiment of the present invention.
Figure 12B:
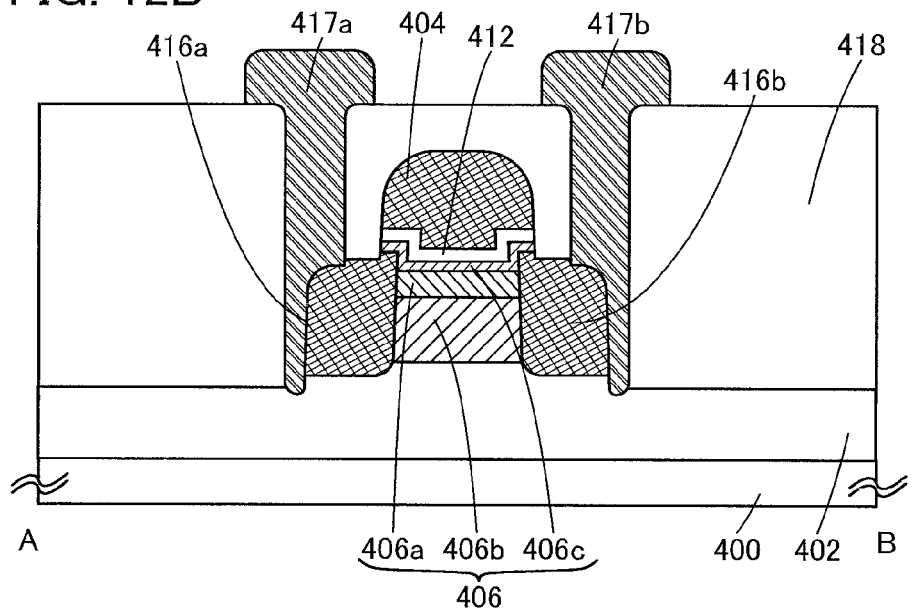
Figure 12C:
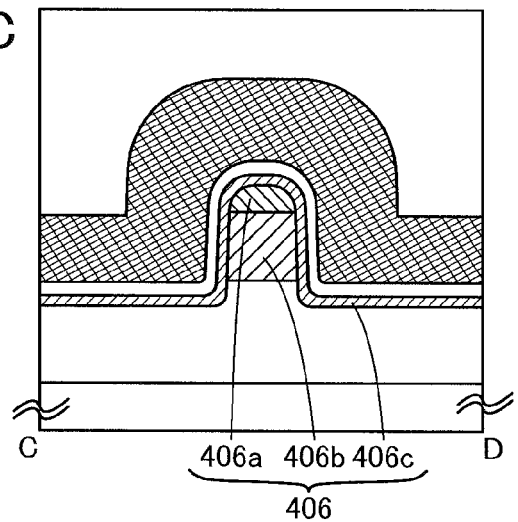

Note that in the transistor structure in FIGS. 11A to 11C, the edges of the electrode, the semiconductor film, and the like may be rounded as shown in FIGS. 12A to 12C.

Figure 13A:
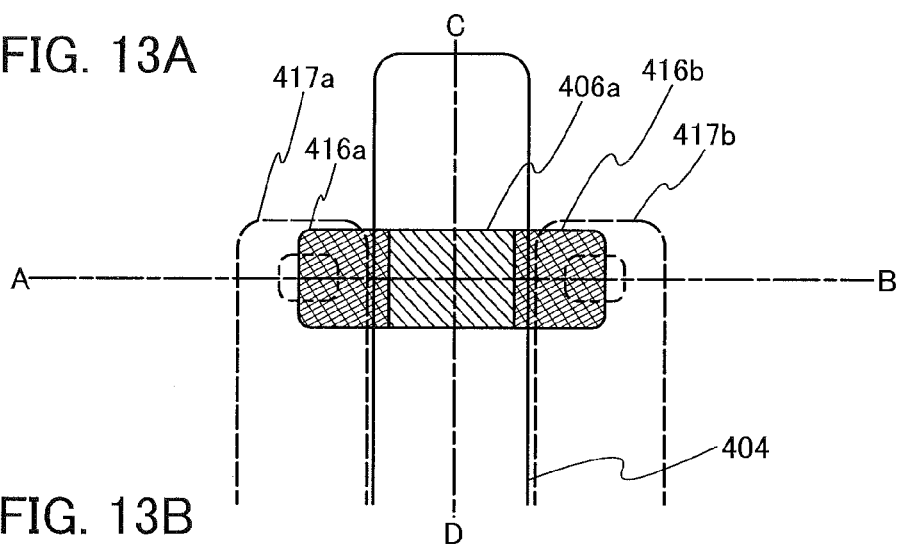
FIGS. 13A to 13C are cross-sectional views illustrating an example of a transistor of one embodiment of the present invention.
Figure 13B:
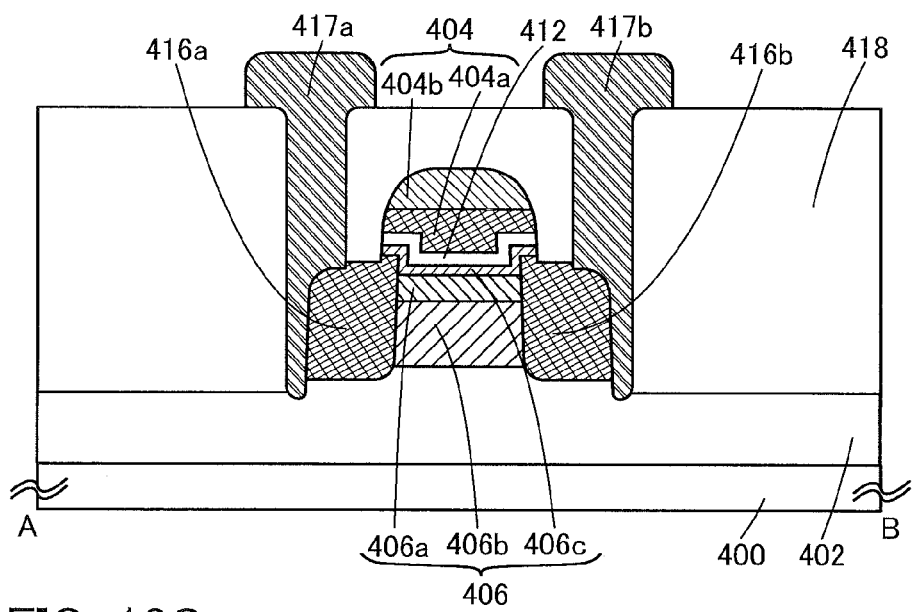
Figure 13C:
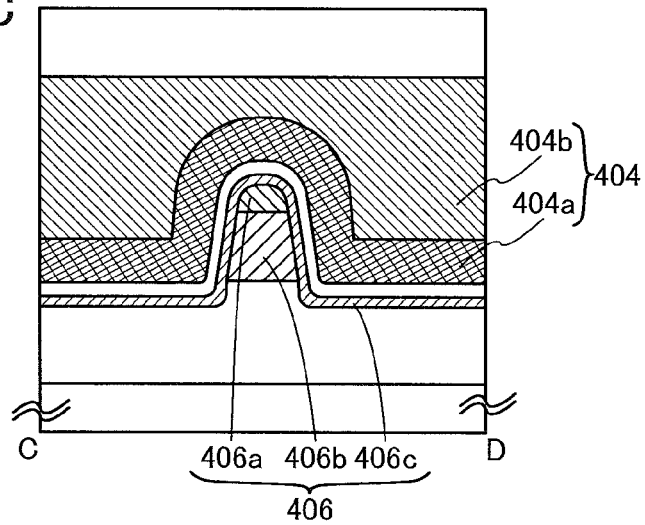

As shown in FIGS. 13A to 13C, the gate electrode 404 may be a two-layered electrode composed of gate electrodes 404a and 404b. As described in the description of FIGS. 33A to 33C, the threshold control by the work function of the gate electrode is thus desirable. In the case of stacking two layers as the gate electrode, an electrode material capable of controlling the threshold is selected for the lower layer which is in contact with the gate insulating film. As the upper layer, a film with low resistance, good processability, and good coverage may be used. When the top surface of the upper layer is flat, variation in line widths of resist patterns for fine photolithography, for example, can be reduced. The oxide semiconductor films 406a and 406b are tapered as in FIGS. 13A to 13C and consequently coverage with the gate electrodes 404a and 404b can be improved.

Next, a method for manufacturing the transistor illustrated in FIGS. 11A to 11C is described. FIGS. 14A and 14B to FIGS. 17A and 17B are cross-sectional views corresponding to FIGS. 11A and 11B.

First, the substrate 400 is prepared. Then, the insulating film 402 is formed over the substrate 400. The oxide semiconductor film 406b is formed over the insulating film 402. The oxide semiconductor film 406a is formed over the oxide semiconductor film 406b. A hard mask 421 is formed over the oxide semiconductor film 406a (see FIG. 14A). The description of the hard mask 121 is referred to for the hard mask 421.

Figure 14A:
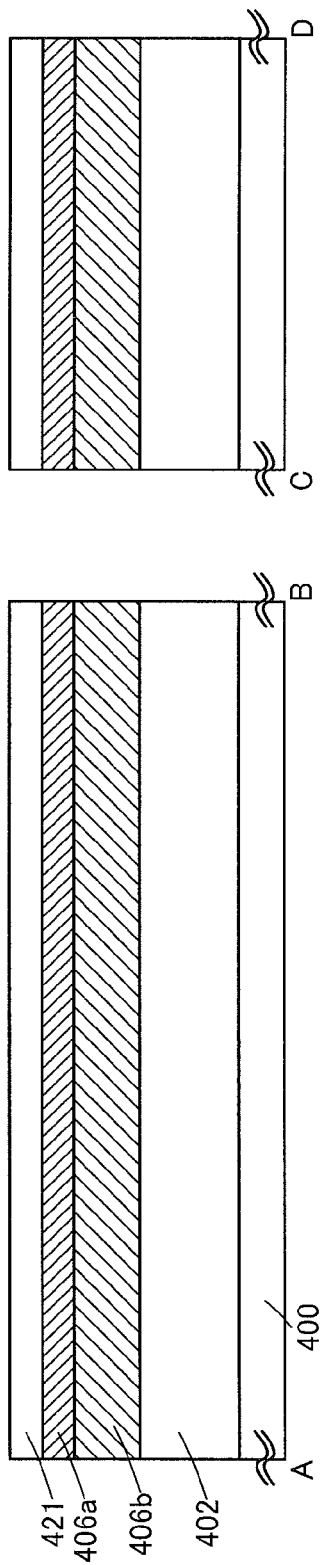
FIGS. 14A and 14B are cross-sectional views illustrating an example of a method for manufacturing a transistor of one embodiment of the present invention.
Figure 14B:
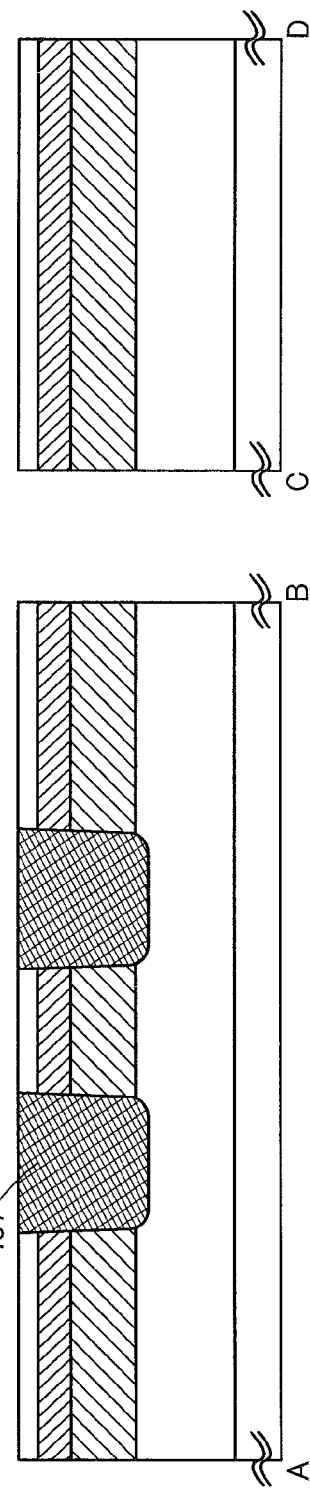

Next, openings are formed in the hard mask 421 and the oxide semiconductor films 406a and 406b and then a conductive film 437 is formed over the oxide semiocn film 406a and in the openings (see FIG. 14B). The conductive film 437 is to be the source electrode 416a and the drain electrode 416b. The opening can be formed by a method similar to that in the manufacturing method of Transistor 2, for example. The description of the conductive film 137 is referred to for the conductive film 437.

Figures 15A, 15B:
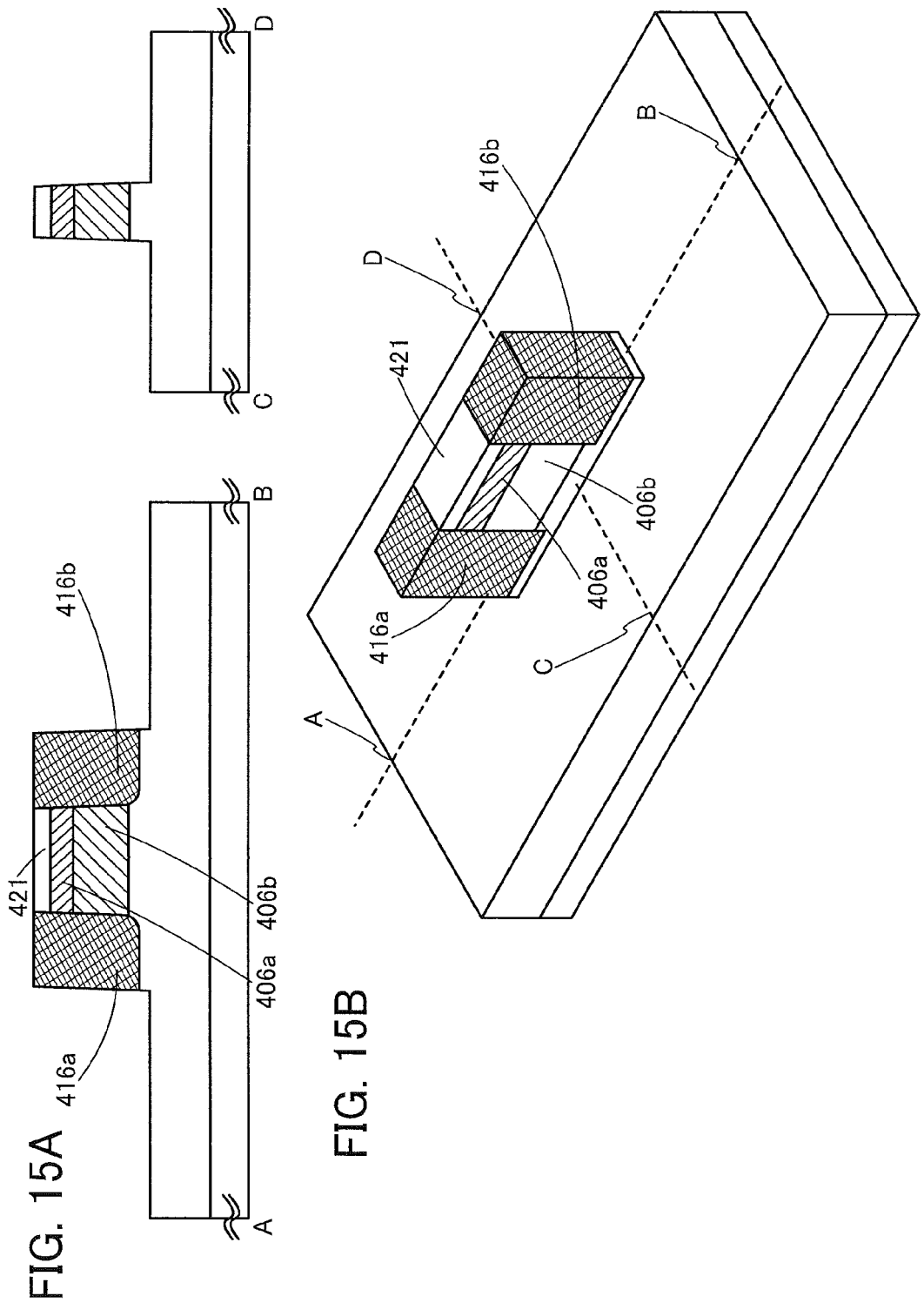
FIGS. 15A and 15B are a cross-sectional view and a solid figure illustrating an example of a method for manufacturing a transistor of one embodiment of the present invention.

Then, the hard mask 421 and the oxide semiconductor films 406a and 406b are processed into an island shape, and the conductive film 437 is processed to faun the island-shaped hard mask 421, the island-shaped oxide semiconductor films 406a and 406b, and the source and drain electrodes 416a and 416b (see FIG. 15A). The hard mask 421, the oxide semiconductor films 406a and 406b, and the conductive film 437 are processed by a method similar to that in the manufacturing method of Transistor 2, for example. FIG. 15B is a three-dimensional image. In FIG. 15B, rounded corners of the electrodes, the semiconductor film, and the like are not illustrated in detail.

The oxide semiconductor film 406c and the gate insulating film 412 are formed (see FIG. 16A). Subsequently, the gate electrode 404 is formed (see FIG. 16B). As the gate electrode 404 in FIGS. 13A to 13C, the gate electrode can be a two-layered electrode as shown in FIGS. 13A to 13C, and an upper layer of the two-layered electrode may cover a projection and a depression of a lower electrode to form the gate electrode 404 whose top surface is flat.

Then, the gate electrode 404, the gate insulating film 412, and the oxide semiconductor film 412, and the oxide semiconductor film 406c are processed into an island shape by photolithography or the like (see FIG. 17A).

In the transistor shown in FIGS. 11A to 11C, in manufacturing a transistor with a small channel length and a small channel width, when an electrode, a semiconductor film, or the like is processed while a resist mask is made to recede, the electrode, the semiconductor film, or the like has a round end portion (curved surface) in some cases. One of the examples is shown in FIGS. 12A to 12C. With this structure, the coverage with the gate insulating film 412, the gate electrode 404, and the protective insulating film 418, which are to be formed over the semiconductor film 406c, can be improved. Furthermore, concentration of electric field can be relaxed. By miniaturization of the transistor, a high degree of integration and a high density can be achieved.

Next, the protective insulating film 418 is formed and openings are formed in the protective insulating film 418. Then, a conductive film to be the wirings 417a and 417b is formed and processed by photolithography or the like to form the wirings 417a and 417b.

Through the above steps, the transistor illustrated in FIGS. 11A to 11C can be fabricated.

MODIFICATION EXAMPLE 2 OF TRANSISTOR STRUCTURE 2>

Figure 23A:
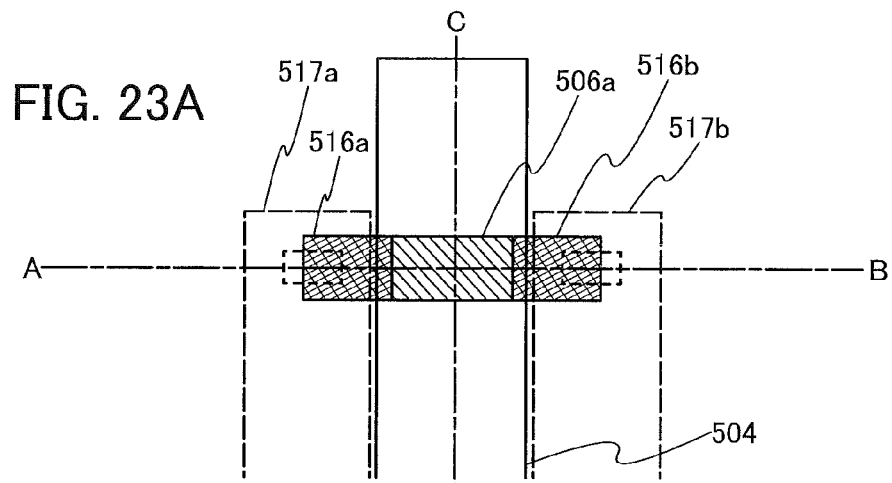
FIGS. 23A to 23C are cross-sectional views illustrating an example of a transistor according to one embodiment of the present invention.
Figure 23B:
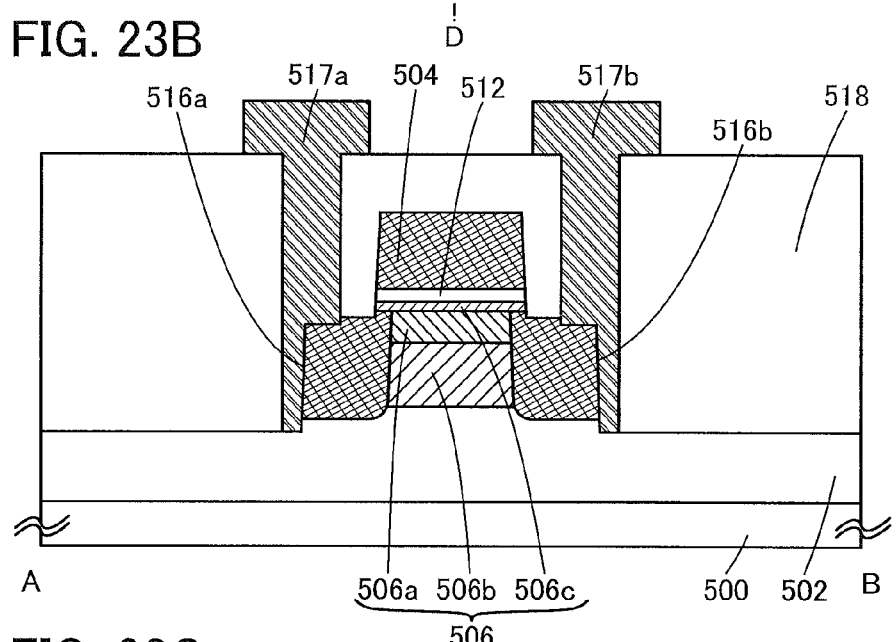
Figure 23C:
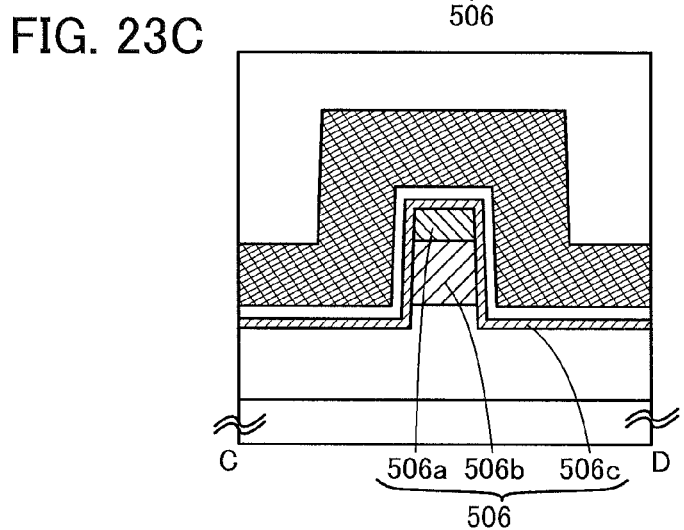
Figure 26A:
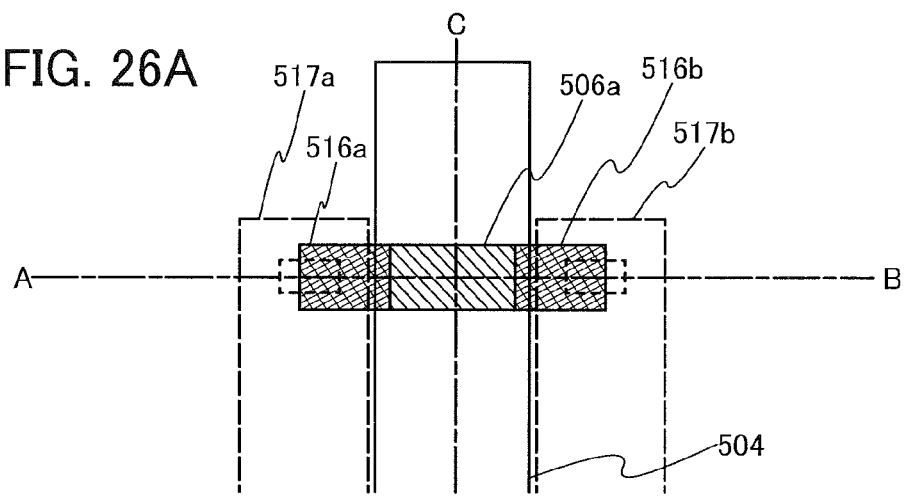
FIGS. 26A to 26C are cross-sectional views illustrating an example of a transistor of one embodiment of the present invention.
Figure 26B:
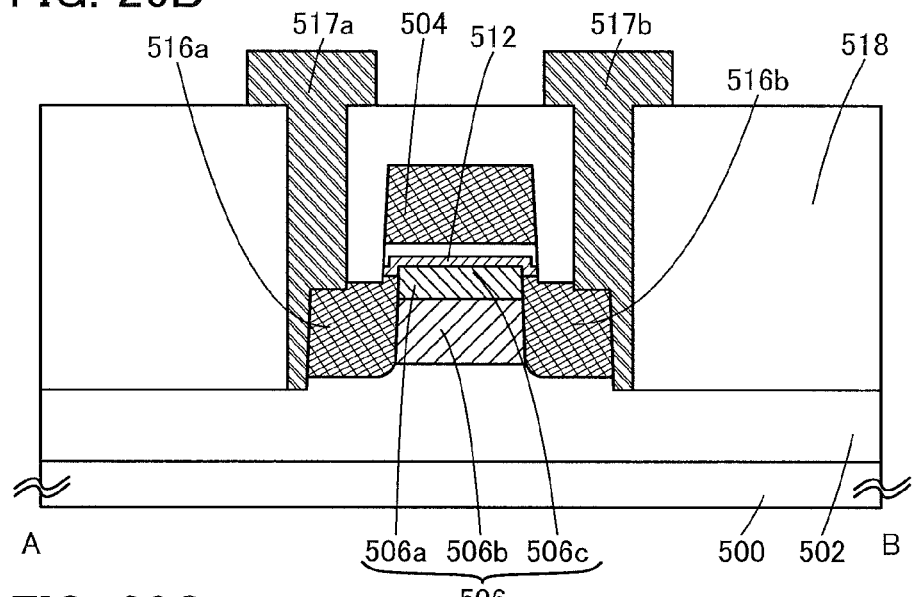
Figure 26C:
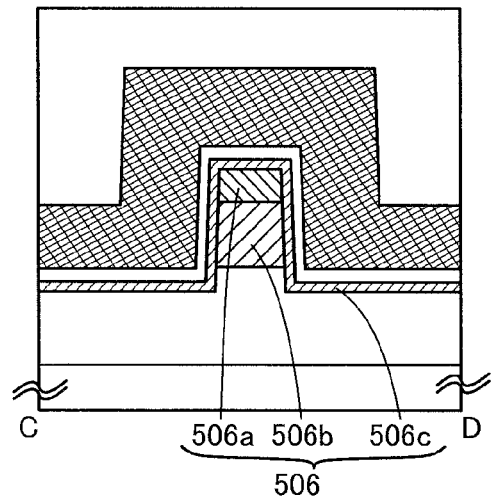

FIGS. 23A to 23C are Modification example 2 of Transistor structure 2. Unlike the transistor in FIGS. 3A to 3C, an oxide semiconductor film of the transistor in FIGS. 23A to 23C is a three-layered film. The shape of the three-layered oxide semiconductor film is different from the oxide semiconductor film in FIGS. 3A to 3C. Part of an oxide semiconductor film 506c in FIGS. 23A to 23C is on and in contact with a source electrode 516a and a drain electrode 516b.

The transistor in FIG. 23B includes an insulating film 502 over a substrate 500, an oxide semiconductor film 506b over the insulating film 502, an oxide semiconductor film 506a over the oxide semiconductor film 506b, the source and drain electrodes 516a and 516b in contact with side surfaces of the oxide semiconductor films 506a and 506b, the oxide semiconductor film 506c over the oxide semiconductor film 506a and the source and drain electrodes 516a and 516b, a gate insulating film 512 over the oxide semiconductor film 506c, and a gate electrode 504 over the gate insulating film 512. Note that the transistor preferably includes a protective insulating film 518 over the gate electrode 504 and the source and drain electrodes 516a and 516b, and wirings 517a and 517b over the protective insulating film 518. Furthermore, the protective insulating film 518 includes openings reaching the source electrode 516a and the drain electrode 516b, and the wiring 517a and the wiring 517b are in contact with the source electrode 516a and the drain electrode 516b, respectively, through the openings. Note that the transistor does not necessarily include the base insulating film 502 in some cases.

For the substrate 500, the description of the substrate 400 is referred to. The description of the insulating film 402 can be referred to for the insulating film 502. The description of the oxide semiconductor films 406a to 406c is referred to for the oxide semiconductor films 506a to 506c. The description of the source electrode 416a and the drain electrode 416b is referred to for the source electrode 516a and the drain electrode 516b. For the gate insulating film 512, the description of the gate insulating film 412 is referred to. For the gate electrode 504, the description of the gate electrode 404 is referred to. For the protective insulating film 518, the description of the protective insulating film 418 is referred to. For the wirings 517a and 517b, the description of the wirings 417a and 417b is referred to.

Manufacturing method of transistors in FIGS. 23A to 23C and FIGS. 26A to 26C will be described with reference to FIGS. 24A to 24C and FIGS. 25A to 25C.

As in FIG. 24A, openings are formed in the oxide semiconductor films 506a and 506b and a hard mask 521. Then, the hard mask 521 is removed (see FIG. 24B). Subsequently, a conductive film 537 is formed over the oxide semiconductor film 506a and in the openings, and then, polishing treatment is performed (FIG. 24C).

Then, the oxide semiconductor films 506a and 506b and the conductive film 537 are partly etched to form the island-shaped oxide semiconductor films 506a and 506b and the source and drain electrodes 516a and 516b having the shape shown in FIG. 25B. The distance from the top surface of the substrate to the top surface of the source and drain electrodes 516a and 516b is substantially the same as that from the top surface of the substrate to the top surface of the oxide semiconductor film 506b. The etching of the oxide semiconductor films 506a and 506b and the conductive film 537 is similar to that described in the manufacturing method of Transistor Structure 2.

In the polishing treatment, the etching rate of the conductive film 537 to the oxide semiconductor film 506a is increased, and consequently the distance from the substrate surface to the top surface of the conductive film 537 can be smaller than the distance from the substrate surface to the top surface of the oxide semiconductor film 506a (see FIG. 25A). The oxide semiconductor films 506a and 506b and the conductive film 537 are partly etched to form the island-shaped oxide semiconductor films 506a and 506b and the source and drain electrodes 516a and 516b having the shape shown in FIG. 25C, for example.

The island-shaped oxide semiconductor films 506a and 506b and the source and drain electrodes 516a and 516b (FIGS. 25B and 25C) are used to fabricate transistors having structures illustrated in FIGS. 23A to 23C and FIGS. 26A to 26C. Note that manufacturing steps following the steps in FIGS. 25B and 25C are similar to those in the manufacturing method of Transistor structure 2.

<Transistor Structure 3>

Transistor structure 3 will be described below in which an electric-field relaxation region having higher resistance than source and drain electrodes is provided between the source or drain electrode and the channel formation region of the semiconductor film in Transistor structure 1.

Figure 27A:
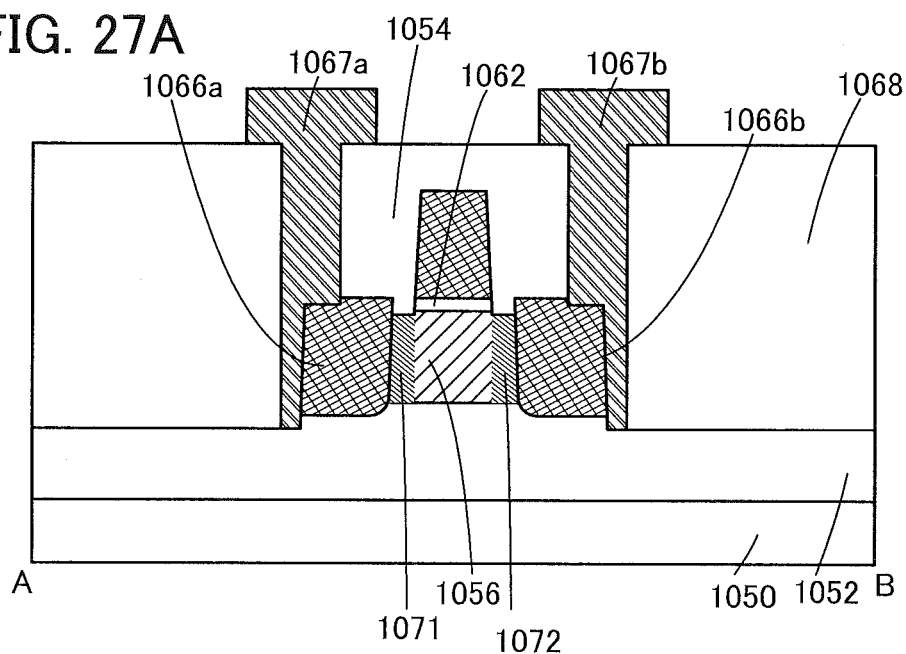
FIGS. 27A and 27B are cross-sectional views illustrating an example of a transistor according to one embodiment of the present invention.

FIG. 27A is a cross-sectional view of the transistor. The transistor includes an insulating film 1052 over a substrate 1050, a semiconductor film 1056 over the insulating film 1052, a gate insulating film 1062 over the semiconductor film 1056, a gate electrode 1054 over the gate insulating film 1062, a source electrode 1066a and a drain electrode 1066b which are in contact with side surfaces of the semiconductor film 1056, and regions 1071 and 1072. Note that the transistor preferably includes a protective insulating film 1068 over the gate electrode 1054 and the source and drain electrodes 1066a and 1066b, and wirings 1067a and 1067b over the protective insulating film 1068. The gate insulating film 1068 includes openings reaching the source electrode 1066a and the drain electrode 1066b. The wiring 1067a and the wiring 1067b are in contact with the source electrode 1066a and the drain electrode 1066b, respectively, through the openings. Note that the transistor does not necessarily include the insulating film 1052 in some cases.

For the substrate 1050, the description of the substrate 50 is referred to. The description of the insulating film 1052 can be referred to for the insulating film 52. The description of the semiconductor film 56 is referred to for the semiconductor film 1056. For the gate insulating film 1062, the description of the gate insulating film 62 is referred to. The description of the source electrode 66a and the drain electrode 66b is referred to for the source electrode 1066a and the drain electrode 1066b. For the protective insulating film 1068, the description of the protective insulating film 68 is referred to. For the wirings 1067a and 1067b, the description of the wirings 67a and 67b is referred to.

The regions 1071 and 1072 function as electric-field relaxation regions. It is preferable that the resistance of the regions 1071 and 1072 be higher than that of the source and drain electrodes.

A manufacturing method of the regions 1071 and 1072 will be described. The regions 1071 and 1072 can be formed by adding impurities to the semiconductor film 1056, for example. Impurities can be added by ion injection, ion doping, or the like using the gate electrode as a mask. Alternatively, ion injection, ion doping, or the like may be performed while a resist mask used for forming the gate electrode is left. Adding impurities can reduce the resistance of the semiconductor film. Note that when the resistance of the channel formation region is equal to the resistance of the regions 1071 and 1072, impurities are not necessarily added to the semiconductor film 1056.

Impurities added to the semiconductor film 1056 containing silicon are one or more of phosphorus, arsenic, boron, aluminum, and gallium. An impurity added to the semiconductor film 1056 containing an oxide semiconductor is one or more of boron, carbon, magnesium, aluminum, silicon, phosphorus, calcium, scandium, titanium, vanadium, chromium, manganese, iron, cobalt, nickel, gallium, germanium, arsenic, yttrium, zirconium, niobium, molybdenum, indium, tin, lanthanum, cerium, neodymium, hafnium, tantalum, and tungsten.

Transistor structure 2 and Modification examples thereof can also include an electric-field relaxation region between a source or drain electrode and a channel formation region of a semiconductor film, and the electric-field relaxation region has resistance higher than that of the source and drain electrodes and lower than that of the channel formation region, or resistance equivalent to that of the channel formation region. For example, FIG. 27B shows an example where an electric-field relaxation region is provided in Modification example 1 of Transistor structure 2.

Figure 27B:
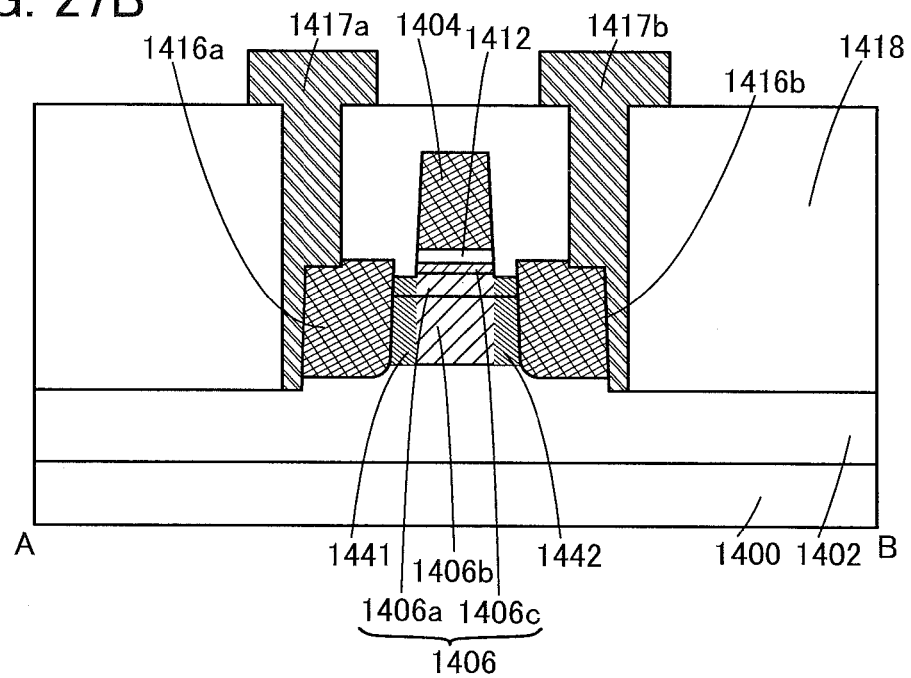

The transistor in FIG. 27B includes an insulating film 1402 over a substrate 1400, an oxide semiconductor film 1406b over the insulating film 1402, an oxide semiconductor film 1406a over the oxide semiconductor film 1406b, the source and drain electrodes 1416a and 1416b in contact with side surfaces of the oxide semiconductor films 1406a and 1406b, the oxide semiconductor film 1406c over the oxide semiconductor film 1406a and the source and drain electrodes 1416a and 1416b, a gate insulating film 1412 over the oxide semiconductor film 1406c, and a gate electrode 1404 over the gate insulating film 1412. Note that the transistor preferably includes a protective insulating film 1418 over the gate electrode 1404 and the source and drain electrodes 1416a and 1416b, and wirings 1417a and 1417b over the protective insulating film 1418. Furthermore, the protective insulating film 1418 includes openings reaching the source electrode 1416a and the drain electrode 1416b, and the wiring 1417a and the wiring 1417b are in contact with the source electrode 1416a and the drain electrode 1416b, respectively, through the openings. Note that the transistor does not necessarily include the base insulating film 1402 in some cases.

For the substrate 1400, the description of the substrate 400 is referred to. The description of the insulating film 402 can be referred to for the insulating film 1402. For the oxide semiconductor films 1406a to 1406c, the description of the oxide semiconductor films 406a to 406c is referred to. For the gate insulating film 1412, the description of the gate insulating film 412 is referred to. The description of the source electrode 416a and the drain electrode 416b are referred to for the source electrode 1416a and the drain electrode 1416b. For the protective insulating film 1418, the description of the protective insulating film 418 is referred to. For the wirings 1417a and 1417b, the description of the wirings 417a and 417b is referred to.

The regions 1441 and 1442 function as electric-field relaxation regions. It is preferable that the resistance of the regions 1441 and 1442 be higher than that of the source and drain electrodes.

The regions 1441 and 1442 can be formed by adding impurities to the oxide semiconductor film 1406a, for example. Note that the impurity may also be added to the oxide semiconductor film 1406b by adding the impurity to the oxide semiconductor film 1406a. Impurities can be added by ion injection, ion doping, or the like using the gate electrode as a mask. Alternatively, ion injection, ion doping, or the like may be performed while a resist mask used for forming the gate electrode is left. Adding impurities can reduce the resistance of the semiconductor film. Note that when the resistance of the channel formation region is equal to the resistance of the regions 1441 and 1442, impurities are not necessarily added to the oxide semiconductor film 1406a.

For example, one or more of boron, carbon, magnesium, aluminum, silicon, phosphorus, calcium, scandium, titanium, vanadium, chromium, manganese, iron, cobalt, nickel, gallium, germanium, arsenic, yttrium, zirconium, niobium, molybdenum, indium, tin, lanthanum, cerium, neodymium, hafnium, tantalum, and tungsten are added as impurities to the oxide semiconductor film 1406a.

<Semiconductor Device>

An example of a semiconductor device of one embodiment of the present invention that includes a transistor formed using an oxide semiconductor film and a transistor formed using silicon will be described below.

Figure 18:
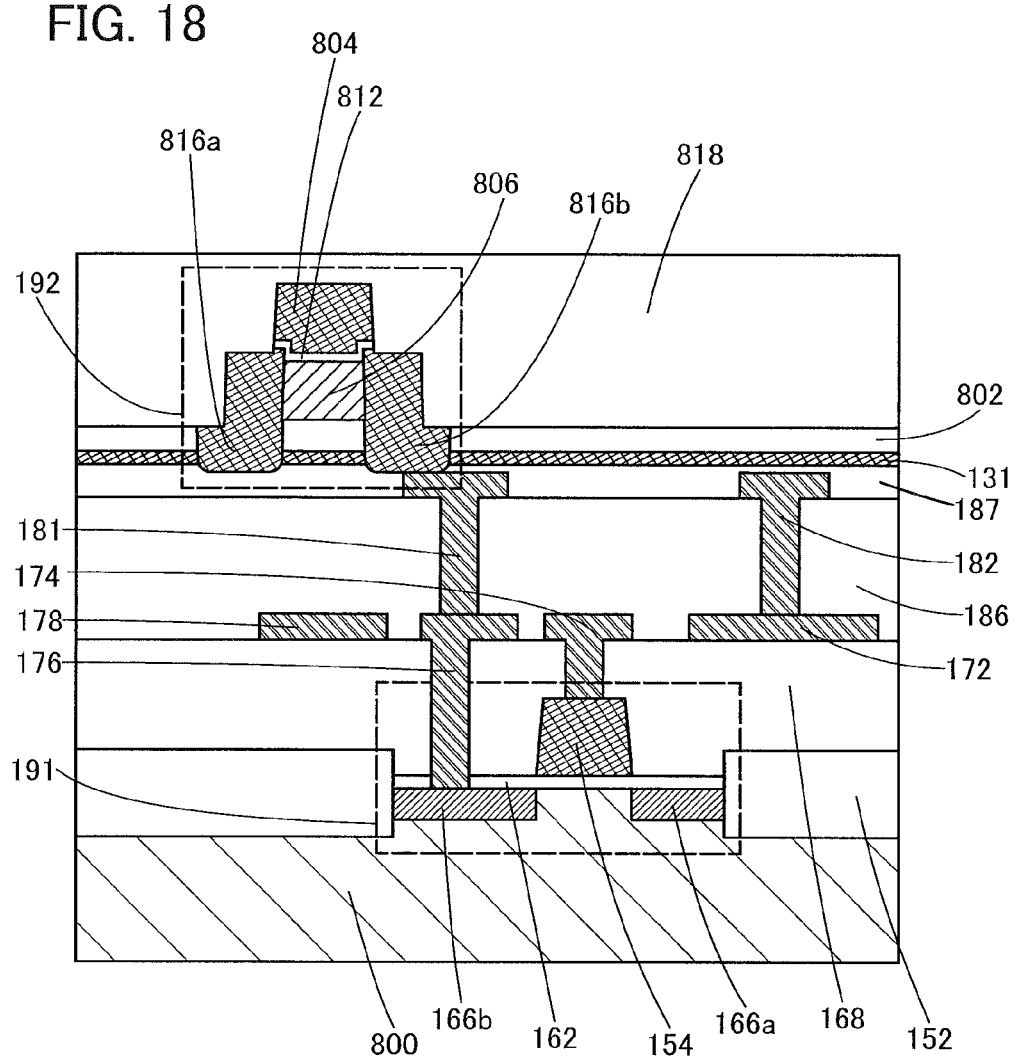
FIG. 18 is a cross-sectional view illustrating an example of a semiconductor device of one embodiment of the present invention.

FIG. 18 is a cross-sectional view of a semiconductor device. The semiconductor device includes a transistor 191 that is formed using silicon; an insulating film 168 over the transistor 191; a conductive film 172, a conductive film 174, a conductive film 176, and a conductive film 178 over the insulating film 168; an insulating film 186 over the insulating film 168, the conductive film 178, the conductive film 174, and the conductive film 176; a conductive film 181 and a conductive film 182 over the insulating film 186; an insulating film 187 over the conductive films 181 and 182; an insulating film 131 over the insulating film 187; an insulating film 802 over the insulating film 131; and a transistor 192 that is formed using an oxide semiconductor film and is over the insulating film 802. Note that a protective insulating film 818 may be provided over the semiconductor device.

The insulating film 168 is formed of, for example, a single layer or a stack of an insulating film containing silicon oxide or silicon oxynitride. Note that an oxynitride film in this specification refers to an oxide film containing nitrogen at a concentration higher than or equal to 0.1 at % and less than 25 at %. A nitride oxide film in this specification refers to a nitride film containing oxygen at a concentration higher than or equal to 0.1 at % and less than 25 at %.

The insulating film 168 has openings reaching the transistor 191. The conductive film 174 and the conductive film 176 are electrically connected to the transistor 191 through the openings formed in the insulating film 168. The thickness of the insulating film 168 is, for example, greater than or equal to 20 nm and less than or equal to 1000 nm, preferably greater than or equal to 50 nm and less than or equal to 1000 nm, more preferably greater than or equal to 100 nm and less than or equal to 1000 nm, still more preferably greater than or equal to 200 nm and less than or equal to 1000 nm.

The insulating film 186 is formed of, for example, a single layer or a stack of an insulating film containing silicon oxide or silicon oxynitride. Note that an oxynitride film in this specification refers to an oxide film containing nitrogen at a concentration higher than or equal to 0.1 at % and less than 25 at %. A nitride oxide film in this specification refers to a nitride film containing oxygen at a concentration higher than or equal to 0.1 at % and less than 25 at %.

The insulating film 186 includes openings reaching the conductive films 172 and 176. The conductive films 182 and 181 are electrically connected to the conductive films 172 and 176, respectively, through the openings in the insulating film 186. For example, the thickness of the protective insulating film 186 is greater than or equal to 20 nm and less than or equal to 1000 nm, preferably greater than or equal to 50 nm and less than or equal to 1000 nm, further preferably greater than or equal to 100 nm and less than or equal to 1000 nm, still further preferably greater than or equal to 200 nm and less than or equal to 1000 nm.

The semiconductor device in FIG. 18 does not necessarily include the insulating film 186 and the conductive films 181 and 182. In this case, the transistor 192 can be directly connected to the conductive film 176.

The conductive film 172, the conductive film 174, the conductive film 176, and the conductive film 178 may be formed using a single layer or a stacked of a conductive film containing aluminum, titanium, chromium, cobalt, nickel, copper, yttrium, zirconium, molybdenum, ruthenium, silver, tantalum, or tungsten. The conductive film 172, the conductive film 174, and the conductive film 176 may serve as wirings included in the semiconductor device. The conductive film 178 may serve as a back gate electrode of the transistor 192.

The insulating film 802 is formed of, for example, a single layer or a stack of an insulating film containing silicon oxide or silicon oxynitride. As the insulating film 802, an insulating film containing excess oxygen is preferably used.

The insulating film 802 has an opening reaching the conductive film 181. The transistor 192 is electrically connected to the conductive film 181 through the opening formed in the insulating film 802. The thickness of the insulating film 802 is, for example, greater than or equal to 20 nm and less than or equal to 1000 nm, preferably greater than or equal to 50 nm and less than or equal to 1000 nm, more preferably greater than or equal to 100 nm and less than or equal to 1000 nm, still more preferably greater than or equal to 200 nm and less than or equal to 1000 nm.

Aluminum oxide, silicon nitride, silicon nitride oxide, silicon oxynitride, silicon oxide, or the like can be used for the insulating film 131. When a silicon nitride film or an aluminum oxide film from which elements such as oxygen or hydrogen are less likely to be diffused is used, impurities such as hydrogen are prevented from entering an oxide semiconductor film 806 from the insulating film 131 or the components below. Moreover, diffusion of oxygen contained in the insulating film 802 toward the lower layers can be prevented, and oxygen can be efficiently supplied to the oxide semiconductor film 806.

The conductive films 181 and 182 may be formed using a single layer or a stacked layer of a conductive film containing one or more kinds of aluminum, titanium, chromium, cobalt, nickel, copper, yttrium, zirconium, molybdenum, ruthenium, silver, tantalum, and tungsten, for example. The conductive film 181 and the conductive film 182 may serve as wirings included in the semiconductor device.

The protective insulating film 818 may be formed with a single layer or a stacked layer of an insulating film containing one or more kinds of silicon oxide, silicon oxynitride, germanium oxide, yttrium oxide, zirconium oxide, lanthanum oxide, neodymium oxide, hafnium oxide, and tantalum oxide, for example.

The transistor 191 includes, for example, a gate insulating film 162 over a semiconductor substrate 800 formed using silicon; a gate electrode 154 over the gate insulating film 162; a source region 166a and a drain region 166b in regions of the semiconductor substrate 800 that do not overlap with the gate electrode 154; and an element isolation region 152 with an insulating property. Although the example where silicon is used for the semiconductor substrate 800 that is used for the transistor 191 is described here, the semiconductor substrate 800 is not limited to a semiconductor substrate formed using silicon. Examples of the semiconductor substrate 800 include semiconductor substrates such as a germanium substrate and a diamond substrate, and compound semiconductor substrates such as a gallium arsenide substrate, a silicon carbide substrate, a gallium nitride substrate, an indium phosphide substrate, a zinc oxide substrate, and a gallium oxide substrate. Alternatively, an SOI (silicon on insulator) substrate or the like may be used as the semiconductor substrate 800. Instead of the semiconductor substrate 800, a substrate with an insulating surface that is provided with a semiconductor film such as a silicon film, a germanium film, or a diamond film, or a compound semiconductor film such as a gallium arsenide film, a silicon carbide film, a gallium nitride film, an indium phosphide film, a zinc oxide film, a gallium oxide film, an In—Zn oxide film, an In—Ga—Zn oxide film, or an In—Sn—Zn oxide film may be used.

The transistor 192 includes, for example, the oxide semiconductor film 806 over the insulating film 802, a source electrode 816a and a drain electrode 816b in contact with side surfaces of the oxide semiconductor film 806, a gate insulating film 812 over the oxide semiconductor film 806, and a gate electrode 804 over the gate insulating film 812.

Next, a manufacturing method of the semiconductor device shown in FIG. 18 will be described.

Figure 19A:
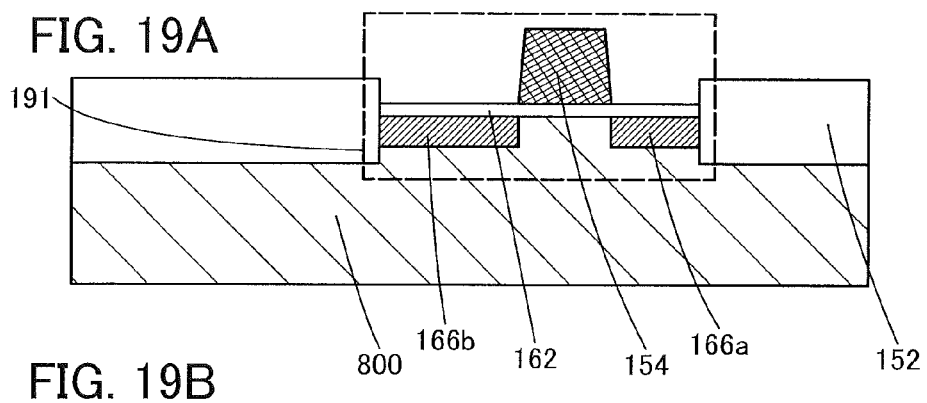
FIGS. 19A to 19D are cross-sectional views illustrating an example of a method for manufacturing a semiconductor device of one embodiment of the present invention.

First, the transistor 191 is formed over the semiconductor substrate 800 (see FIG. 19A).

A known method of a silicon transistor can be used for forming the transistor 191.

Figure 19B:
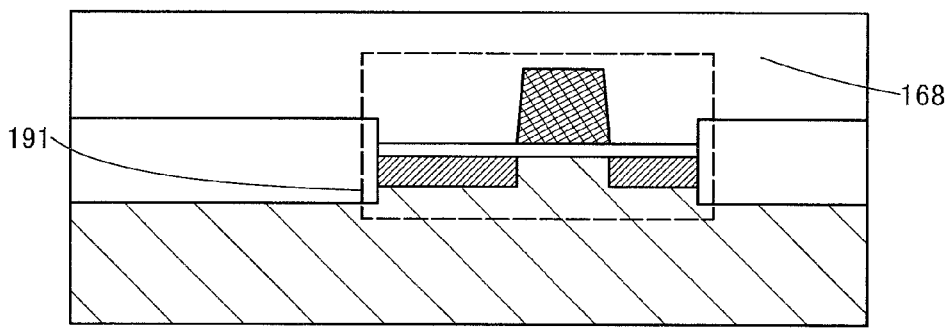
Figure 19C:
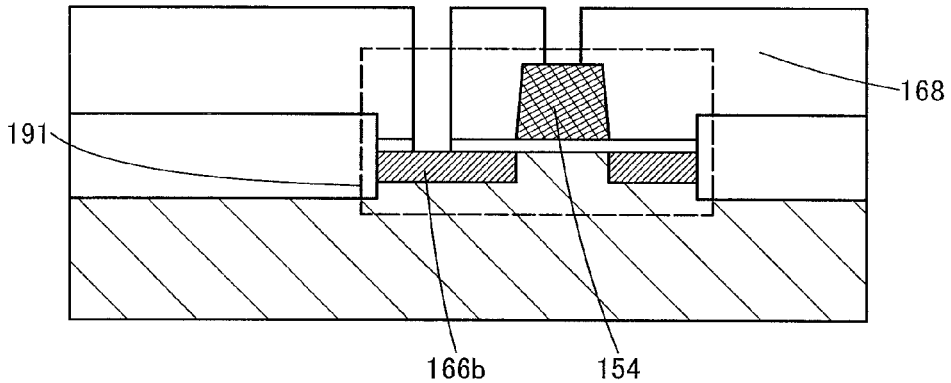

Then, the insulating film 168 is formed over the transistor 191 (see FIG. 19B). Then, the insulating film 168 is processed to form an opening reaching the gate electrode 154 of the transistor 191 and an opening reaching the drain region 166b (see FIG. 19C).

Figure 19D:
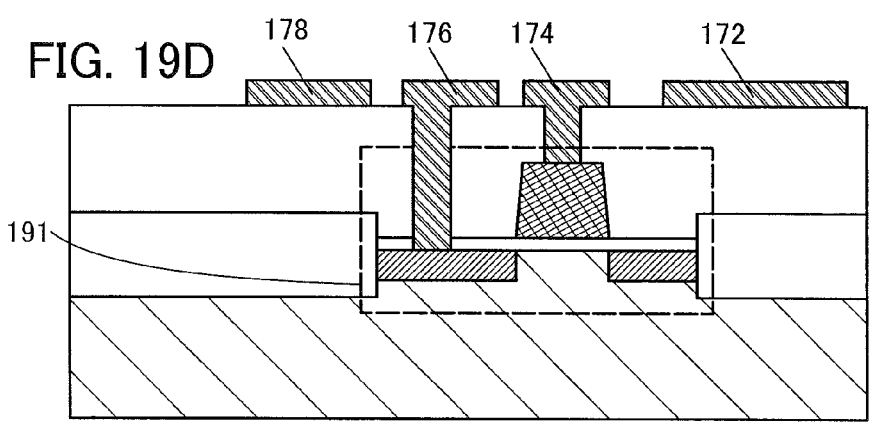

Then, the conductive film 172, the conductive film 174, the conductive film 176, and the conductive film 178 are formed over the insulating film 168 (see FIG. 19D).

Figure 20A:
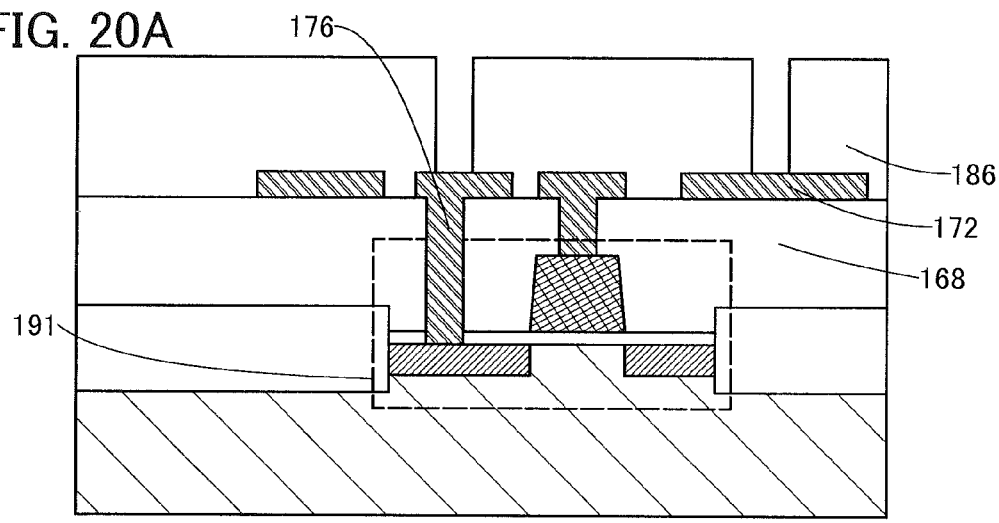
FIGS. 20A to 20C are cross-sectional views illustrating an example of a method for manufacturing a semiconductor device of one embodiment of the present invention.

The insulating film 186 is formed over the insulating film 168 and the conductive films 172, 174, 176, and 178. Next, the insulating film 186 is processed to faun openings reaching the conductive films 172 and 176 (see FIG. 20A).

Figure 20B:
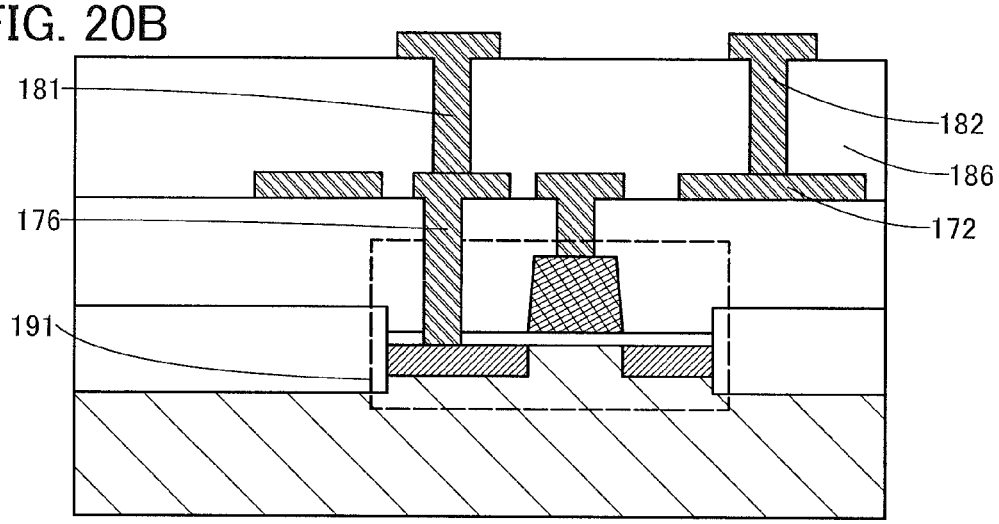
Figure 20C:
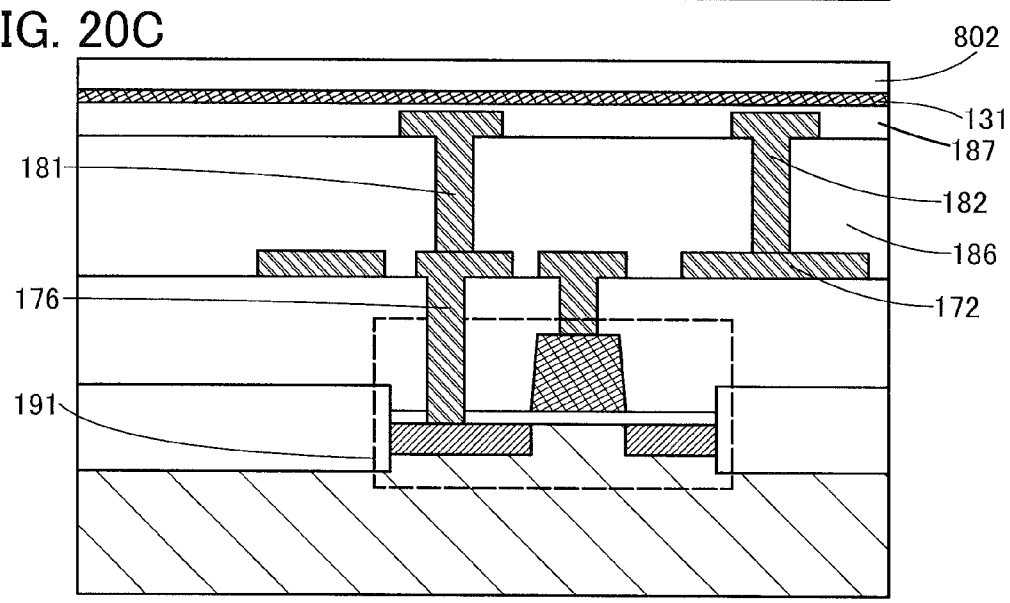

Next, the conductive films 181 and 182 are formed over the insulating film 186 (see FIG. 20B). The insulating film 187 is formed over the insulating film 186 and the conductive films 181 and 182. The insulating film 131 is then formed over the insulating film 187. Next, the insulating film 802 is formed over the insulating film 131 (see FIG. 20C).

Figure 21A:
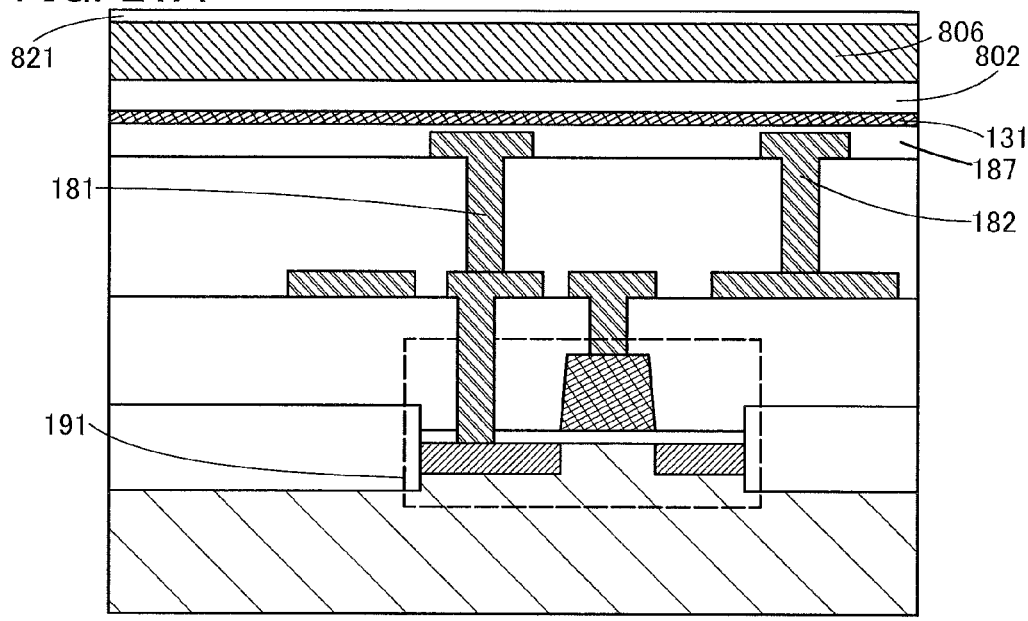
FIGS. 21A and 21B are cross-sectional views illustrating an example of a method for manufacturing a semiconductor device of one embodiment of the present invention.

The oxide semiconductor film 806 and a hard mask 821 are formed over the insulating film 802 (see FIG. 21A). The description of the oxide semiconductor film 106 can be referred to for the oxide semiconductor film 806. The description of the hard mask 121 can be referred to for the hard mask 821.

Figure 21B:
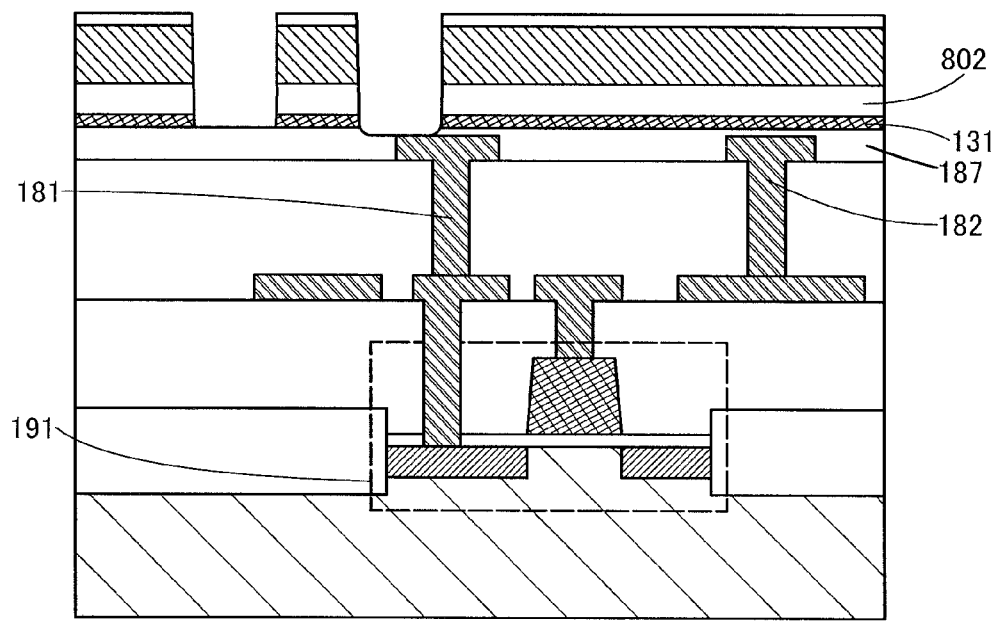
Figure 22A:
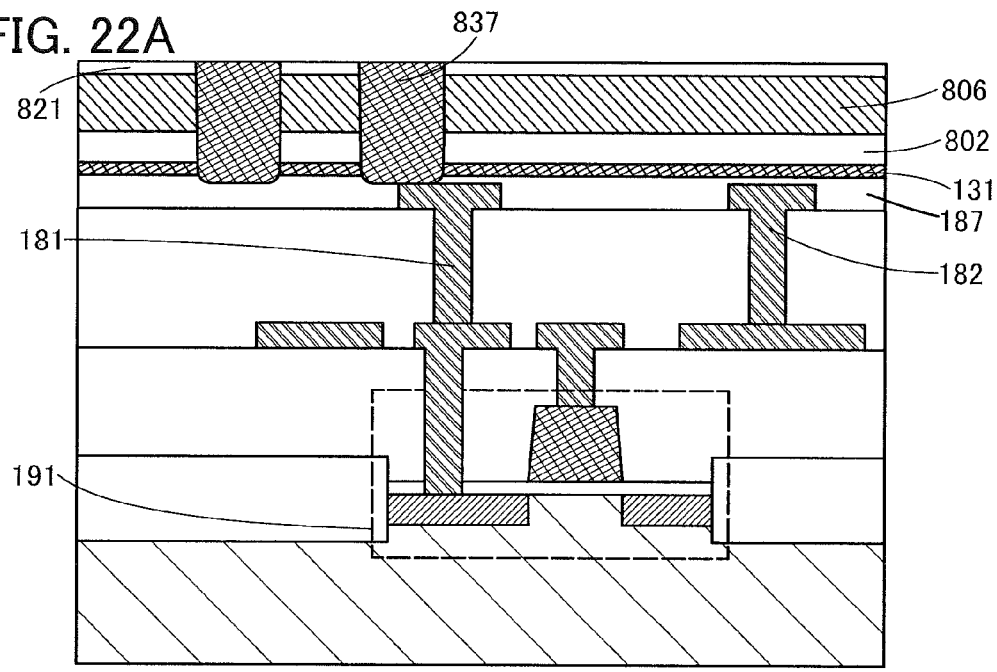
FIGS. 22A and 22B are cross-sectional views illustrating an example of a method of manufacturing the semiconductor device of one embodiment of the present invention.

The hard mask 821, the oxide semiconductor film 806, and the insulating films 802, 131, and 187 are processed to form openings reaching the conductive film 181 (see FIG. 21B). The conductive film 837 is formed in the openings (see FIG. 22A). The description of the conductive film 137 can be referred to for the conductive film 837.

Figure 22B:
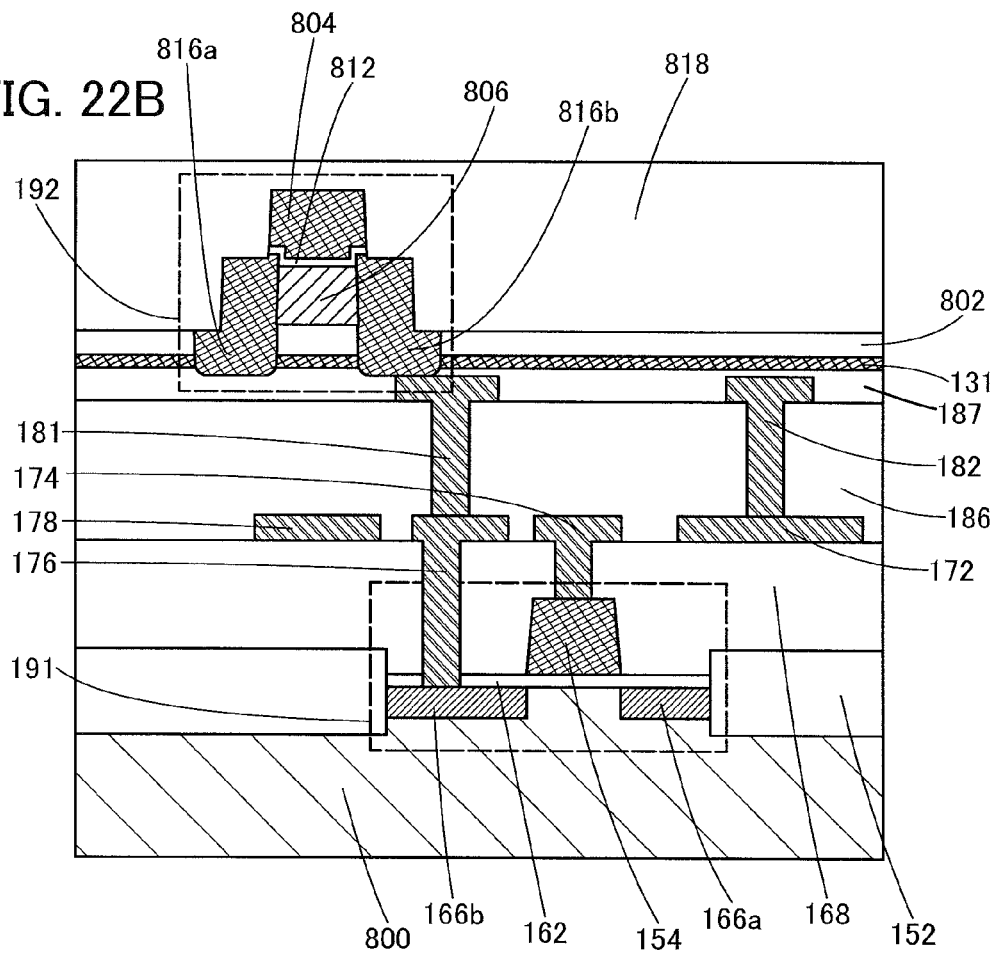

Next, the transistor 192 is formed. The source electrode 816a and the drain electrode 816b of the transistor are formed using the conductive film 837. The transistor 192 can be fainted by a method similar to the formation method of the transistor illustrated in FIGS. 2A to 2C. Next, the protective insulating film 818 is formed (see FIG. 22B).

Though the above steps, the semiconductor device illustrated in FIG. 18 can be fabricated.

<Application Products>

Application products using the above semiconductor device are described below.

The above transistor can be used for various purposes such as a memory, a CPU, and a display device, for example.

<Memory 1>

A circuit configuration and operation of a memory cell included in a semiconductor device of one embodiment of the present invention will be described below with reference to FIGS. 28A and 28B.

Note that a semiconductor device includes a memory cell, and in some cases, further includes a driver circuit, a power supply circuit, or the like provided over a substrate which is different from a substrate provided with the memory cell.

Figure 28A:
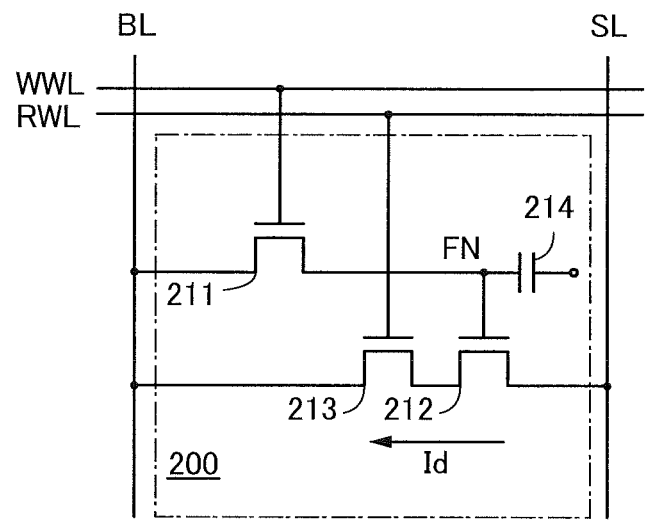
FIGS. 28A and 28B are a circuit diagram and a timing chart of an example of a semiconductor device of one embodiment of the present invention.

FIG. 28A is a circuit diagram illustrating an example of a memory cell 200.

The memory cell 200 in FIG. 28A includes a transistor 211, a transistor 212, a transistor 213, and a capacitor 214. Note that in the actual case, a plurality of memory cells 200 are arranged in a matrix, though not illustrated in FIG. 28A.

A gate of the transistor 211 is connected to a write word line WWL. One of a source and a drain of the transistor 211 is connected to a bit line BL. The other of the source and the drain of the transistor 211 is connected to a floating node FN.

A gate of the transistor 212 is connected to the floating node FN. One of a source and a drain of the transistor 213 is connected to one of a source and a drain of the transistor 212. The other of the source and the drain of the transistor 212 is connected to a power supply line SL.

A gate of the transistor 213 is connected to a read word line RWL. The other of the source and the drain of the transistor 212 is connected to the bit line BL.

One electrode of the capacitor 214 is connected to the floating node FN. The other electrode of the capacitor 214 is supplied with a fixed potential.

A word signal is supplied to the write word line WWL.

The word signal is a signal to turn on the transistor 211 so that the voltage of the bit line BL is supplied to the floating node FN.

Note that in this specification, "writing of data to the memory cell" means that a word signal supplied to the write word line WWL is controlled so that the potential of the floating node FN reaches a potential corresponding to the voltage of the bit line BL. Further, "reading of data from the memory cell" means that a read signal supplied to the read word line RWL is controlled so that the voltage of the bit line BL reaches a voltage corresponding to the potential of the floating node FN.

Multilevel data is supplied to the bit line BL. Further, a discharge voltage $V_{discharge}$ for reading data is supplied to the bit line BL.

The multilevel data is k-bit data (k is an integer of 2 or more). Specifically, 2-bit data is 4-level data, namely, a signal having any one of the four levels of voltages.

The discharge voltage $V_{discharge}$ is a voltage that is supplied to the bit line BL in order to read data. After the discharge voltage $V_{discharge}$ is supplied, the bit line BL is brought into an electrically floating state. The discharge voltage $V_{discharge}$ is a voltage that is supplied to initialize the bit line BL.

A read signal is supplied to the read word line RWL.

The read signal is a signal that is supplied to the gate of the transistor 213 in order to read data from the memory cell in a selective manner.

The floating node FN corresponds to any node on a wiring that connects one electrode of the capacitor 214, the other of the source and the drain of the transistor 211, and the gate of the transistor 212.

Note that the potential of the floating node FN is based on the multilevel data supplied from the bit line BL. The floating node FN becomes in an electrically floating state when the transistor 211 is turned off.

The power supply line SL is supplied with a precharge voltage $V_{precharge}$ that is higher than the discharge voltage $V_{discharge}$ supplied to the bit line BL.

Note that the voltage of the power supply line SL needs to be the precharge voltage $V_{precharge}$ at least in a period in which data is read from the memory cell 200. Thus, in a period in which data is written to the memory cell 200 and/or in a period in which data is not read or written, the power supply line SL can be supplied with the discharge voltage $V_{discharge}$ so that the bit line BL and the power supply line SL have the same potential. With such a structure, a slight amount of flow-through current that flows between the bit line BL and the power supply line SL can be reduced.

Another structure may be employed in which the power supply line SL is supplied with a constant voltage that is equal to the precharge voltage $V_{precharge}$. With such a structure, it is not necessary to switch the voltage of the power supply line SL between the precharge voltage $V_{precharge}$ and the discharge voltage $K_{discharge}$, and thus, power consumed in storing and releasing electrical charge of the power supply line SL can be reduced.

The precharge voltage $V_{precharge}$ is supplied to the power supply line SL to change the discharge voltage $V_{discharge}$ supplied to the bit line BL by storing electrical charge via the transistor 212 and the transistor 213.

The transistor 211 has a function of a switch for controlling data writing by being switched between a conducting state and a non-conducting state. The transistor 211 also has a function of holding a potential based on written data by keeping a non-conducting state. Note that the transistor 211 is an n-channel transistor in the description.

As the transistor 211, it is preferable to use a transistor having a low current (low off-state current) that flows between a source and a drain in a non-conducting state.

In the configuration of the memory cell 200 illustrated in FIG. 28A, a potential based on written data is held by keeping the non-conducting state. Thus, it is particularly preferable to use a transistor having a low off-state current as a switch for suppressing change in the potential in the floating node FN that is accompanied by the transfer of electrical charge. Note that a method for estimating the off-state current of a transistor with low off-state current will be described later.

When a transistor having a low off-state current is used as the transistor 211 and the transistor 211 is kept off, the memory cell 200 can be a non-volatile memory. Thus, once data is written to the memory cell 200, the data can be held in the floating node FN until the transistor 211 is turned on again.

In the transistor 212, a drain current $I_d$ flows between the source and the drain in accordance with the potential of the floating node FN. Note that in the memory cell 200 illustrated in FIG. 28A, the drain current $I_d$ that flows between the source and the drain of the transistor 212 is a current that flows between the bit line BL and the power supply line SL.

Note that the transistor 212 is also referred to as a second transistor. Note that the transistor 212 is an n-channel transistor in the description.

In the transistor 213, the current $I_d$ flows between the source and the drain in accordance with the potential of the read word line RWL. Note that in the memory cell 200 illustrated in FIG. 28A, the drain current $I_d$ that flows between the source and the drain of the transistor 213 is a current that flows between the bit line BL and the power supply line SL. Note that the transistor 213 is also referred to as a third transistor. Note that the transistor 213 is an n-channel transistor in the description.

The transistors 212 and 213 each preferably have little variation in threshold voltage. Here, transistors with little variation in threshold voltage mean transistors that are produced in the same process and have a difference in threshold voltage of 20 mV or lower; a specific example of the transistors is transistors formed using single crystal silicon in channels. The variation in threshold voltage is preferably as little as possible; however, even the transistors including single crystal silicon may have a difference in threshold voltage of approximately 20 mV.

Next, operation of the memory cell 200 illustrated in FIG. 28A will be described.

Figure 28B:
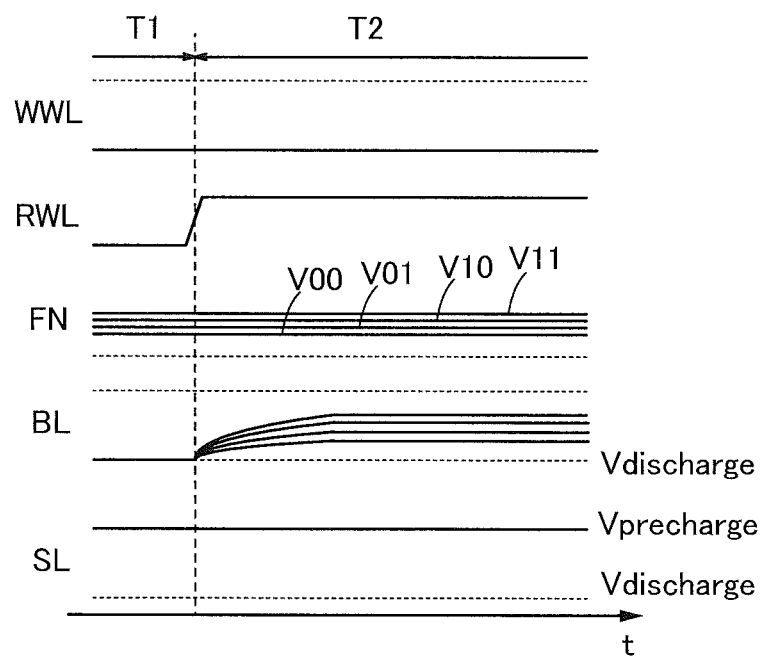

FIG. 28B is a timing chart showing change of signals supplied to the write word line WWL, the read word line RWL, the floating node FN, the bit line BL, and the power supply line SL in FIG. 28A.

The following periods are shown in the timing chart of FIG. 28B: a period T1 that is in an initial state; and a period T2 in which electrical charge of the bit line BL is stored in order to read data.

In the period T1 of FIG. 28B, the electrical charge of the bit line BL is released. At this time, the write word line WWL is supplied with a low-level potential. The read word line RWL is supplied with a low-level potential. The floating node FN holds a potential corresponding to the multilevel data. The bit line BL is supplied with a discharge voltage $V_{discharge}$. The power supply line SL is supplied with a precharge voltage $V_{precharge}$.

Note that as an example of the multilevel data, 2-bit data, i.e., 4-level data is shown in FIG. 28B. Specifically, 4-level data ($V_{00}$, $V_{01}$, $V_{10}$, and $V_{11}$) are shown in FIG. 28B, and the data can be represented by four levels of potentials.

The bit line BL is brought into an electrically floating state after the discharge voltage $V_{discharge}$ is supplied. That is, the bit line BL is brought into a state in which the potential is changed by the storing or releasing of electrical charge. By turning off a switch for supplying a potential to the bit line BL, the bit line BL can be brought into an electrically floating state.

Next, in the period T2 of FIG. 28B, the electrical charge of the bit line BL is stored to read data. At this time, the write word line WWL is supplied with the low-level potential as in the previous period. The read word line RWL is supplied with a high-level potential. In the floating node FN, the potential corresponding to the multilevel data is held as in the previous period. In the bit line BL, the discharge voltage $V_{discharge}$ is increased in accordance with the potential of the floating node FN. The power supply line SL is supplied with the precharge voltage $V_{precharge}$ as in the previous period.

The transistor 213 is turned on in response to the change in the potential of the read word line RWL. Thus, the potential of one of the source and the drain of the transistor 212 is lowered to be the discharge voltage $V_{discharge}$.

The transistor 212 is an n-channel transistor. When the potential of one of the source and the drain of the transistor 212 is lowered to be the discharge voltage $V_{discharge}$, the absolute value of a voltage between the gate and the source (gate voltage) is increased. With the increase in the gate voltage, the drain current $I_d$ flows between the source and the drain of each of the transistors 212 and 213.

When the drain current $I_d$ flows in each of the transistor 212 and the transistor 213, the electrical charge of the power supply line SL is stored to the bit line BL. The potential of the source of the transistor 212 and the potential of the bit line BL are raised by the storing of electrical charge. The raising of the potential in the source of the transistor 212 leads to a gradual decrease in the gate voltage of the transistor 212.

When the gate voltage of the transistor 212 falls to the threshold voltage in the period T2, the drain current $I_d$ stops flowing. Hence, the increase in the potential of the bit line BL proceeds, and when the gate voltage of the transistor 212 reaches the threshold voltage, the storing of electrical charge is completed and the bit line BL has a constant potential. The potential of the bit line BL at this time is approximately a difference between the potential of the floating node FN and the threshold voltage.

That is, the potential of the floating node FN can be reflected in the potential of the bit line BL that is changed by the storing of electrical charge. The difference in the potential is used to determine the multilevel data. In this manner, the multilevel data written to the memory cell 200 can be read.

Thus, the multilevel data can be read from the memory cell without switching a signal for reading data in accordance with the number of levels of the multilevel data.

<Memory 2>

A circuit configuration of a semiconductor device that is different from that of memory 1 and operation of the semiconductor device will be described with reference to FIGS. 29A and 29B.

Figure 29A:
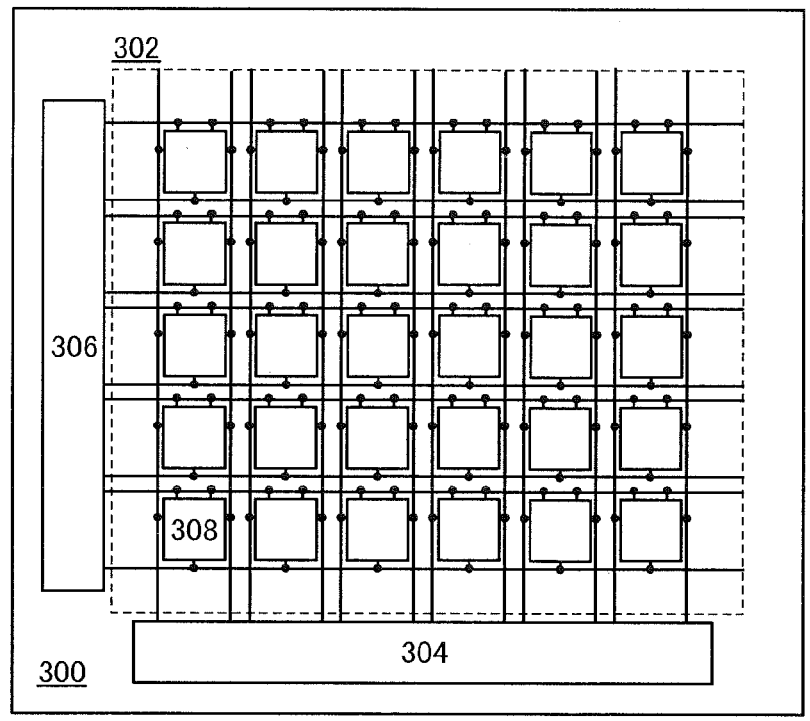
FIGS. 29A and 29B are a block diagram and a circuit diagram of an example of a semiconductor device of one embodiment of the present invention.

As a semiconductor device that is one embodiment of the present invention, a storage device 300 is illustrated in FIG. 29A. The storage device 300 illustrated in FIG. 29A includes a storage element portion 302, a first driver circuit 304, and a second driver circuit 306.

A plurality of storage elements 308 are arranged in a matrix in the storage element portion 302. In the example illustrated in FIG. 29A, the storage elements 308 are arranged in five rows and six columns in the storage element portion 302.

The first driver circuit 304 and the second driver circuit 306 control supply of signals to the storage elements 308, and obtain signals from the storage elements 308 in reading. For example, the first driver circuit 304 serves as a word line driver circuit and the second driver circuit 306 serves as a bit line driver circuit. However, one embodiment of the present invention is not limited thereto, and the first driver circuit 304 may serve as a bit line driver circuit and the second driver circuit 306 may serve as a word line driver circuit.

The first driver circuit 304 and the second driver circuit 306 are each electrically connected to the storage elements 308 through wirings.

The storage elements 308 each include a volatile memory and a non-volatile memory. FIG. 29B illustrates a specific example of a circuit configuration of the storage element 308. The storage element 308 illustrated in FIG. 29B includes a first storage circuit 310 and a second storage circuit 312.

The first storage circuit 310 includes a first transistor 314, a second transistor 316, a third transistor 318, a fourth transistor 320, a fifth transistor 322, and a sixth transistor 324.

First, a configuration of the first storage circuit 310 will be described. One of a source and a drain of the first transistor 314 is electrically connected to a first terminal 330, and a gate of the first transistor 314 is electrically connected to a second terminal 332. One of a source and a drain of the second transistor 316 is electrically connected to a high potential power supply line Vdd. The other of the source and the drain of the second transistor 316 is electrically connected to the other of the source and the drain of the first transistor 314, one of a source and a drain of the third transistor 318, and a first data holding portion 340. The other of the source and the drain of the third transistor 318 is electrically connected to a low potential power supply line Vss. A gate of the second transistor 316 and a gate of the third transistor 318 are electrically connected to a second data holding portion 342.

One of a source and a drain of the fourth transistor 320 is electrically connected to a third terminal 334. A gate of the fourth transistor 320 is electrically connected to a fourth terminal 336. One of a source and a drain of the fifth transistor 322 is electrically connected to the high potential power supply line Vdd. The other of the source and the drain of the fifth transistor 322 is electrically connected to the other of the source and the drain of the fourth transistor 320, one of a source and a drain of the sixth transistor 324, and the second data holding portion 342. The other of the source and the drain of the sixth transistor 324 is electrically connected to the low potential power supply line Vss. A gate of the fifth transistor 322 and a gate of the sixth transistor 324 are electrically connected to the first data holding portion 340.

The first transistor 314, the third transistor 318, the fourth transistor 320, and the sixth transistor 324 are n-channel transistors.

The second transistor 316 and the fifth transistor 322 are p-channel transistors.

The first terminal 330 is electrically connected to a bit line. The second terminal 332 is electrically connected to a first word line. The third terminal 334 is electrically connected to an inverted bit line. The fourth terminal 336 is electrically connected to the first word line.

The first storage circuit 310 having the above configuration is an SRAM. In other words, the first storage circuit 310 is a volatile memory. In the storage device 300 of one embodiment of the present invention, the first data holding portion 340 and the second data holding portion 342, which are provided in the first storage circuit 310, are electrically connected to the second storage circuit 312.

The second storage circuit 312 includes a seventh transistor 326 and an eighth transistor 328.

Next, a configuration of the second storage circuit 312 will be described. One of a source and a drain of the seventh transistor 326 is electrically connected to the second data holding portion 342. The other of the source and the drain of the seventh transistor 326 is electrically connected to one electrode of the first capacitor 348. The other electrode of the first capacitor 348 is electrically connected to the low potential power supply line Vss. The one of the source and the drain of the eighth transistor 328 is electrically connected to the first data holding portion 340. The other of the source and the drain of the eighth transistor 328 is electrically connected to one electrode of a second capacitor 350. The other electrode of the second capacitor 350 is electrically connected to the low potential power supply line Vss. A gate of the seventh transistor 326 and a gate of the eighth transistor 328 are electrically connected to a fifth terminal 368.

The fifth terminal 338 is electrically connected to a second word line. Note that operation of one of the first and second word lines may control a signal of the other, or alternatively, the first word line and the second word line may be independently controlled.

The seventh transistor 326 and the eighth transistor 328 are each a transistor having a low off-state current. In the configuration illustrated in FIG. 29B, the seventh transistor 326 and the eighth transistor 328 are n-channel transistors; however, one embodiment of the present invention is not limited thereto.

A third data holding portion 344 is formed between the seventh transistor 326 and the one electrode of the first capacitor 348. A fourth data holding portion 346 is formed between the eighth transistor 328 and the one electrode of the second capacitor 350. Since the seventh transistor 326 and the eighth transistor 328 each have low off-state current, electrical charge in the third data holding portion 344 and the fourth data holding portion 346 can be stored for a long time. That is, the second storage circuit 312 is a non-volatile memory.

The seventh transistor 326 and the eighth transistor 328 are each a transistor having low off-state current.

As described above, the first storage circuit 310 is a volatile memory and the second storage circuit 312 is a non-volatile memory. The first data holding portion 340 and the second data holding portion 342, which are the data holding portions in the first storage circuit 310, are electrically connected to the third data holding portion 344 and the fourth data holding portion 346, which are the data holding portions in the second storage circuit 312, through the transistors each having a low off-state current. Thus, by controlling the gate potentials of the transistors each having a low off-state current, the data in the first storage circuit 310 can be stored also in the data holding portion of the second storage circuit 312. Moreover, the use of the transistors each having a low off-state current enables stored data to be held in the third data holding portion 344 and the fourth data holding portion 346 for a long period even when power is not supplied to the storage element 308.

Figure 29B:
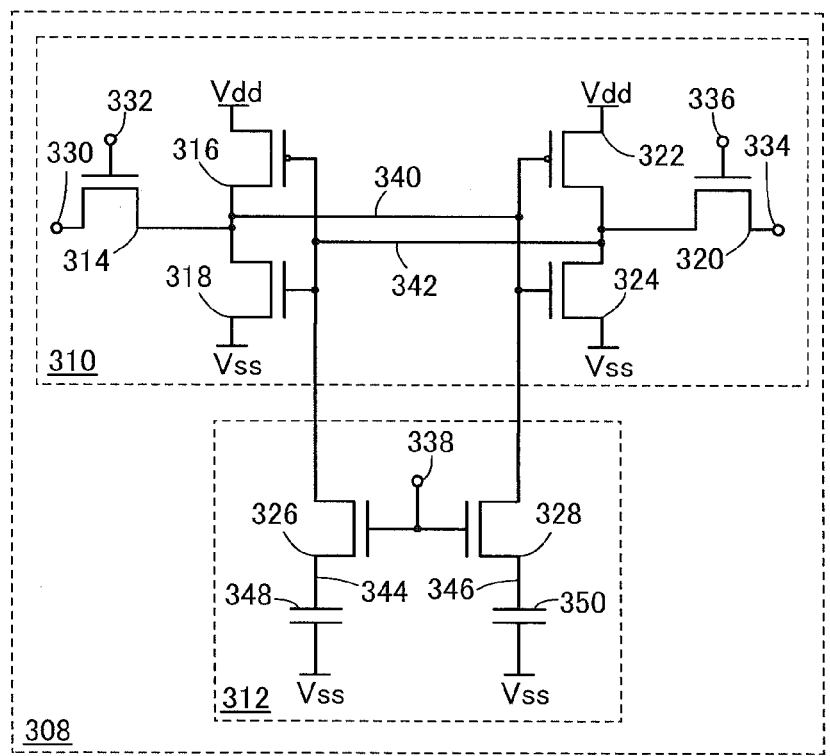

In this manner, in the storage element 308 illustrated in FIG. 29B, data in the volatile memory can be stored in the non-volatile memory.

The first storage circuit 310 is an SRAM, and thus needs to operate at high speed. On the other hand, the second storage circuit 312 is required to hold data for a long period after supply of power is stopped. Such requirements can be satisfied by forming the first storage circuit 310 using transistors capable of high speed operation and forming the second storage circuit 312 using transistors each having a low off-state current. For example, the first storage circuit 310 may be formed using transistors each formed using silicon, and the second storage circuit 312 may be formed using transistors each formed using an oxide semiconductor film.

In the storage device 300 of one embodiment of the present invention, when the first transistor 314 and the fourth transistor 320 are turned on so that data is written to the data holding portions in the first storage circuit 310, which is a volatile memory, in the case where the seventh transistor 326 and the eighth transistor 328, which are included in the second storage circuit 312, are on, it is necessary to accumulate electrical charge in the first capacitor 348 and the second capacitor 350, which are included in the second storage circuit 312, in order that the data holding portions (the first data holding portion 340 and the second data holding portion 342) in the first storage circuit 310 each hold a predetermined potential. Thus, the seventh transistor 326 and the eighth transistor 328 that are on when data is written to the data holding portions in the first storage circuit 310 hinder the storage element 308 from operating at high speed. In the case where the second storage circuit 312 is formed using transistors formed using silicon, it is difficult to sufficiently reduce the off-state current and hold stored data in second storage circuit 312 for a long period.

In the semiconductor device of one embodiment of the present invention, when data is written to the data holding portions in the first storage circuit 310 (the volatile memory), transistors (i.e., the seventh transistor 326 and the eighth transistor 328) positioned between the data holding portions in the first storage circuit 310 and the data holding portions in the second storage circuit 312 are turned off. In this manner, high-speed operation of the storage element 308 can be achieved. Further, when neither writing nor reading to/from the data holding portions in the first storage circuit 310 is performed (that is, the first transistor 314 and the fourth transistor 320 are off), the transistors positioned between the data holding portions in the first storage circuit 310 and the data holding portions in the second storage circuit 312 are turned on.

Specific operation of data writing to the volatile memory in the storage element 308 will be described below. First, the seventh transistor 326 and the eighth transistor 328 that are on are turned off. Next, the first transistor 314 and the fourth transistor 320 are turned on to supply a predetermined potential to the data holding portions (the first data holding portion 340 and the second data holding portion 342) in the first storage circuit 310, and then the first transistor 314 and the fourth transistor 320 are turned off. After that, the seventh transistor 326 and the eighth transistor 328 are turned on. In this manner, data corresponding to data held in the data holding portions in the first storage circuit 310 is held in the data holding portions in the second storage circuit 312.

When the first transistor 314 and the fourth transistor 320 are turned on at least for data writing to the data holding portions in the first storage circuit 310, it is necessary to turn off the seventh transistor 326 and the eighth transistor 328, which are included in the second storage circuit 312. Note that the seventh transistor 326 and the eighth transistor 328, which are included in the second storage circuit 312, may be either on or off when the first transistor 314 and the fourth transistor 320 are turned on for data reading from the data holding portions in the first storage circuit 310.

In the case where supply of power to the storage element 308 is stopped, the transistors positioned between the data holding portions in the first storage circuit 310 and the data holding portions in the second storage circuit 312 (i.e., the seventh transistor 326 and the eighth transistor 328) are turned off just before supply of power to the storage element 308 is stopped, so that the data held in the second storage circuit 312 becomes non-volatile. A means for turning off the seventh transistor 326 and the eighth transistor 328 just before supply of power to the volatile memory is stopped may be mounted on the first driver circuit 304 and the second driver circuit 306, or may alternatively be provided in another control circuit for controlling these driver circuits.

Note that here, whether the seventh transistor 326 and the eighth transistor 328, which are positioned between the data holding portions in the first storage circuit 310 and the data holding portions in the second storage circuit 312, are turned on or off may be determined in each storage element or may be determined in each block in the case where the storage element portion 302 is divided into blocks.

When the first storage circuit 310 operates as an SRAM, the transistors which are positioned between the data holding portions in the first storage circuit 310 and the data holding portions in the second storage circuit 312 are turned off; accordingly, data can be stored in the first storage circuit 310 without accumulation of electrical charge in the first capacitor 348 and the second capacitor 350, which are included in the second storage circuit 312. Thus, the storage element 308 can operate at high speed.

In the storage device 300 of one embodiment of the present invention, before supply of power to the storage device 300 is stopped (a power source of the storage device 300 is turned off), only the transistors which are positioned between the data holding portions in the first storage circuit 310 and the data holding portions in the second storage circuit 312 in the storage element 308 to which data has been rewritten lastly may be turned on. In that case, an address of the storage element 308 to which data has been rewritten lastly is preferably stored in an external memory, in which case the data can be stored smoothly.

Note that the driving method of the semiconductor device of one embodiment of the present invention is not limited to the above description.

As described above, the storage device 300 can operate at high speed. Since data storing is performed only by part of the storage elements, power consumption can be reduced.

In this embodiment, an SRAM is used for the volatile memory; however, one embodiment of the present invention is not limited thereto, and other volatile memories may be used.

<CPU>

Figure 30A:
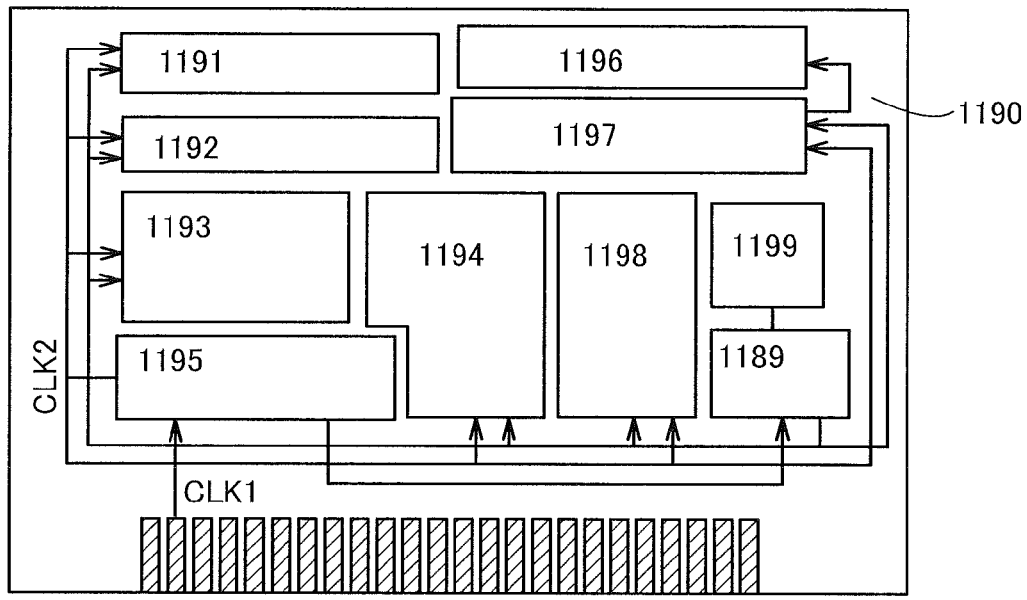
FIGS. 30A to 30C are block diagrams illustrating examples of CPUs of one embodiment of the present invention.
Figure 30B:
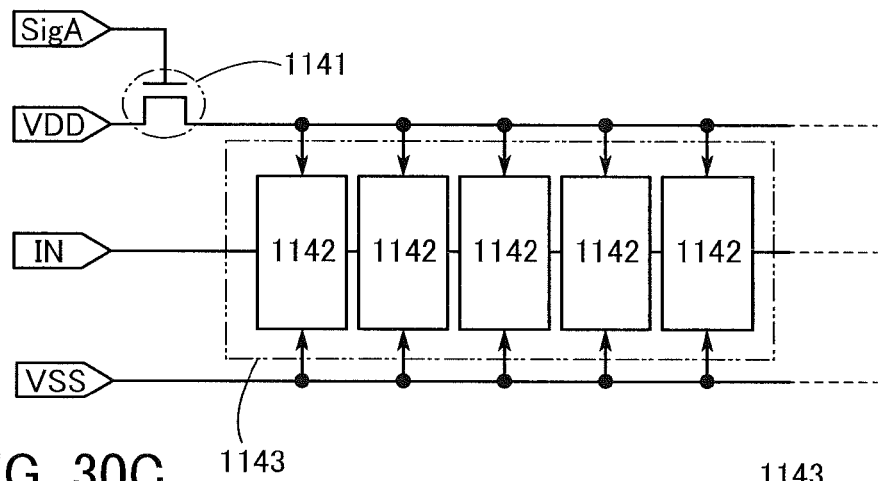
Figure 30C:
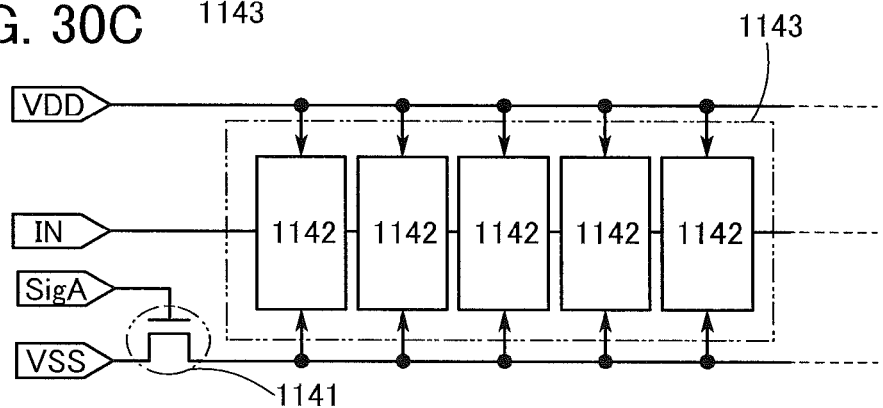

FIGS. 30A to 30C are block diagrams illustrating a specific structure of a CPU at least partly including the above transistor.

The CPU illustrated in FIG. 30A includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189. A semiconductor substrate, an SOI substrate, a glass substrate, or the like is used as the substrate 1190. The ROM 1199 and the ROM interface 1189 may be provided in a separate chip. It is needless to say that the CPU in FIG. 30A is only an example in which the configuration is simplified, and actual CPUs have various configurations depending on applications.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in response to the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 30A, a memory cell is provided in the register 1196. As the memory cell of the register 1196, the above transistor can be used.

In the CPU in FIG. 30A, the register controller 1197 selects operation of holding data in the register 1196, in response to an instruction from the ALU 1191. That is, the register controller 1197 determines whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of a power supply voltage to the memory cell in the register 1196 can be stopped.

The power supply can be stopped by providing a switching element between a memory cell group and a node to which a power supply potential VDD or a power supply potential VSS is supplied, as illustrated in FIG. 30B or FIG. 30C. Circuits illustrated in FIGS. 30B and 30C will be described below.

FIGS. 30B and 30C each illustrate a storage device in which any of the above transistors is used as a switching element that controls supply of a power supply potential to a memory cell.

The storage device illustrated in FIG. 30B includes a switching element 1141 and a memory cell group 1143 including a plurality of memory cells 1142. Specifically, for each of the memory cells 1142, the above transistor can be used. Each of the memory cells 1142 included in the memory cell group 1143 is supplied with the high-level power supply potential VDD via the switching element 1141. Further, each of the memory cells 1142 included in the memory cell group 1143 is supplied with the potential of a signal IN and the low-level power supply potential VSS.

In FIG. 30B, the above transistor is used as the switching element 1141, and the switching of the transistor is controlled by a signal SigA supplied to a gate electrode layer thereof.

Note that FIG. 30B illustrates the configuration in which the switching element 1141 includes only one transistor; however, one embodiment of the present invention is not particularly limited thereto. The switching element 1141 may include a plurality of transistors.

In the case where the switching element 1141 includes a plurality of transistors serving as switching elements, the plurality of transistors may be connected parallel to each other, connected in series, or in combination of parallel connection and series connection Although the switching element 1141 controls the supply of the high-level power supply potential VDD to each of the memory cells 1142 included in the memory cell group 1143 in FIG. 30B, the switching element 1141 may control the supply of the low-level power supply potential VSS.

In FIG. 30C, an example of a storage device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

This embodiment shows an example of a basic principle. Thus, part or the whole of this embodiment can be freely combined with, applied to, or replaced with part or the whole of another embodiment.

Embodiment 2

In this embodiment, a structural example of a display panel of one embodiment of the present invention will be described.

STRUCTURE EXAMPLE

Figure 36A:
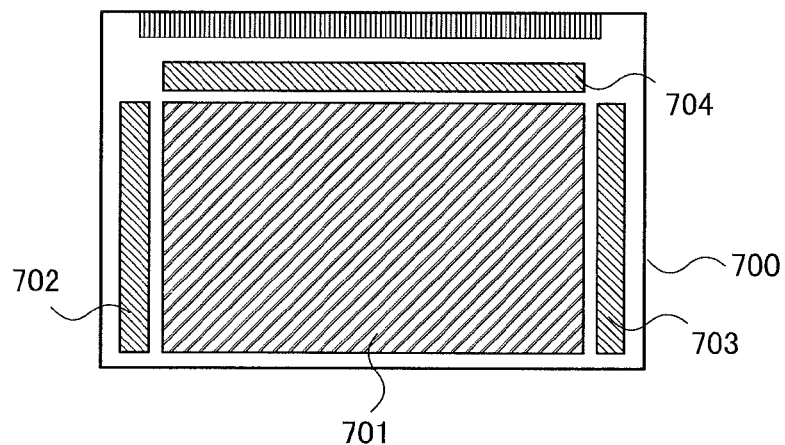
FIGS. 36A to 36C are circuit diagrams of a display device of one embodiment.
Figure 36B:
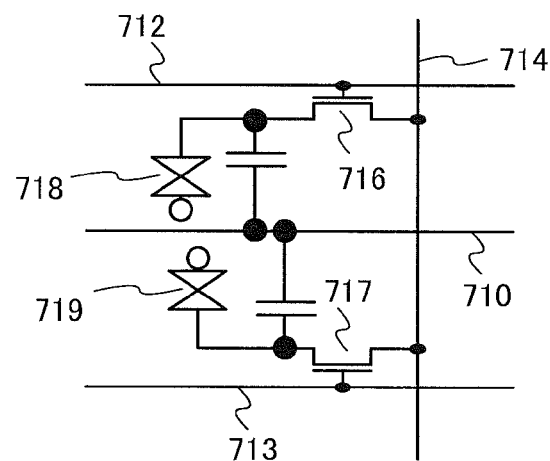
Figure 36C:
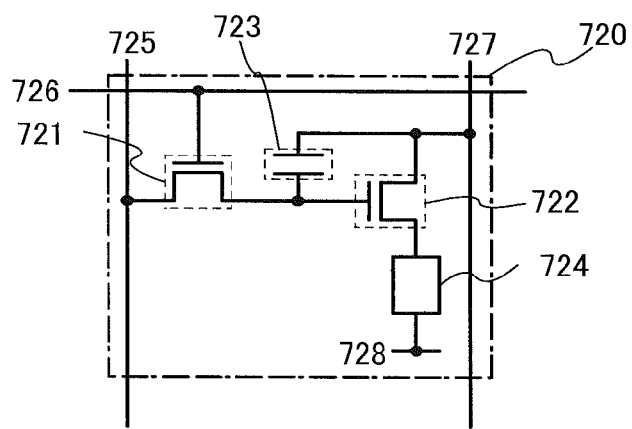

FIG. 36A is a top view of the display panel of one embodiment of the present invention. FIG. 36B is a circuit diagram illustrating a pixel circuit that can be used in the case where a liquid crystal element is used in a pixel in the display panel of one embodiment of the present invention. FIG. 36C is a circuit diagram illustrating a pixel circuit that can be used in the case where an organic EL element is used in a pixel in the display panel of one embodiment of the present invention.

The transistor in the pixel portion can be formed in accordance with the above embodiment. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 36A illustrates an example of a block diagram of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels which include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 36A, the first scan line driver circuit 702, the second scan line driver circuit 703, and the signal line driver circuit 704 are formed over the substrate 700 where the pixel portion 701 is formed. Accordingly, the number of components which are provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved.

[Liquid crystal panel]

FIG. 36B illustrates an example of a circuit configuration of the pixel. Here, a pixel circuit that can be used in a pixel of a VA liquid crystal display panel is illustrated.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a source or drain electrode layer 714 that functions as a data line is shared by the transistors 716 and 717. The transistor described in any of the above embodiments can be used as appropriate as each of the transistors 716 and 717. Thus, a highly reliable liquid crystal display panel can be provided.

The shapes of a first pixel electrode layer electrically connected to the transistor 716 and a second pixel electrode layer electrically connected to the transistor 717 are described. The first pixel electrode layer and the second pixel electrode layer are separated by a slit. The first pixel electrode layer is spread in a V shape and the second pixel electrode layer is provided so as to surround the first pixel electrode layer.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Further, a storage capacitor may be formed using a capacitor wiring 710, a gate insulating film functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 36B. For example, a switch, a resistor, a capacitor, a transistor, a sensor, a logic circuit, or the like may be added to the pixel illustrated in FIG. 36B.
[Organic EL Panel]

FIG. 36C illustrates another example of a circuit configuration of the pixel. Here, a pixel structure of a display panel including an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited.

The light-emitting organic compound returns to a ground state from the excited state, thereby emitting light. Owing to such a mechanism, this light-emitting element is referred to as a current-excitation light-emitting element.

FIG. 36C illustrates an applicable example of a pixel circuit. Here, one pixel includes two n-channel transistors. Note that a metal oxide film of one embodiment of the present invention can be used for channel formation regions of the n-channel transistors. Further, digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, the transistor described in any of the above embodiments can be used as appropriate. In this manner, a highly reliable organic EL display panel can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage which is the sum of power supply line voltage and the threshold voltage Vth of the driver transistor 722 is applied to the signal line 725.

In the case of performing analog grayscale driving, a voltage greater than or equal to a voltage which is the sum of the forward voltage of the light-emitting element 724 and the threshold voltage Vth of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 36C. For example, a switch, a resistor, a capacitor, a sensor, a transistor, a logic circuit, or the like may be added to the pixel circuit illustrated in FIG. 36C.

In the case where the transistor shown in any of the above embodiments is used for the circuit shown in FIGS. 36A to 36C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

At least part of this embodiment can be combined with any of the other embodiments in this specification as appropriate.

Embodiment 3

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 37A to 37F illustrate specific examples of these electronic devices.

Figure 37A:
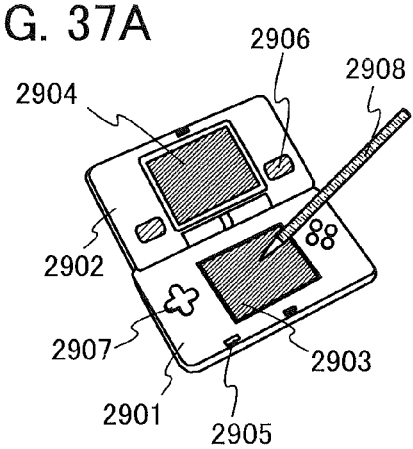
FIGS. 37A to 37F illustrate electronic devices of one embodiment.

FIG. 37A illustrates a portable game console including a housing 2901, a housing 2902, a display portion 2903, a display portion 2904, a microphone 2905, a speaker 2906, an operation key 2907, a stylus 2908, and the like. Although the portable game machine in FIG. 37A has the two display portions 2903 and 2904, the number of display portions included in a portable game machine is not limited to this.

Figure 37B:
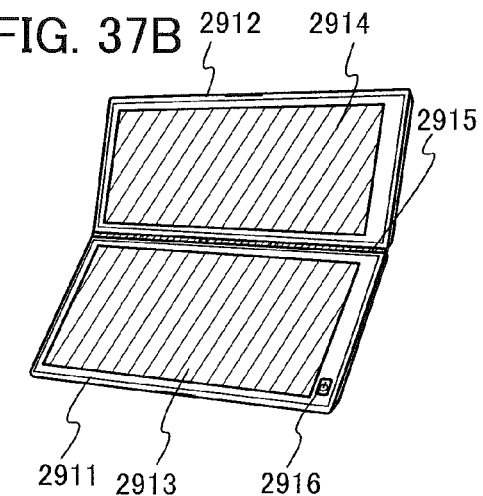

FIG. 37B illustrates a portable data terminal including a first housing 2911, a second housing 2912, a first display portion 2913, a second display portion 2914, a joint 2915, an operation key 2916, and the like. The first display portion 2913 is provided in the first housing 2911, and the second display portion 2914 is provided in the second housing 2912. The first housing 2911 and the second housing 2912 are connected to each other with the joint 2915, and the angle between the first housing 2911 and the second housing 2912 can be changed with the joint 2915. An image on the first display portion 2913 may be switched depending on the angle between the first housing 2911 and the second housing 2912 at the joint 2915. A display device with a position input function may be used as at least one of the first display portion 2913 and the second display portion 2914. Note that the position input function can be added by providing a touch panel in a display device. Alternatively, the position input function can be added by provision of a photoelectric conversion element called a photosensor in a pixel portion of a display device.

Figure 37C:
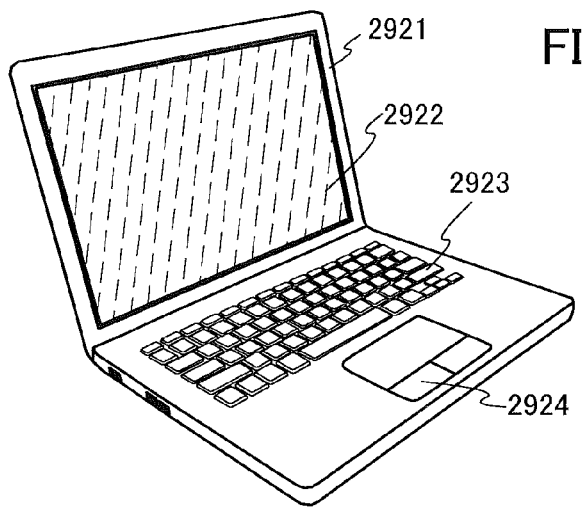

FIG. 37C illustrates a laptop personal computer, which includes a housing 2921, a display portion 2922, a keyboard 2923, a pointing device 2924, and the like.

Figure 37D:
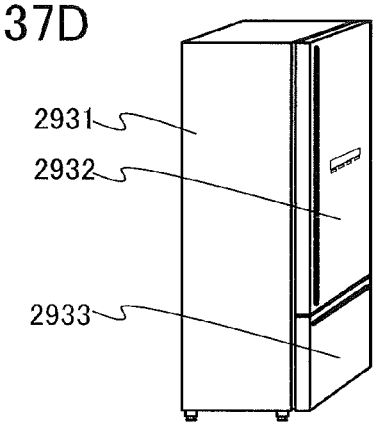

FIG. 37D illustrates an electric refrigerator-freezer including a housing 2931, a door for a refrigerator 2932, a door for a freezer 2933, and the like.

Figure 37E:
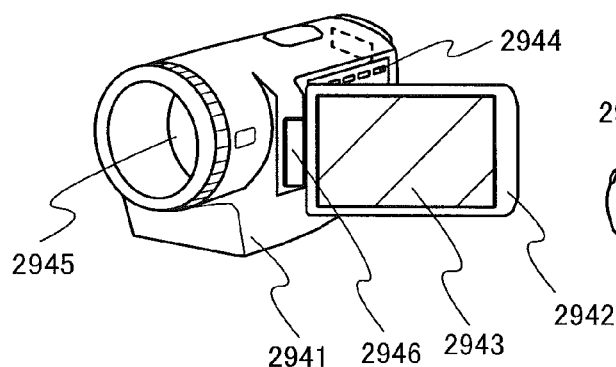

FIG. 37E illustrates a video camera, which includes a first housing 2941, a second housing 2942, a display portion 2943, operation keys 2944, a lens 2945, a joint 2946, and the like. The operation keys 2944 and the lens 2945 are provided for the first housing 2941, and the display portion 2943 is provided for the second housing 2942. The first housing 2941 and the second housing 2942 are connected to each other with the joint 2946, and the angle between the first housing 2941 and the second housing 2942 can be changed with the joint 2946. Images displayed on the display portion 2943 may be switched in accordance with the angle at the joint 2946 between the first housing 2941 and the second housing 2942.

Figure 37F:
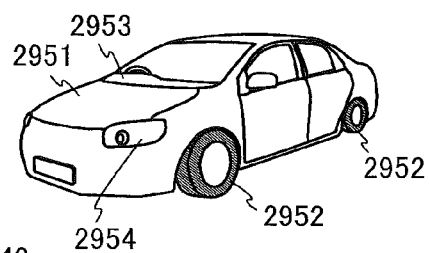
Figure 38A:
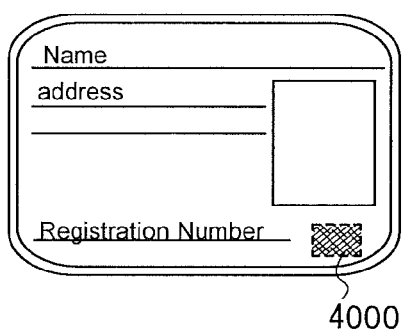
FIGS. 38A to 38F illustrate application examples of an RFID of one embodiment.
Figure 38B:
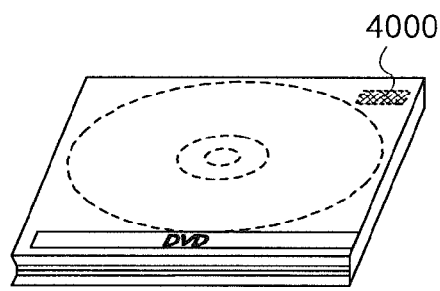
Figure 38C:
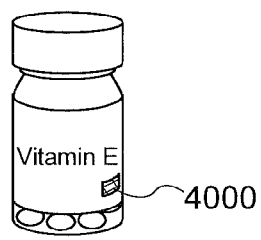
Figure 38D:
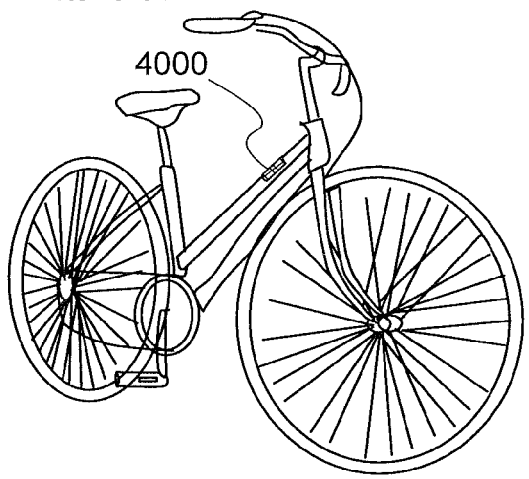
Figure 38E:
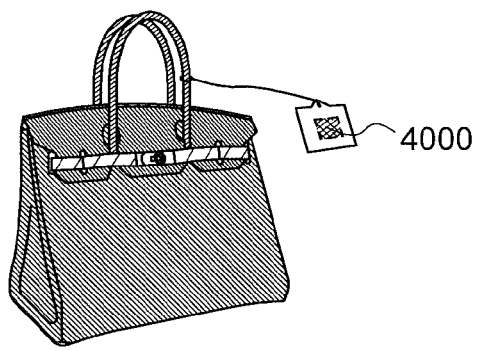
Figure 38F:
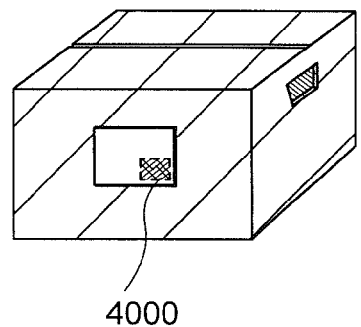

FIG. 37F illustrates an ordinary vehicle including a car body 2951, wheels 2952, a dashboard 2953, lights 2954, and the like.

At least part of this embodiment can be combined with any of the other embodiments in this specification as appropriate.

Embodiment 4

In this embodiment, application examples of an RFID of one embodiment of the present invention will be described with reference to FIGS. 38A to 38F. The RFID is widely used and can be provided for, for example, products such as bills, coins, securities, bearer bonds, documents (e.g., driver's licenses or resident's cards, see FIG. 38A), recording media (e.g., DVD software or video tapes, see FIG. 38B), packaging containers (e.g., wrapping paper or bottles, see FIG. 38C), vehicles (e.g., bicycles, see FIG. 38D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 38E and 38F).

An RFID 4000 of one embodiment of the present invention is fixed to a product by being attached to a surface thereof or embedded therein. For example, the RFID 4000 is fixed to each product by embedded in paper of a book, or embedded in an organic resin of a package. Since the RFID 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RFID 4000 of one embodiment of the present invention, and the identification function can be utilized to prevent counterfeiting. Moreover, the efficiency of a system such as an inspection system can be improved by providing the RFID of one embodiment of the present invention for packaging containers, recording media, personal belongings, foods, clothing, household goods, electronic devices, or the like. Vehicles can also have higher security against theft or the like by being provided with the RFID of one embodiment of the present invention.

As described above, by using the RFID of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RFID can be preferably used for application in which data is not frequently written or read.

At least part of this embodiment can be implemented as appropriate in combination with any of the other embodiments described in this specification.

This application is based on Japanese Patent Application serial no. 2013-180228 filed with Japan Patent Office on Aug. 30, 2013, the entire contents of which are hereby incorporated by reference.

What is claimed is:

1. A method of manufacturing a semiconductor device, comprising the steps of:
    forming a first semiconductor layer over an insulating surface, the first semiconductor layer including a first opening;
    forming a first conductive layer over the first semiconductor layer and in the first opening;
    removing a part of the first conductive layer being over the first semiconductor layer to form a second conductive layer in the first opening;
    forming an island-shaped mask over the second conductive layer and the first semiconductor layer;
    etching the second conductive layer and the first semiconductor layer using the island-shaped mask to form a first electrode and a second semiconductor layer;
    forming a gate insulating layer to cover a top surface of the second semiconductor layer and a first side surface of the second semiconductor layer; and
    forming a gate electrode to be in direct contact with a top surface of the gate insulating layer,
    wherein the gate electrode faces the top surface and the first side surface of the second semiconductor layer,
    wherein a bottom surface of the second semiconductor layer is higher than a bottom surface of the first electrode.

2. The method of manufacturing a semiconductor device, according to claim 1,
    wherein the first semiconductor layer includes a second opening,
    wherein the first conductive layer is formed in the second opening in the step of forming the first conductive layer,
    wherein a third conductive layer is formed in the second opening in the step of removing the part of the first conductive layer being over the first semiconductor layer,
    wherein the island-shaped mask is formed over the third conductive layer in the step of forming the island-shaped mask,
    wherein the third conductive layer is etched to form a second electrode in the step of etching the second conductive layer and the first semiconductor layer using the island-shaped mask, and
    wherein the second semiconductor layer is formed between the first electrode and the second electrode.

3. The method of manufacturing a semiconductor device according to claim 1, wherein the first semiconductor layer is an oxide semiconductor layer.

4. The method of manufacturing a semiconductor device according to claim 1,
    wherein at least one side of a second side surface of the second semiconductor layer is in direct contact with at least one side of a side surface of the first electrode, and
    wherein whole of the top surface of the second semiconductor layer is in direct contact with a part of the gate insulating layer.

5. The method of manufacturing a semiconductor device according to claim 1, wherein a length of the second semiconductor layer in a direction perpendicular to a channel length direction of the second semiconductor layer is substantially the same as a length of the first electrode in the direction.

* * * * *